US009831899B1

(12) United States Patent
Boghrat et al.

(10) Patent No.: US 9,831,899 B1
(45) Date of Patent: Nov. 28, 2017

(54) INTEGRATIVE SOFTWARE RADIO

(71) Applicant: Physical Optics Corporation, Torrance, CA (US)

(72) Inventors: Pedram Boghrat, Torrance, CA (US); Thomas C. Forrester, Torrance, CA (US); Tomasz Jannson, Torrance, CA (US); Andrew Kostrzewski, Garden Grove, CA (US); Robert Anthony Kunc, Rancho Palos Verdes, CA (US); Anthony Shangchi Lai, La Crescenta, CA (US); Kang S. Lee, Tustin, CA (US); John Matthews, Torrance, CA (US); Ranjit Dinkar Pradhan, Rancho Palos Verdes, CA (US); Robert Everett Stephens, Torrance, CA (US)

(73) Assignee: Physical Optics Corporation, Torrance, CA (US)

( * ) Notice: Subject to any disclaimer, the term of this patent is extended or adjusted under 35 U.S.C. 154(b) by 0 days.

(21) Appl. No.: 14/974,524

(22) Filed: Dec. 18, 2015

Related U.S. Application Data

(63) Continuation-in-part of application No. 14/875,482, filed on Oct. 5, 2015.
(Continued)

(51) Int. Cl.
*H04K 1/02* (2006.01)
*H04B 1/04* (2006.01)

(52) U.S. Cl.
CPC ..... *H04B 1/0475* (2013.01); *H04B 2001/045* (2013.01); *H04B 2001/0425* (2013.01)

(58) Field of Classification Search
CPC ..................................... H04B 1/0475
(Continued)

(56) References Cited

U.S. PATENT DOCUMENTS

| 2007/0069813 | A1* | 3/2007 | Li | ......................... | H03F 1/3247 |
| | | | | | 330/149 |
| 2010/0008446 | A1* | 1/2010 | Netsell | .................. | H04L 27/368 |
| | | | | | 375/296 |

(Continued)

*Primary Examiner* — Lihong Yu
(74) *Attorney, Agent, or Firm* — Sheppard, Mullin, Richter & Hampton LLP; Daniel Yannuzzi

(57) ABSTRACT

An integrative software radio embodies a single multi-radio device including functionalities that are a superset of a plurality of individual discrete radio devices includes a radio frequency transmitter that integrates transmission capabilities of a plurality of discrete transmitters such that the radio frequency transmitter is configured to generate a first amalgamated waveform that is a combination of individual waveforms, each individual waveform corresponding to the transmission capabilities of its respective one of the plurality of discrete transmitters, wherein the transmission capabilities each of the plurality of discrete transmitters comprise operating characteristics different from one or more of the other discrete transmitters, wherein a waveform of a discrete transmitter comprises an adjustable electromagnetic wavefront and a proprietary waveform generation component; and a mission module communicatively coupled to the plurality of discrete transmitters and configured to alter the wavefront of at least one of the plurality of discrete transmitters to reduce interference among the at least one of the plurality of discrete transmitters without adjusting the proprietary waveform generation component.

25 Claims, 66 Drawing Sheets

Related U.S. Application Data

(60) Provisional application No. 62/102,994, filed on Jan. 13, 2015, provisional application No. 62/219,304, filed on Sep. 16, 2015.

(58) Field of Classification Search
USPC .......................................................... 375/297
See application file for complete search history.

(56) References Cited

U.S. PATENT DOCUMENTS

| | | | | |
|---|---|---|---|---|
| 2010/0303033 | A1* | 12/2010 | Shahar | H04W 72/1257 370/329 |
| 2011/0098033 | A1* | 4/2011 | Britz | H01Q 3/44 455/422.1 |
| 2012/0026937 | A1* | 2/2012 | Chang | H01Q 9/0407 370/316 |
| 2013/0083960 | A1* | 4/2013 | Kostrzewski | H05K 7/1427 382/103 |

\* cited by examiner

PART III

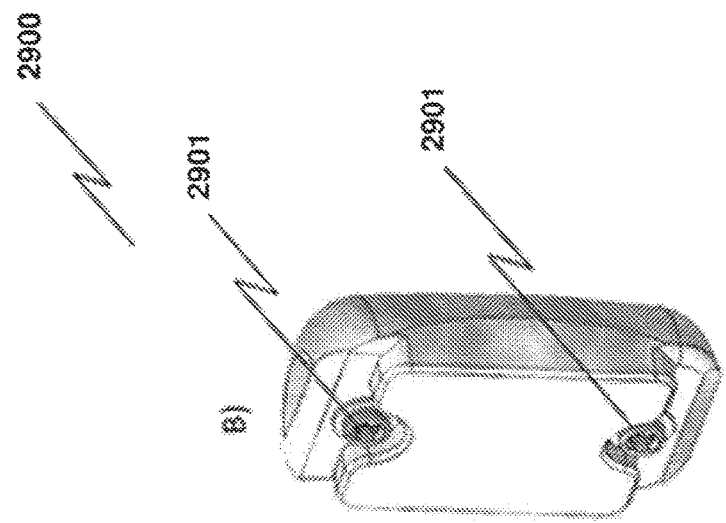
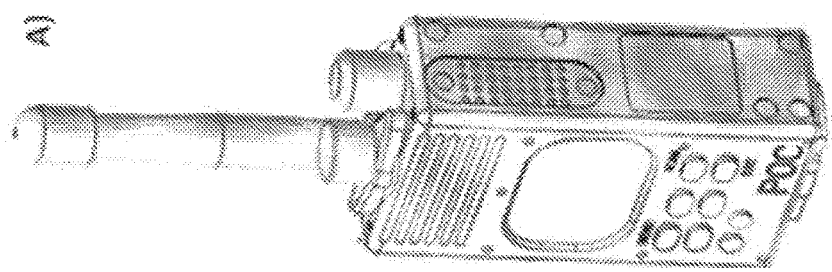
Fig. 38

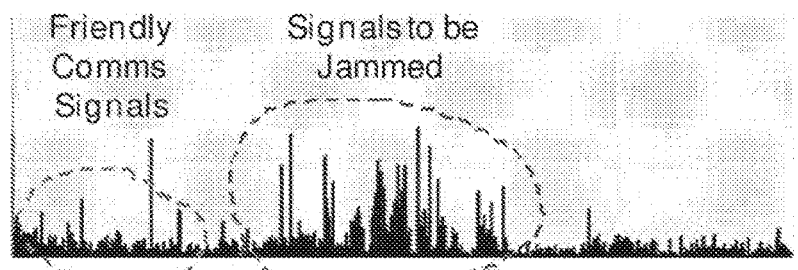
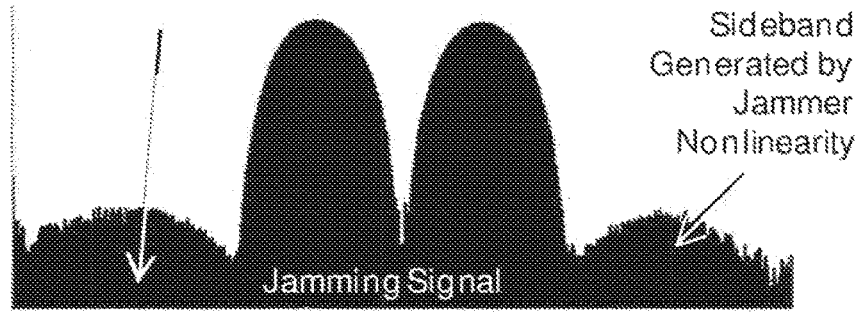
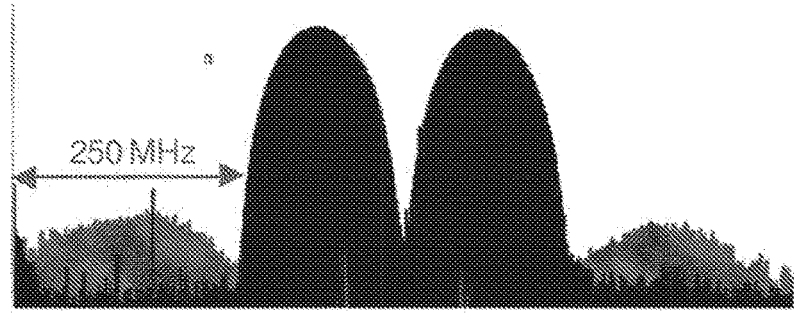
Fig. 66

INTEGRATIVE SOFTWARE RADIO

CROSS-REFERENCE TO RELATED APPLICATIONS

This application claims the benefit of U.S. Provisional Application Nos. 62/102,994 filed Jan. 13, 2015 and 62/219,304, filed Sep. 16, 2015, and is a continuation-in-part of U.S. patent application Ser. No. 14/875,482, filed Oct. 5, 2015, which are hereby incorporated herein by reference in their entirety.

STATEMENT OF RIGHTS TO INVENTIONS MADE UNDER FEDERALLY SPONSORED RESEARCH

Materials described herein and covered by one or more of the claims in the present application were made with support by the Technical Support Working Group (TSWG). The Government may have certain rights therein.

TECHNICAL FIELD

This disclosure relates to methods for improving the efficiency, bandwidth, and dynamic range of radio frequency systems in general, and specifically, some embodiments relate to methods for achieving some or all of these improvements through digital compensation for nonlinear response of analog radio frequency (RF) components.

DESCRIPTION OF THE RELATED ART

In many commercial and military applications, it is often desirable to provide personnel with the ability to communicate using a plurality of different communication platforms. There may be numerous circumstances in which a communications operator may wish to wirelessly communicate with other personnel or instrumentalities that have varied and diverse communication capabilities. For example, a field operator may have the need to communicate with personnel at a given remote location using a satellite phone and may at the same time be required to communicate with other personnel at a second location using a cellular communication link. Depending on the communication standards used for the various communication links, users may require separate radios to handle these various communications, and may further experience interference among these radios where simultaneous communications are taking place.

However, requiring personnel to use separate communications gear or radios is not only cumbersome, but it can also lead to incompatible connections, wave fronts, antennas and power sources. Furthermore, the prior art use of multiple radio systems can be costly due to the requirement to procure all of the necessary devices and accessories for each operator. For field deployed communications, the use of multiple radios can require the operator to wear or otherwise carry these multiple units in the field. As a result, the ergonomics (or human factors) of requiring the use of multiple radios for a communication scenario can be undesirable. In addition, current state of the art devices that will allow combining two methods of communication components have not been designed for use by personnel working in harsh Global weather environments.

BRIEF SUMMARY OF EMBODIMENTS

Embodiments of the systems and methods disclosed herein relate to the combination of functionalities of multiple single radio devices into a single multi-radio device with combined functionalities of the individual single radio devices. More particularly, embodiments of an integrative Software Radio (ISR) can be configured to provide a multi-radio system that accommodates Multiple Line of Sight (MLOS) and Beyond Line of Sight (BLOS) simultaneous connections within a variety of fielded communication systems used by command and control (C2), support platforms, other forces, coalition partners and team members, including up to five separate legacy radio based communications devices for each operator.

In contrast to conventional, separate radios, integrative software radios according to various embodiments may be adapted to a number of different applications and environments. For example, in some embodiments they may be adapted to be used by deployed dis-mounted field operators to perform their tactical tasks at any location on Earth or in space. The ISR systems may be configured to provide deployed field operators with a single deployable communications unit by providing a multi-radio system that combines the functionality of conventional communication systems in use by the operators such as: multiband, multimission handheld radios; digital portable radios; satellite telephones (including secure satellite phones that supports IP data transfer from user applications and voice), cellular telephones, and others. In addition, the ISR system may be configured to provide both encrypted and unencrypted communication in a non-collide fashion, within the adequate power budget, including augmenting or replacing entirely the primary or secondary radio battery (e.g., the MBITR (Multiband Inter/Intra Team Radio) battery) with a Programmable DC Power Manager (PDPM) subsystem. Augmentation or replacement of the primary radio battery may include (or even necessitate) a more distributed solution such as the conventional WEARNET™ system, supported by U.S. Pat. Nos. 7,462,035; 7,335,067; 8,308,489; 7,556,532; 7,658,612; 7,753,685; and 7,731,517.

Embodiments of a distributed ISR solution can be configured to offer some additional benefits including integration of: the conventionally available Android™ human interface and wearable GPS receiver (such as the Rockwell-Collins SSASM Puck, for example) which communicates with the ISR via the PDPM integrated USB 2.0 hub, as an exemplary scenario.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting the breadth, scope, or applicability thereof. It should be noted that for clarity and ease of illustration these drawings are not necessarily made to scale.

FIGS. 37, 38 and 39 illustrate an example of unmated UNEBSC female and male halves integrated with hosts.

FIG. 66 illustrates the mitigation of cosite interference between a measured signal (wideband AM-DSB) emulating a jammer, and measured ambient signals representing friendly and non-friendly communications signals.

Figure 1:
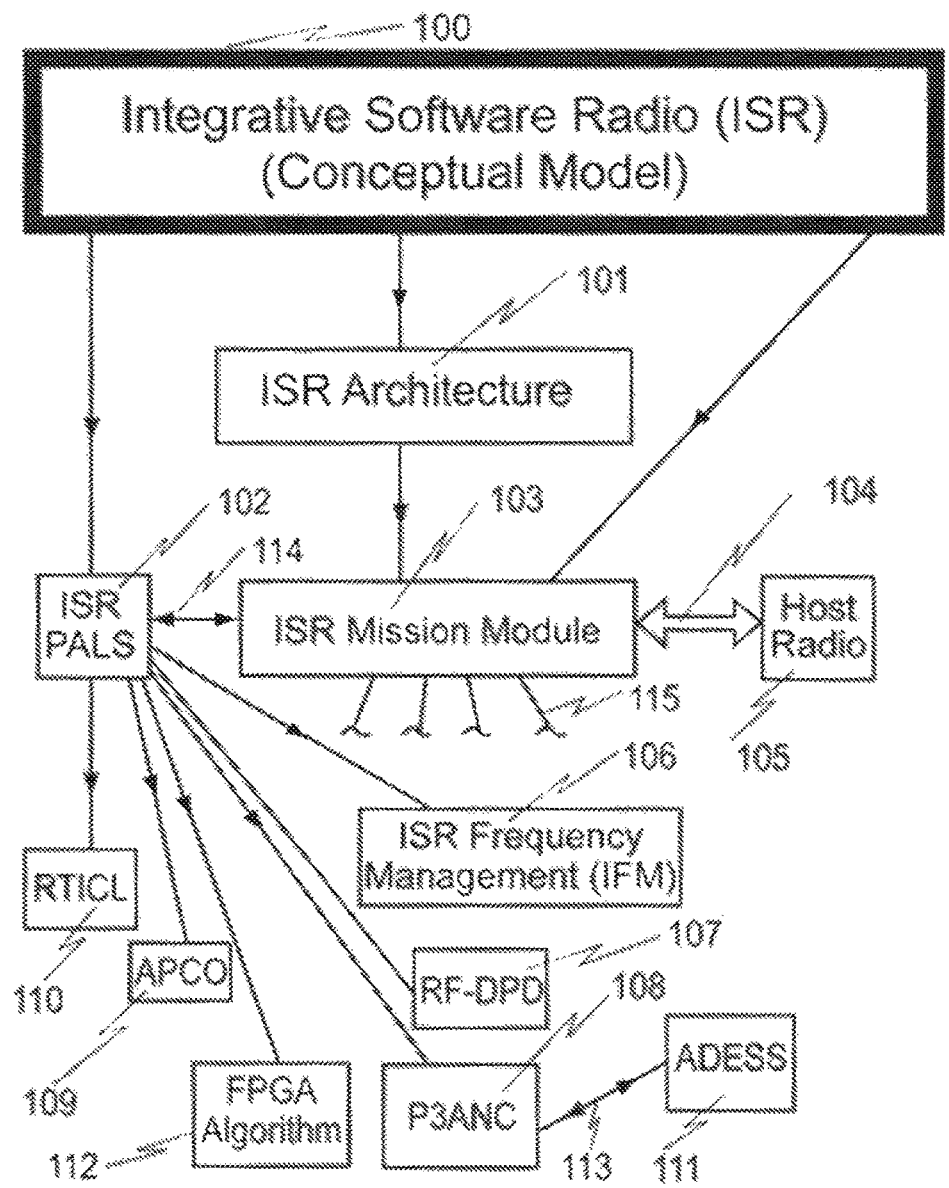
FIG. 1 is a diagram illustrating an exemplary conceptual model for some embodiments of an Integrative Software Radio (ISR).

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the systems and methods disclosed herein relate to an Integrative Software Radio to allow RF communications to combine multiple radio devices into a single multi-radio device with combined functionalities of the individual single radio devices. Embodiments can further include features such as a Frequency Management System (FMS) that can be implemented to mitigate or eliminate nonlinear distortion (including intermodulation products (IMPS), harmonics, and sidebands) of non-linear devices in the communication system, as well as novel connector configurations to allow mechanical and electrical mating of various radio components.

Systems and methods disclosed herein may be configured to provide a combination of functionalities of multiple single radio devices into a single multi-radio device with combined functionalities of the individual single radio devices. More particularly, embodiments of an integrative Software Radio (ISR) can be configured to provide a multi-radio system that accommodates Multiple Line of Sight (MLOS) and Beyond Line of Sight (BLOS) simultaneous connections within a variety of fielded communication systems used by command and control (C2), support platforms, other forces, coalition partners and team members, including up to five separate legacy radio based communications devices for each operator.

The PDPM (Programmable DC Power Manager) can be configured to reduce or optimize the SWaP (Size-Weight-and-Power) constraint, directly supporting a 28 V 180 watt-hour battery, for example, and can further be configured to include an external charging port for recharging the battery with vehicular or other power sources, which provides a major ergonomic advantage. Also, the PDPM in some embodiments includes at least four (4) independent, programmable DC supplies, each of which is capable of generating 5 to 12 volts DC, and may also be individually programmable in 100 mV increments under USB control from an Android App., for example. As an exemplary scenario, each output is capable of supplying several Amperes for a combined total output power of 100 W.

Embodiments of the ISM may also be configured to improve or optimize the ergonomics associated with minimizing the multi-radio redundancy while preserving risk mitigation by keeping sufficient redundancy in: wavefront/antenna, hardware/software/firmware and electro-mechanical packaging/ruggedness area.

In summary, the ISR can be configured as a single, hand-held or larger (such as, for example, vehicle mountable), deployable wireless communications device that can combine multiple diversified communication capabilities such as, for example, secure radio compatibility (including NSA Type-1 encryption and digital portable radio compatibility (via the APCO-25 waveform)), satellite-telephone capability, cellular telephone functionalities, and global position system (GPS) reception while retaining compatibility with existing communication devices, as shown in Table 1.

TABLE 1

Exemplary Core Wireless Communications Capabilities.
ISR Capabilities by Module.

| Multiband, Multimission Handheld Radio | |
|---|---|
| Host ModuleFunctionality | Mission Module Functionality |
| Soldier Radio Waveform (SRW) MIL-STD-188-241-1/-2 (SINGARS-Standard/FH2 EOM) MIL-STD-188-181C-182B, -183B (SATCOM IW) HAVEQUICK I and II; ANDVT (LPC-10, MELP); AM/FM Project 25 (P25); Over-the-Air-Cloning (OTAC) Situational Awareness, Retransmission, AM Swept Tone Beacon | Cellular Phone 3G-CDMA, 3G-HSPA, 4G-LTE Satphone TDMA/FDMA |

According to Table 1, the ISR system combines conventional communication transceivers in a non-obvious fashion beyond the superposition principle.

Before describing embodiments of an integrative software radio in more detail, it is useful to examine a conceptual model for the ISR. FIG. 1 is a diagram illustrating an exemplary conceptual model for some embodiments of an Integrative Software Radio (ISR). FIG. 1 is not an architectural block diagram, but rather a conceptual representation of modules that can be included in embodiments of the systems and methods described herein. The conceptual model in FIG. 1 combines concepts from the ISR described in the first parts of this document, as well as concepts from ISR Frequency Management System (ISRFMS) described with reference to FIGS. 44-66.

The example conceptual model in FIG. 1 includes the following basic ISR modules: ISR architecture 101, ISR PALS 102, ISR Mission Module 103 and superconnector 104. The host radio 105 can be implemented using a conventional radio, a novel radio, or a hybrid of the two. An example of a conventional host radio is the Motorola XTS-5000, although other conventional radios can be used. In some embodiments, architecture 101 is that configured to operate with the host radio or host radios (whether conventional or otherwise) in a variety of modes such as, for example: non-cooperative (ncf), semi-cooperative (scf) and cooperative (cf) fashions. This can be accomplished by applying PALS 102 or ISR Frequency Management (IFM) 106, for example.

Various embodiments of a Predictive Adaptive Linearization Sub-System 102 are described above. As discussed, the PALS can be included to mitigate or eliminate non-linear distortion introduced into the system. This can include, for example: RF Digital Pre- or Post—Distortion Paradigm (RF-DPP) 107; Parallel Pipelined Polynomial Algorithm for Nonlinear Compensation (P3ANC) 108; Automated Polynomial Coefficient Optimizer (APCO) 109; Remote Transmitter Impairments Compensated Locally (RTICL) 110; and Algorithms for Adaptive Exfiltration of Spectral Signals (ADESS) 111. Each of these components can be implemented in hardware, software, or a combination of the foregoing, but are preferably implemented using software running on a special or general-purpose processor.

FPGA algorithm 112 components can include hardware and software (including firmware) executed on a FPGA. The connection between P3ANC & ADESS can be provided by connectorization 113. The connectorization 114 emphasizes that the PALS 102 can be separate from or embedded within Mission Module 103. The ISR Mission Module 103 has a number of novel (unique) components such as component connections 115 to one or more of the following: μP/μC, a power manager, and others.

The preferable implementation of the PALS 102 can be adapted to the ISR by, for example, adding an additional electronic card or other circuitry to the Mission Module μP/μC Control Module.

Figure 5:
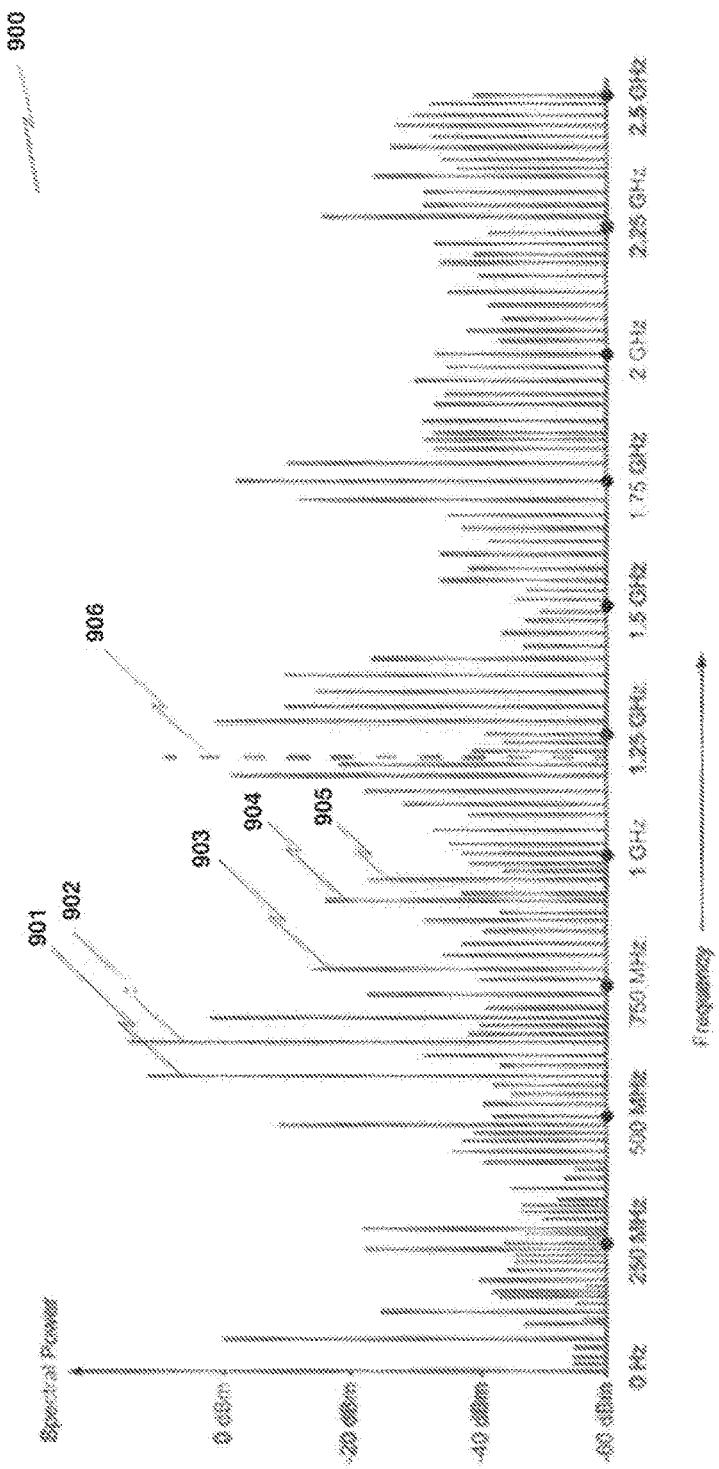
FIG. 5 illustrates an example of harmonics and intermodulation products generated when two signals at 570 MHz and 630 MHz are simultaneously input to a common power amplifier.
Figure 7:
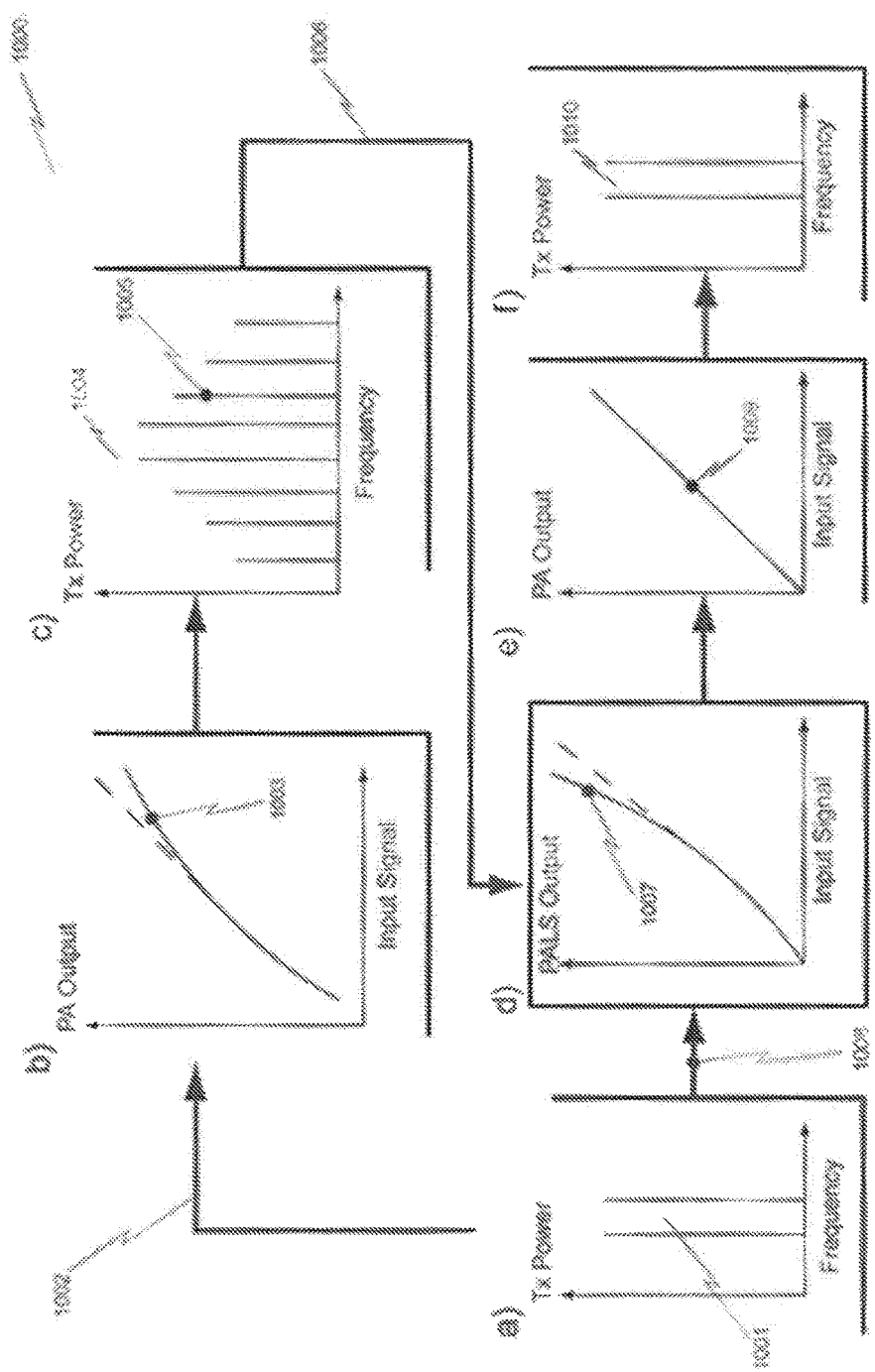
FIG. 7 is a diagram illustrating an example of a Predistortion-based Adaptive Linearization System (PALS), in accordance with one embodiment of the technology described herein.

ISR Frequency Management (IFM) 106 may be implemented as an algorithm to tune standard frequencies to a priori, minimize harmonics and intermodulation terms such as shown in FIG. 5. The general concept of PALS is shown in FIG. 7.

In some embodiments, a single multi-radio device is assembled from super-components to combine functionalities of the multiple single radios. As an example, a transmitter super-component in the single multi-radio may be capable of transmitting a superset of all radio frequencies that are transmitted by the corresponding transmitter components in the multiple single radios. As used in this section, the term "super" may have two different meanings in this context. The word "superset" is intended to have its ordinary meaning. However, the term "super-component" may be used to emphasize a superset of functionalities for the technology disclosed herein. For example, a transmitter super-component in a single multi-radio may include an antenna super-component that combines features of the corresponding antenna components in the multiple single radios. Examples of these features may include antenna gain, beam widths, frequencies and others. Assembling a single multi-radio device includes obstacles, including, for example, the proprietary nature of the components in the multiple single radio devices, that make such an approach impractical. Embodiments disclosed herein can reduce the complexity and impracticality associated with this combination.

Other embodiments may be implemented using multiple single radio devices that are connected to form a single multi-radio device via a mission module. The mission module can be used to combine the functionalities of the individual single radio devices. The mission module may be configured to connect to the multiple single radio devices via a number of different connection mechanisms. In one embodiment, the mission module connects to the single radio devices via a connector that is sometimes referred to herein as a super-connector. This can be accomplished in some embodiments without physically altering or extracting components from their host radios. This can be done in such a way that the method does not require the operator to have knowledge of the inner workings of any of the discrete single radio devices. For example, via the super-connector, the mission module may be configured to provide direct connections to the components located inside the single radio devices. These components "accessed" via the super-connector may include, for example, a processor, transmitter, receiver and other analog or digital components located inside the single radio devices. The term "direct connections" can be used to refer to physical connections passing signals from the mission module to and from the single radio devices using standard interface protocols such as universal serial bus (USB), RS-232, and others. The term "direct connections" is not meant to imply that there can be no intermediate connection between the two connected devices.

To one of ordinary skill in the art in the field of radio engineering, the non-obvious combination described above addresses problems of simultaneous operation of radio devices in close proximity brought on by co-site interference. The phrase co-site interference can be used to refer to the operation of co-located single radio devices such that transmissions from these single radio devices interfere with or "drown" the communications from other single radio devices to make communications by the single multi-radio device unreliable. In embodiments of the technology disclosed herein, the mission module is configured to implement "intelligent control" of the operation of the multiple single radio devices in such a way that their operation does not materially interfere with the operation of other devices. One straightforward, obvious approach to achieving this is through timing, in which the mission module ensures that each of the single radio device transmits only in their time allotted. In other words, the mission module can impose time constraints or a time-division-multiple-access-like approach. Other ways which are not obvious are described herein, such as the case in which the transmission of either or both of the single-radio devices is optimized based on knowledge (e.g., a priori or a posteriori knowledge) of the collective radio frequency (RF) environment of a single multi-radio device.

In other words, embodiments of the systems and methods disclosed herein can be configured to go beyond superposition of components, and can use components rather than supercomponents without physically extracting these components from their host platforms, or without altering them in any way.

Figure 2:
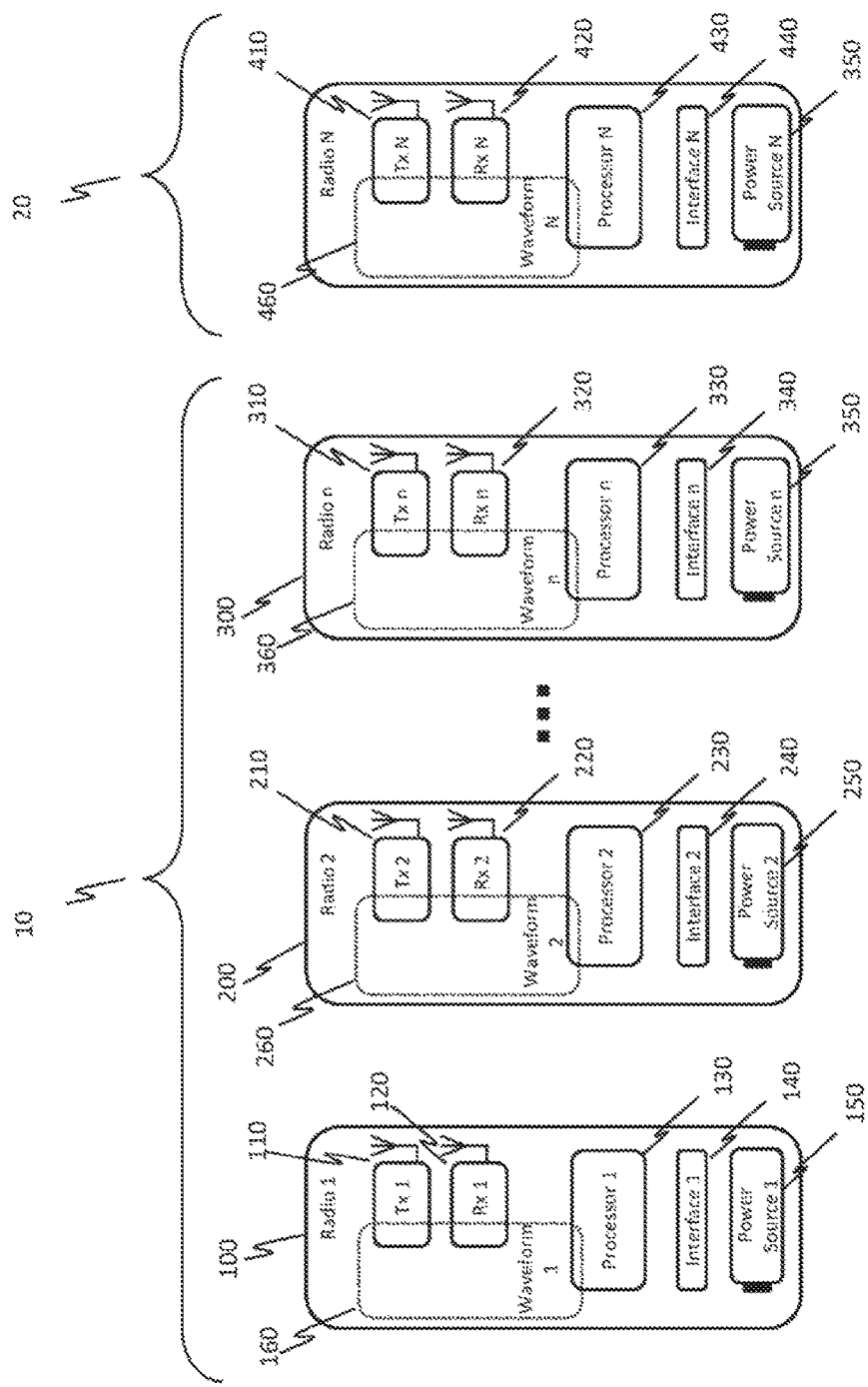
FIG. 2 is a diagram illustrating one technique for combining a set of discrete multiple radio devices 10 into a single multi-radio 20 with functionalities that are a superset of those of the individual discrete radio devices 10.

FIG. 2 is a diagram illustrating one technique for combining a set of discrete multiple radio devices 10 into a single multi-radio 20 with functionalities that are a superset of those of the individual discrete radio devices 10. The set of multiple single radio devices 10 include discrete radio devices 100 through 300. Discrete radio device 100 comprises: a transmitter (Tx) 110; a receiver (Rx) 120; a processor 130; an interface 140; a power source 150; a waveform 160; and may include other components not explicitly shown in the figure. In some cases the Tx and Rx may be combined into a single Tx-Rx. The processor 130 comprises all hardware and software resources needed to accomplish computing tasks required for functioning of the radio. The power source 150 may be a battery or any other suitable power sourced needed to power the single radio device 100. The waveform 160 refers to a combination of physical hardware (e.g., physical layer), analog protocols (e.g., radio frequencies, carrier frequencies, modulation scheme), digital protocols (e.g., digital data encoding and formats), other signal parameters, or other operating parameters or set of operating characteristics (including combinations of one or more of the foregoing) that define or conform to the communication scheme or standard of the single radio device 100. Single radio device 200 comprises of similar components including: Tx 210; Rx 220; processor 230; interface 240; power source 250 and waveform 260. In general one can describe the $n^{th}$ single radio device 300 in the set of discrete single radio devices 10 as comprising of the corresponding components: Tx 310; Rx 320; processor 330; interface 340; power source 350 and waveform 360.

With continued reference to FIG. 2, this example of generating a discrete single multi-radio device 20 is now described. This single multi-ratio device 20 includes super-components analogous to the discrete single radio devices 100, 200 through 300: Tx 410; Rx 420; processor 430; interface 440; power source 450 and waveform 460. In this case: (1) the Tx 410 combines the features of individual transmitters 110 210 through 310; (2) the Rx 420 combines the features of individual receivers 120 220 through 320; (3) the processor 430 combines the features of individual processors 130 230 through 330; (4) the interface 440 combines the features of individual interfaces 140 240 through 340; (5) the power supply 450 can be of larger capacity to provide the combined power of the individual power supplied 150 250 through 350; and (6) the waveform 460 can combine the individual waveforms 160 260 through 360.

Tx 410 is a radio frequency transmitter that integrates transmission capabilities of a plurality of discrete transmitters such that the radio frequency transmitter is configured to generate waveform N 460. In various embodiments, the super-component transmitter combining the features of individual transmitters 110, 210 through 310, combines the transmission capabilities of these individual transmitters, which each may operate according to their own specific set of operating characteristics. That is, they may operate according to different communication standards or protocols, including operation at different frequencies, with different modulation schemes, with different data encoding and formats, and so on. Accordingly, the waveform generated is a combination of the individual waveforms that would otherwise be generated by the discrete transmitters 110 210 through 310. That is, waveform N 460 is a waveform representing a combination or amalgamation of the unique communication characteristics of the individual transmitters (e.g., individual transmitter transmission capabilities) integrated into the super-component transmitter Tx 410. Likewise, the super-component Rx 420 may be configured to integrate reception capabilities of a plurality of discrete receivers, which each may otherwise operate according to their own specific set of receiver operating characteristics.

This kind of combination of functionalities of multiple single radio devices 100 200 through 300 into a single multi-radio devices 20 is possible only in limited scenarios such as those where full access is available to components inside the single discrete radio. Even when full access is available, such an approach is possible only when the number of radios in the set of multiple single radio devices 10 is small. Even in the case where there are only a small number of discrete radios, it may not be possible to combine functionalities. For example, the waveform 460 combines elements of transmitter 410 the receiver 420 and processor 430. The obvious combination of waveform 460 from waveforms 160 260 through 360 assumes that corresponding elements—110-130 210-230 and 310-330—of these waveforms are extractable from the individual single radio devices 100 200 through 300. Although this may be possible in limited cases, in most practical applications the extraction is impossible without impact to its original function.

Figure 3:
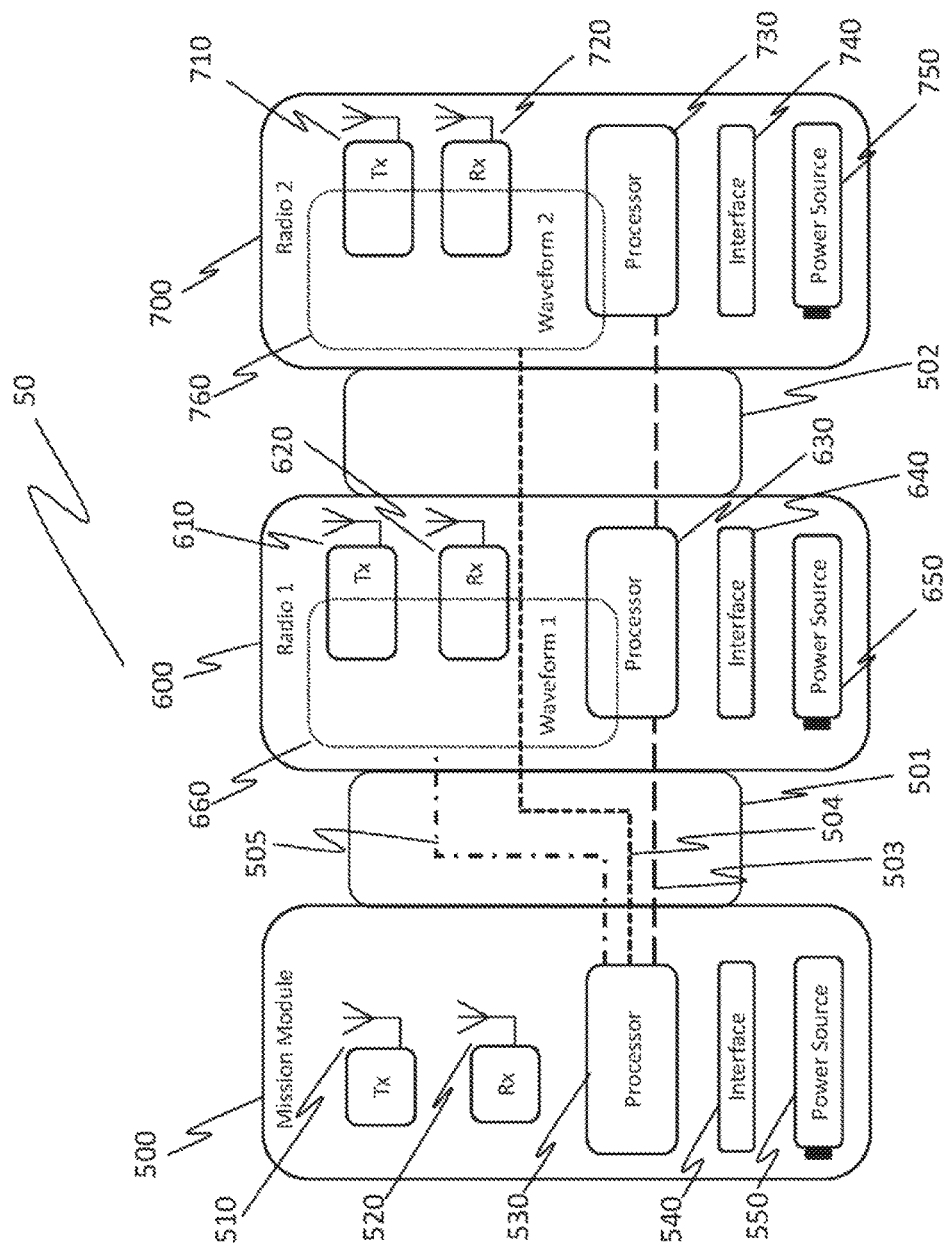
FIG. 3 is a diagram illustrating a method of creating a discrete, single multi-radio device in accordance with one embodiment of the technology described herein.

FIG. 3 is a diagram illustrating a method of creating a discrete, single multi-radio device in accordance with one embodiment of the technology described herein. Referring to FIG. 3, the example method of creating a discrete single multi-radio device 50 utilizes a new component—the mission module 500—to combine the functionalities of the individual single radio devices 600 and 700. Use of only two discrete single radio devices 600 and 700 is for the purpose of simplicity of explanation only and the quantity of discrete single radio devices can be extended to n single radio devices, where n is greater than two. The mission module 500 is by itself a radio including a super-connector set 501 and 502 to the single radio devices 600 and 700.

The super-connector set 501, 502 in this example includes physical connections 503, 504 and 505 and other elements of the radio, such as the Tx M 510; Rx M 520; processor M 530; interface M 540; and power source M 550. For illustration purposes, the diagram shows individual connection 503 from mission module processor 530 to processor 630; individual connection 504 connecting mission module 500 to all hardware that collectively defines the waveform 660 of the single radio device 600; and individual connection 505 connecting mission module to all hardware that collectively defines the waveform 760 of the single radio device 700. These three connections 503, 504 and 505 are for illustration purposes only and can be extended to as many connections as the interfaces 640 and 740 of the individual single radio devices 600 and 700 support.

The term "superconnector" in general, and "super" in particular, is used at times herein to refer to a feature of a connector related to combining both mechanical and electromagnetic (EM) features within the connector envelope. In other words, a separate mechanical connector, used to provide mechanical support to the EM connector in conventional connector solutions is not needed. In other words, the ISR superconnector (or simply, superconnector) satisfies the adequate POE (Platform Operational & Environmental) parameters. In this context, the term "platform" emphasizes that the connector is generally applicable to a given platform: ground, avionics, etc. "Operational" parameters of such a superconnector in various embodiments can include a USB II high speed standard of ~450 Mbps, for example, while, "environmental" parameters include primarily SWaP, vibrations and heat management requirements.

In various embodiments, each superconnector includes two connector halves, each half disposed on (e.g., physically attached to) its respective module or device. For example, the first superconnector 501 includes a first connector half disposed on mission module 500 and a second connector half disposed on single radio device 600. Likewise, second superconnector 502 includes a first connector half disposed on single radio devices 600 and a second connector half disposed on single radio device 700. Accordingly, when the two connector halves are mated they physically attach their respective components together (e.g., mission module 500 is physically attached to single radio device 600, and so on). Additionally, the superconnector halves each include complementary electrical connections (e.g., pins and sockets, contacts, male and female electrical connections, or other electrical connections) that allow the superconnector to serve not only as a mechanical connector but also an electromagnetic connector to couple signals between the connected devices.

Accordingly, super-connectors 501 and 502 can play unique role and may offer more than simple connectivity by also allowing intelligent access to specific components of the radios 600 and 700. This intelligent access can be through standard interface protocols supported by single radio devices 600 and 700. Such standard interface protocols may include, but are not limited to, universal serial bus (USB), RS-232, and others.

The stated super-connector set in one embodiment emphasizes the following two aspects: (1) Electromagnetic (EM) & mechanical interface between the mission module 500, and the single radio devices 600 and 700; and (2) added functionalities relating to the Integrative Software Radio Frequency Management System (ISRFMS) as described below.

Via the super-connectors 501 and 502, the mission module 500 employs waveforms 660 and 760 of the discrete single radio devices 600 and 700, respectively, without physically extracting waveforms (and associated hardware and software) 660 and 760 from their host single radio devices 600 and 700. This method does not require knowledge of the inner workings (hardware and software designs and implementations) of the waveforms 660 and 760; and yet it allows use of their functionalities in the combined single multi-radio device 50. The phrase inner workings can be used to refer to hardware designs as well as source code of the software implemented inside the single radio devices 600 and 700.

This method of using functionalities of the single radio devices 600 and 700 without physical extraction of their individual components/elements 610-660 and 710-760 can be extended beyond usage individual radio waveforms to include usage of processors, interfaces, transmitters, receivers, power sources, interfaces and others.

The mission module can be configured to provide a single interface 540 to the user, power management to manage power between power sources 550, 650 and 750 and management of resources (transmitting, receiving and processing) between the three parts 500, 600 and 700 of the combined multi-radio device 50. The mission module 500 can be configured to enable additional higher computing power in processor 530 as compared with individual processors 630 and 730 to enable additional processing, analysis and rerouting of data received and to be transmitted via individual transmitters 510, 610, and 710, and receivers 520, 620 & 720. Additionally, the processor 530 can be configured to divide computationally intensive tasks into smaller tasks that can be run on individual processors 630 and 730.

The mission module 500 "controls" the operation of the multiple single radio devices 600 and 700 in such a way that the operation of single radio device 600 does not interfere with the operation of the single radio device 700 and visa-versa. One of the simplest ways of achieving this is through timing, where the mission module ensures that the single radio devices 600 and 700 do not transmit at the same time. Other ways of mitigating such radio interference are described in other parts of this document, where the transmission of each single-radio device is optimized based on the knowledge of the collective radio frequency (RF) environment of the single multi-radio device.

Additional functionalities that can be added to the mission module may include information assurance including but not limited to encryption of data-at-rest (DaR) or data-in-transit, tamper detection and tamper proofing, and non-linearity compensation.

This document now describes another way of examining the disclosed technology based on a definition of the term Wavefront described below. One way of combining a set of multiple single radio devices into a single multi-radio device is by integrating waveforms of the single radio devices through integration of both hardware and software into the new multi-radio device. In contrast, embodiments of the systems and methods described herein retain the original waveforms of the single radio devices but include a mission module that allows control of the wavefronts of the single radio devices to provide combined functionalities of the set of single radio devices.

Figure 4A:
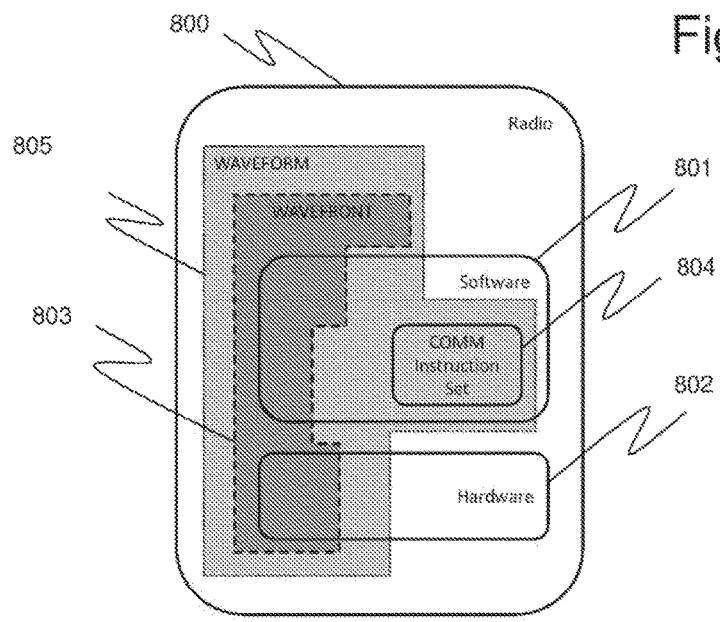
FIG. 4A depicts an example concept for a waveform in terms of radio components.

FIG. 4A depicts an example concept for a waveform in terms of radio components. Referring to FIG. 4A, a single radio device 800 may be described as a combination of software 801 and hardware 802 such that the hardware and software together provide what this document refers to as the Wavefront 803 and a set of instructions (the COMM instruction set) 804 used to achieve the desired communication outcome. In this document, Wavefront refers to all parts of the radio needed for electromagnetic (EM) realization of the radio in such a manner which may include the Wavefront plus all sets of instructions on how to achieve the end communication result. The combination of the Wavefront and the above-mentioned set of instructions together constitute what is commonly referred to as the Waveform 805. In other words, in some embodiments, the waveform can be considered as including one or more adjustable, non-proprietary wavefront components; and relatively inaccessible (e.g., due to their proprietary nature) proprietary components that may be difficult or impossible for a mission module to adjust without access For example, in some implementations, the mission module may have access to and be able to adjust the power amplifier or the signal input to the power amplifier to change signal characteristics of the wavefront to reduce distortion (e.g., signal strength, predistortion, etc.) without changing the proprietary components of the radio transmitter (e.g., data coding schemes, modulation schemes, other proprietary protocols that affect the waveform, and so on) Stated another way, in various embodiments, the mission module is configured to control non-proprietary, controllable components of the waveform, while not adjusting proprietary components that make up the waveform.

Figure 4B:
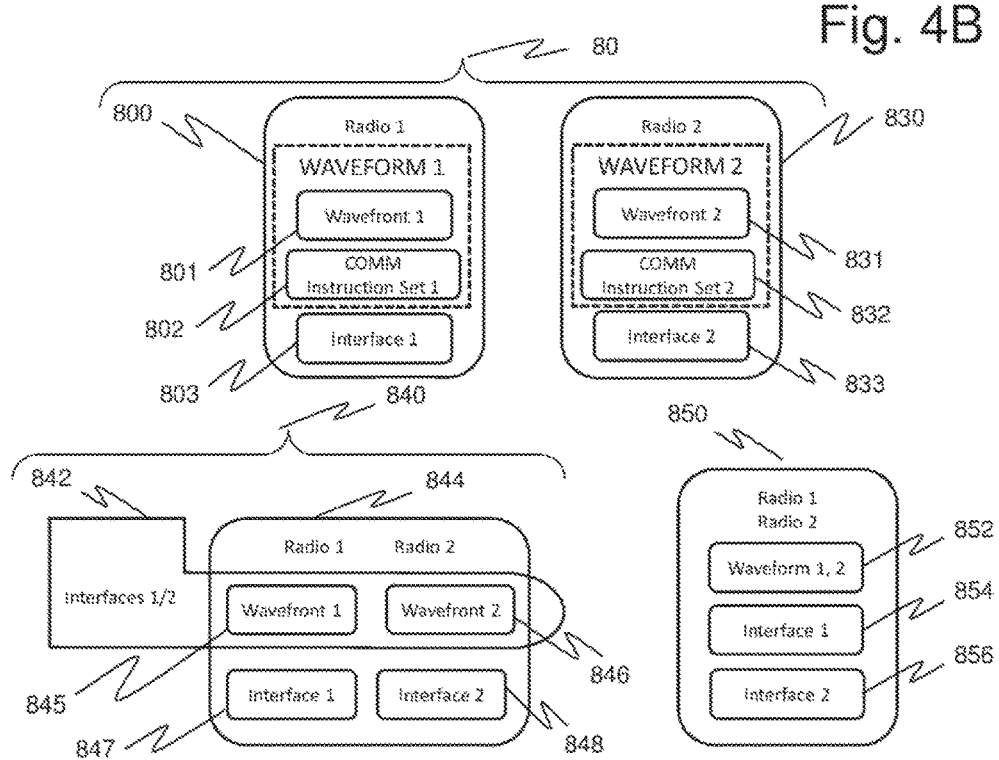
FIG. 4B is a diagram illustrating an example combination of functionalities of a set of independent single radio devices.

FIG. 4B is a diagram illustrating an example combination of functionalities of a set of independent single radio devices. Referring to FIG. 4B, a non-obvious way of combining functionalities of a set of independent single radio devices 80 comprising of single radio devices 800 and 830 (only two considered for simplicity but this quantity can be extended to many single radio devices). A single radio device, for example 800, can be seen as a basic radio comprising two key parts, which are referred to as the Wavefront 801 and the COMM instruction set 802, along with an interface 803. The common definition of Waveform encompasses the physical hardware (the physical layer or PHY), the data layer (combination of signal modulation and firmware) and the protocol layer (software).

The unobvious combination of single radio devices into a multi-radio device 840 is contrasted with an obvious but cumbersome (and in many ways, impractical) combination of single radio devices into a multi-radio device 850. In the unobvious combination 840 the hardware and software of the individual single radio devices are retained, including Wavefronts 845 and 846, and interfaces 847 and 848. The additional mission module 842 includes additional interfaces that allow accessing only the Wavefronts 845 and 846 of the single radio devices. In contrast in the conventional combination 850, entire waveforms (Wavefront+COMM instruction set) 852 and interfaces 854 & 856 need to be accessed (such access is often restricted) to provide the combined functionality.

Various embodiments of an ISR can be implemented relying on conventionally available audio accessories and Mission Module (MM) interfaces with high ergonomic value. "Ergonomics" can refer not only to human factors, but also to the quality of the working life. In general, Human Factors (HF) were mostly stimulated by: nuclear power safety (e.g., after the three-Mile-Island accident), as well as by automobiles, avionics, computer equipment ergonomics, etc. Accessories can be chosen for their ergonomic value and can include, for example, a PTT box, a user MIC, connectors and a headset. These devices can be single or multichannel, and it is noted that a two-channel headset (e.g. earbuds, earphones or otherwise) are highly useful to the ISR, especially in two-module version.

The ISR may be implemented as a single hand-held (or larger), field-deployable radio that combines a broad variety of conventional capabilities into a multi-radio system. The ISR can be configured in some embodiments to provide cryptographic capability, and further configured such that data are not shared between the communication modules and the mission module to prevent transgressing the encryption boundary between encrypted data (e.g., in a secure communication module) and unencrypted plain-text data (e.g., in the mission module). This mission module (MM) can be configured to support unencrypted plain-text data over the communication modules included therein.

The term "integrative" as used herein in the ISR (Integrative Software Radio) context, refers to "tending to integrate", "unify", "compacting" and in some cases "global", which, in addition to the SWaP and FFF (Form-Factor-Function), can also refer to HF (Human Factors). The HF can also include "comformable", "comfortable", "ergonomic", and "safe", where the latter may be for avoiding systems failure/catastrophe, etc.

A multiband, multimission handheld radio in some applications can be configured to provide an estimated 64 Whr for the nominal 8 hr mission, including 2 hrs of transmit time. The remainder may be used for external devices—including the MM. The ISR can be configured in various embodiments to handle multiple, simultaneous waveforms. For example, in various configurations of the ISR, both the handheld radio and the cellular/satphone Mission Module (MM) can be operational at the same time within the ISR system. The user may select which channel they transmit on via a two-channel push-to-talk (PtT) box, an example of ISR ergonomic solution.

In some embodiments of the ISR system, the system can provide the user with a unified human-machine-interface (HMI) for both the 152A and the LTE/Iridium Module through the 152A front panel display/keypad. A mission module interface (MMI) cable can be included to interface from the 152A Side I/O connector to the Mission Module MMI connector. The Mission Module may interface to the 152A Side I/O connector for control/status via the 152A Black USB or Black RS-232 interfaces. If USB interfacing is preferred, the 152A would act as the USB Host and the MM would act as the USB device.

Vehicle adapters can be used to mount the ISR for mobile applications. In some embodiments, for example, a Trimline Vehicular Adaptor (TVA) Cradle can be used as the basis for ISR Vehicular Mounting for an in vehicle-mounted version of the ISR system. As an ergonomic solution, the TVA Cradle can be configured in some embodiments to charge both the ISR system and the TVA side arm that connects to the cradle.

By way of example, AN/PRC-152A Host Module Key Capabilities are described. The AN/PRC-152A offers new benefits to operators through wideband network connectivity of convergence video/data/email/voice. It is the handheld radio that is NSA Type 1 HAIPE certified to provide direct wideband connectivity to secure networks (i.e., SIPR, SIE, etc.). The AN/PRC-152A also provides the following additional Operator benefits:

Embedded GPS enables BFT/SA in all modes.

Reliable 5-watt power out ensures Operator voice and data get through.

10-watt power out for SATCOM ensures Operators have reliable handheld SATCOM links.

Easy user interface:
   Full keypad minimizes Operator keystrokes and complexity.
   100% identical to AN/PRC-1176 to minimize Operator training and maximize Operator efficiency.
   High capacity AN/PRC-152 battery with exceeding energy in the same size.
   Provides the Operator with the most complete capability set thanks to outstanding memory and processing power.

TSVCIS (Tactical Secure Voice Cryptographic Interoperability specification: the AN/PRC-152A is already verified for the NSA Type-1 encryption.

Support for APCO-25 (P-25) waveform operation in the 30-520 MHz and 762-870 MHz bands.

The AN/PRC-152A also provides HAIPE based secure wideband networking via the Adaptive Networking Wideband Waveform (ANW2) and Soldier Radio Waveform (SRW).

As noted herein, any of a number of radio capabilities can be combined into the ISR. By way of example, the ISR can combine AN/PRC-152A radio capability with Motorola XTS-5000 in an ergonomic fashion with an Iridium satphone and GSM/4G-LTE mobile phone functionalities. In some embodiments, the ISR is configured to ensure that all radio components maintain full functionality and performance when integrated and operated (simultaneously) as a single system, with MIL-STD-410F and MIL-STD-464C as a guideline to ensure compatibility (EMC) of the individual radios. In the context of the RF integration, it is desirable to ensure that frequencies emitted by one radio component do not detrimentally affect the operation of any of the other radio components.

In some embodiments the following multiple approaches may be applied alone or in combination to minimize interference between co-located radios, within a kind of multi-faceted technology including pre-existing and new solutions:

1. Provide Optimized Frequency Allocation (OFA) to ensure that component radio frequency bands are sufficiently well separated so that analog input filters for each component remove all primary and secondary (harmonics, intermodulation products) signals from remaining components.
2. Add analog RF hardware filters for dynamic frequency attenuation.
3. Add Predistortion-based Adaptive Linearization System (PALS).

In some embodiments, a dynamic algorithm is provided to allocate frequencies of individual radio components to prevent interference. This can be accomplished using an Optimized Frequency Allocation (OFA) scheme. Therefore, the first step is assuring RF compatibility between multiple devices to locate the potential range of operating frequency bands in order to identify potential conflicts and allocate as necessary to resolve any interference issues. For these purposes, frequency bands for radio components of interest can be identified as:

The Motorola XTS-5000 can work in any of the following frequency bands (VHF, UHF R1, UHF R2, 700/800) with 1-5 W RF output power (1-6 W in the VHF band).

Tx:
VHF (136-174 MHz); UHF R1 (380-470 MHz); UHF R2 (450-520 MHz); 700 Band (700-776, 773-797, 803-806 MHz); 800 Band (806-824, 851-870 MHz);

Rx:
VHF (136-174 MHz); UHF R1 (380-470 MHz); UHF R2 (450-520 MHz); 700 Band (764-767, 773-776 MHz); 800 Band (806-824; 851-870).

The Iridium satphone works in the L-band (1616-1626.5 MHz Tx/Rx).

GSM/4G-LTE phones can operate in several frequency bands, running from UHF to S-band (see; Ref. [2], for complete list of uplink and downlink frequencies).

The 152A is a software-defined radio that operates in the VHF and UHF bands (30-512 MHz) and includes the following waveforms: SINCGARS (30-88 MHz); VULOS (VHF/UHF); ANDVT; HAVEQUICK II (UHF 225-400 MHz); HPW; UHF SATCOM (UHF 225-400 MHz); OTAR; P25 (VHF/UHF).

The Iridium satphone is sufficiently well separated in operating frequency from the 152A that there should be no conflict between these two devices. And while some XTS-5000 and LTE bands are in close proximity, or even overlap with the 152A and Iridium ranges, there are sufficient choices of bands the XTS-5000 (P-25) and LTE functionality that this conflict can be avoided through use of alternative frequency bands.

In some embodiments, the OFA tool is able to characterize the non-linear response of radio transmit and receive components, and use this characteristic response to predict frequency and power levels of harmonics and intermodulation products (see, FIG. 5, for example). These tools may be used to predict realistic signal-to-interference levels at each device during simultaneous operation of multiple devices.

FIG. 5 illustrates an example of harmonics and intermodulation products generated when two signals at 570 MHz and 630 MHz are simultaneously input to a common power amplifier. In FIG. 5, harmonics and intermodulation products generated when two signals at 570 MHz and 630 MHz are simultaneously input to a common power multiplier 900 are presented including two-tone test signal: 590 MHz 901; and 630 MHz 902. At the Power Amplifier (PA) many nonlinear spurs are generated such as: 903, 904, 905. The example also shown is that in which an ISR tool such as a PALS (Predistortion-based Adaptive System) removes the f1+f2 spurs at 1.2 GHz 906, as illustrated by the broken line.

Agile analog RF filters can be integrated to the ISR in order to attenuate signals from one device that could potentially interfere with the other radio device. These filters can also be implemented as digital filters where signal processing is performed in the digital domain. These filters can be tunable (agile) to a given frequency, $f_0$, with filter linewidth, $\Delta f$, defined by an attenuation constant that can be measured in frequency units, leading to Q-factor definition:

$$Q = \frac{f_0}{\Delta f} \Rightarrow \Delta f = \frac{f_0}{Q} \qquad (1)$$

For example, for $f_0=1$ GHz and Q=10,000, the linewidth $\Delta f=(1000$ MHz$)/(10,000)=0.1$ MHz. In addition to Q-factor, the second Figure of Merit (FoM) is filter attenuation, such as 100 dB (see FIG. 7). These filters can be implemented using conventional filter technology, including filters described in U.S. Pat. No. 8,644,896, issued Feb. 2, 2014, which is incorporated by reference herein in its entirety. These filters can be tunable electronically with high speed (e.g., in microseconds).

In various embodiments, these filters can be implemented in the ISR to attenuate unwanted spur frequencies arising from frequency interactions between individual radio components. These filters, including agile notch filters and bandpass filters, may be electronically tuned (e.g., from the MM) and in some embodiments can be tuned in real-time to dynamically filter offending signals.

Figure 6A:
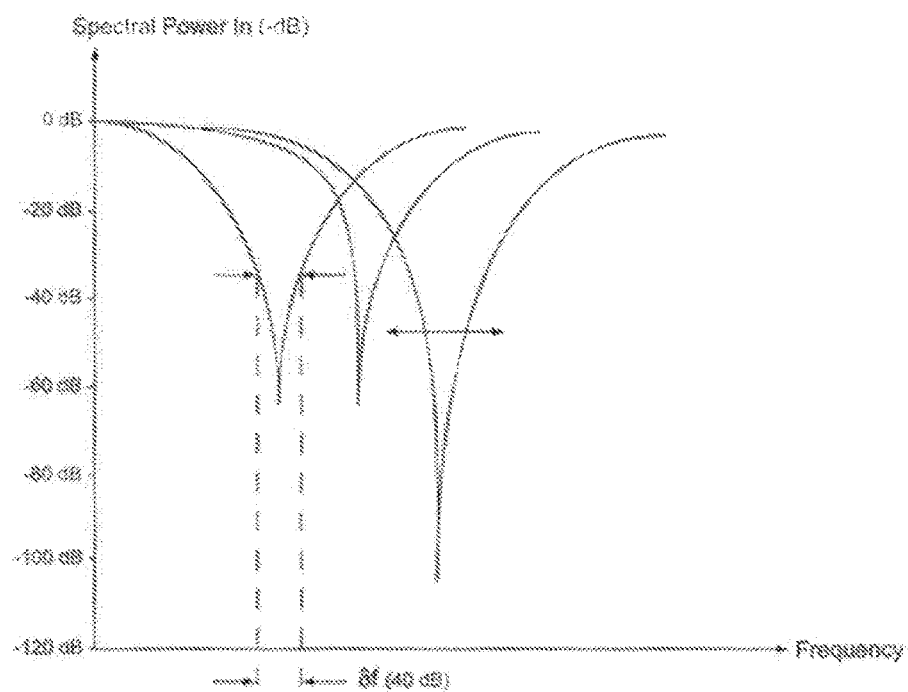
FIG. 6A is a diagram illustrating typical agile filter characteristics, with (δf), defined by 40 dB-attenuation.

FIG. 6A is a diagram illustrating typical agile filter characteristics, with ($\delta$f), defined by 40 dB-attenuation. This is, because, ($\delta$f)-linewidth, as defined by Eq. (1), characterizes usually only 3 dB-filter attenuation. The double arrow shows a tunability feature.

Figure 6B:
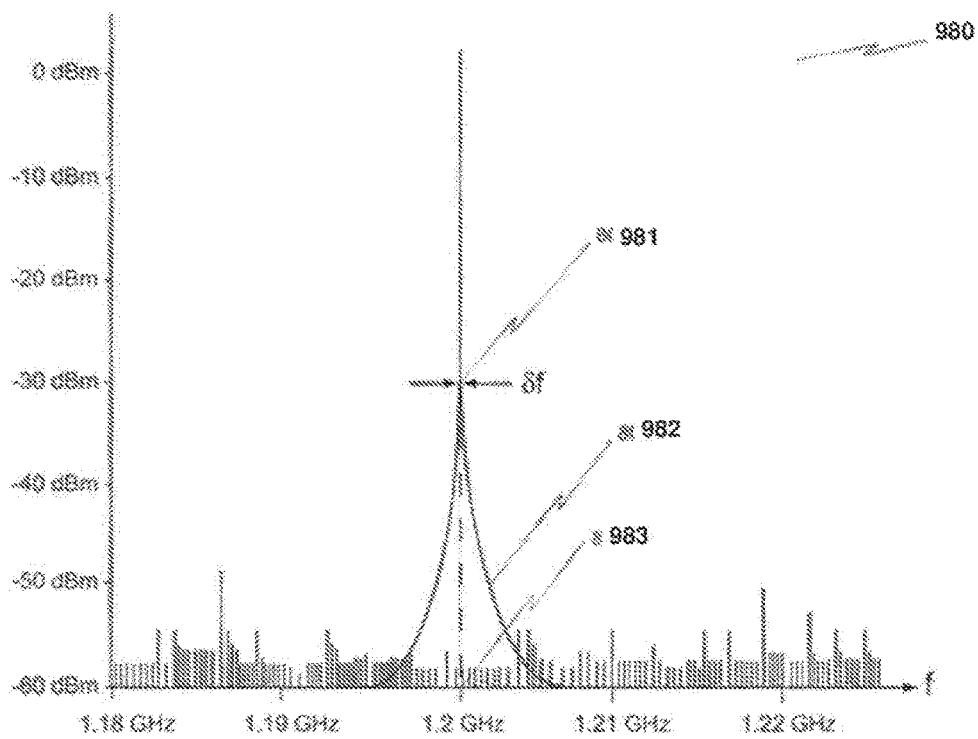
FIG. 6B is a diagram showing an example in which over 60 DB reduction of an intermodulation product is attained using an agile RF filter.
Figure 8:
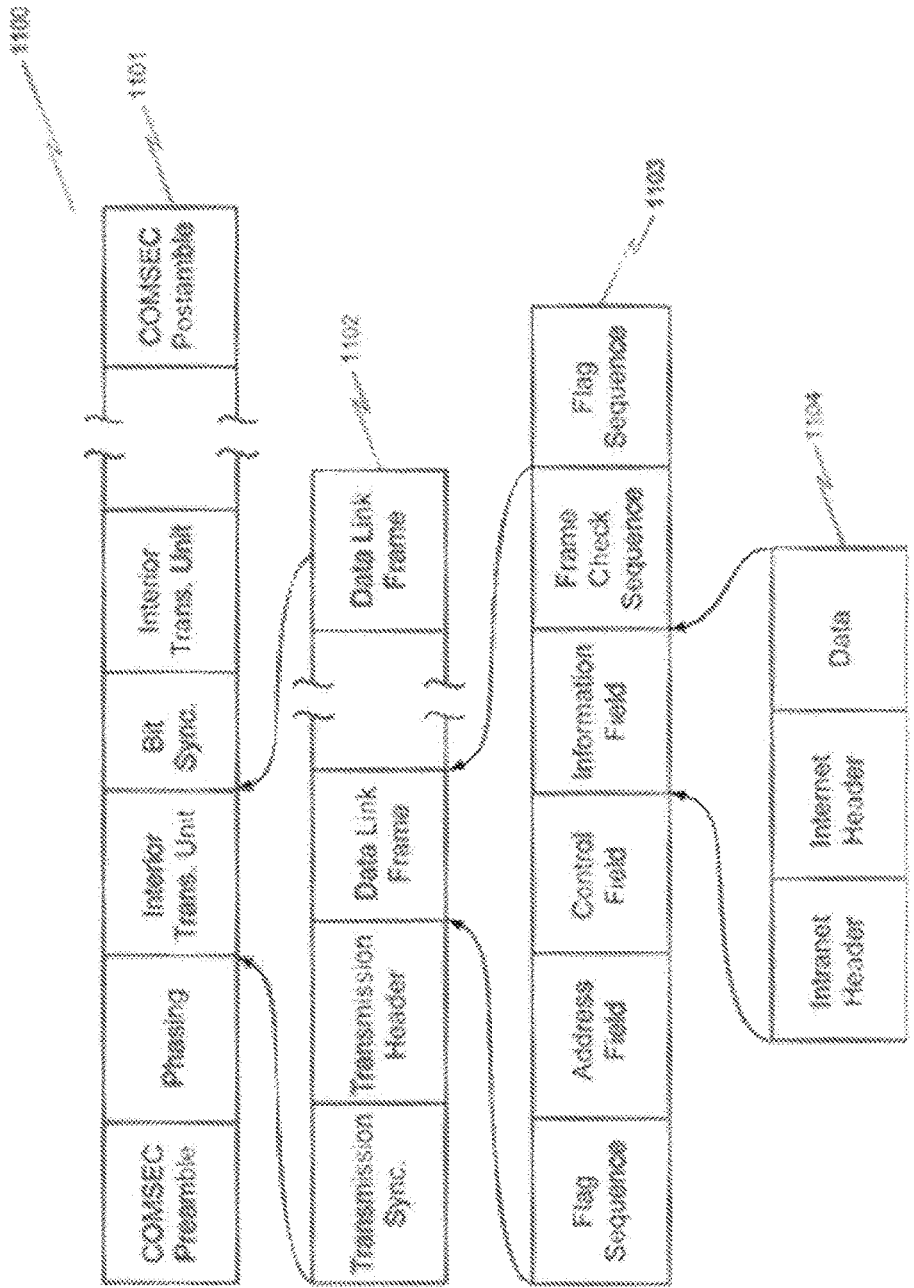
FIG. 8 shows an example of basic structure of DMTD protocol data units at the standard interface as addressed in MIL-STD-188-220.

FIG. 6B is a diagram showing an example in which over 60 DB reduction of an intermodulation product is attained using an agile RF filter. FIG. 8 shows the spur reduced below the noise floor (>60 dB), due to tunable (agile) filter technology. More particularly, FIG. 6B shows an example of over 60 dB reduction of an intermodulation product by agile RF filter 980, including 30 dB-attenuation linewidth, of, definition 981. In such a case, ($\delta$f)=0.2 MHz, and Q=(1200 MHz)/(0.2 MHz)=6,000. The close-up of original nonlinear spur at f1+f2, 982, shows that the spur was reduced below the noise floor 983 by ISR nonlinear compensation. (Usually 0-factor's linewidth, $\Delta$f, defines 3 dB-loss)

In some embodiments, Digital Nonlinearity Compensation is realized by a new Predistortion-based Adaptive Linearization System (PALS). FIG. 7 is a diagram illustrating an example of a Predistortion-based Adaptive Linearization System. (PALS), in accordance with one embodiment of the technology described herein. As the illustrated example includes: (a) Input Frequency Signal Script; (b) Power Amplifier (PA) Nonlinear Response; (c) Transmitted Signal with Intermodulation Product (IMP); (d) Nonlinearity Compensation; (e) Nonlinearity Compensated; and (f) Clean Transmitted Signal without IMP.

In FIG. 7, an example PALS methodology 1000 is presented. Tx Power as a function of frequency 1001 represents an input signal script example of a two-tone test signal which is transmitted 1002 to the PA with nonlinear characteristics 1003. In response, the PA nonlinearity 1003 produces frequency spectrum 1004 with IMPs such as 1005, for example. This frequency power signal 1004 is transferred 1006 to a nonlinearity compensation stage (7(d)), embodiments of which are described in detail below with reference to FIGS. 44-59 of this document. Symbolically it shows that nonlinearity compensation curve 1007 is inverse to nonlinearity curve 1003. Arrow 1008 shows that the PALS realization is physically provided through transfer 1008 while the arrow 1002 is illustrated only for sake of explanation. As a result of this nonlinearity compensation (FIG. 7(d)) the resulted curve 1009 is linear resulting in Tx Power vs. Frequency output signal with IMP 1010.

The example PALS illustrated in FIG. 7 is "adaptive" in such a sense that the PALS nonlinearity compensation is specifically designed for dense spectral signal content over a wide operating band. The basic methodology, as in the example of FIG. 7, and including the example in FIG. 6, may be used to reduce nonlinear spurious signals in an RF output signal by predicting (e.g., in real-time) the occurrence of spurious signals, and then performing a digital predistortion (at the transmitter) or postdistortion (at the receiver).

One embodiment of the PALS solution is the ISRFMS, which is described in further detail below.

The PALS solution can be implemented using hardware, software, or a combination thereof. While the PALS solution can be implemented as a software-only solution; then its adaptability will be limited to non-real-time operations, especially in the case of complex IMPs. Also implementation with a FPGA firmware core will speed-up the operation into real-time solution. In the simplest case, the FPGA can be directly integrated to one of the conventional radio solutions (e.g., on the radio platform) that is integrated as part of the ISR.

In another embodiment, the FPGA hardware can be integrated as part of the mission module (MM), and further applied to both transmit and receive portions. This would compensate both the non-linear response of both the conventional radio such as PRC-152 and the MM, despite being integrated exclusively on the MM hardware only. This is because, as noted above, the non-linear compensation can be applied on either transmit or receive side of the RF link, or both in some instances. FIGS. 6 and 8 show a capacity of broadband device and measured reduction of non-linear spurs by over 60 dB.

In addition to well-known Intermodulation Products (IMPS) and Harmonics, less known catastrophes can also contribute to nonlinearities as other non-linear products. In particular, odd non-linearities such as: $x^3$, $x^5$, etc., produce a deformation of fundamental frequency signals in the form of so-called cusp catastrophes which produce sudden jump, or drop, of the fundamental frequency signal with slight carrier frequency modification, or in the vicinity of resonance frequency. The location of such cusp catastrophes is at the distance of $$(\Delta f)\sqrt{3}/2$$

from resonance frequency.

The ISR in various embodiments is configured in such a way that any additional data modes supported by the ISR meet the intent of the MIL-STD 188-184 and 188-220 that is interoperable with existing systems using these standards. MIL-STD-188 is a series of communication standards developed to ensure interoperability. These standards are mandatory for use for certain government applications in a vast majority of systems and equipment, including major upgrades. MIL-STD-188-184 supports both point-to-point and one-to-many point (multicasting) communications. MIL-STD-188-200 contains current tactical communications.

The ISR can also be configured to use DMTD protocol, as an option. DMTDs may be used for remote access to automated C41 systems and to other DMTDs. According to MIL-STD-188-220D, the DMTD is defined as "a portable data terminal device with limited message generation and processing capability."

FIG. 8 shows an example of basic structure of DMTD protocol data units at the standard interface as addressed in MIL-STD-188-220. In FIG. 8, the standard DMTD protocol 1100 is presented, including: physical layer concatenation 1101; Interior Transmission Unit (Data Link Concatenation) 1102; Data Link Frame Structure (Link Layer); 1103; and Network Protocol Data Unit (Network Layer) 1104.

The Integrative Software Radio (ISR) in some embodiments is a multifunction radio that can provide the capability for multiple simultaneous transmissions, allowing tactical users, for example, to simultaneously upload/download data files from a portable personal computer on a GSM/4G-LTE connection, to communicate via voice and data with AN/PRC-152A waveforms, and to coordinate with a C2 center via the Iridium satellite network. Host and MM voice and data signals may be routed individually to keep the signals from each communication subsystem isolated so that simultaneous operations can be achieved in the shortest time.

In summary, the ISR can be implemented as a single, hand-held (or larger, e.g., vehicle mountable), deployable wireless communications device that combines, optionally, AN/PRC-152A compatibility (including NSA Type 1 encryption) and Motorola XTS-5000 compatibility (via the APCO-25 waveform), Iridium satphone capability, GSM/4G-LTE mobile phone functionalities, and global positioning system (GPS) reception while retaining compatibility with the corresponding communication devices. In one example configuration, the ISR provides three conventional radio solutions: AN/PRC-152A capability, along with generic GSM/4G-LTE cellular phone, Iridium satphone (with tracking capability) and Motorola XTS-5000 handle-talkie (HT) functionality. As one of ordinary skill in the art will appreciate after reading this description, other multi-radio configurations, including those discussed below, may also be configured.

Figure 9:
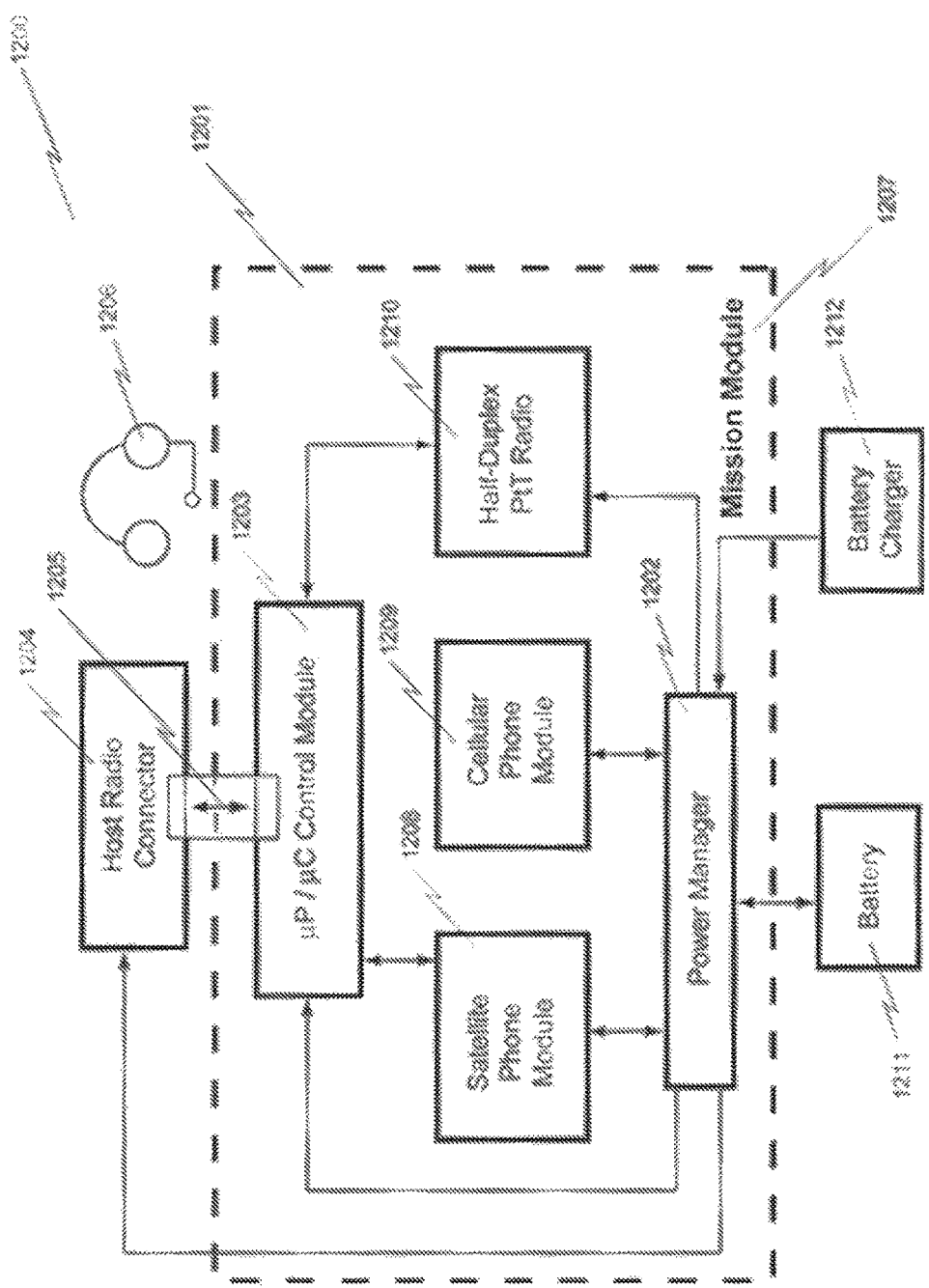
FIG. 9 is a diagram illustrating an example ISR mission module in accordance with one embodiment of the technology described herein.

FIG. 9 is a diagram illustrating an example ISR mission module in accordance with one embodiment of the technology described herein. In this example, the ISR mission module 1201 is illustrated in the context of an exemplary ISR system 1200, which includes a novel Power Manager (PM) subsystem 1202. This exemplar ISR 1200 includes: μP/μC control module 1203, which is connected into host radio 1204 through host radio connector 1205. This example is shown as being supported by a headset 1206, which in various embodiments can be implemented as a conventional single or multi-channel headset. Within the example mission module (MM) 1201, three exemplary radios are included with MM-mechanical packaging 1207, such as: satellite phone 1208; cellular phone 1209, such as the GSM/4G-LTE (long term evolution) cellular phone module; and half-duplex PtT (push-to-talk) radio 1210, such as the Motorola XTS-5000 Walkie-Talkie radio.

In the illustrated embodiment, connector 1205 is implemented as a snap connector (modified), examples of which are described in U.S. Pat. Nos. 7,462,035; 7,335,067; 8,308,489; 7,556,532; 7,658,612; 7,753,685; and 7,731,517B2, each of which are incorporated by reference in their entirety herein. In other embodiments, connectors and implementations, including other conventional connectors, can be applied. In this context, Power Manager 1202 may be referred to herein as a Snap Connector Power Manager (SNAC-PM) or a Programmable Snap Connector based Power Manager (PSCPM), although other power manager configurations and descriptors can be utilized. The PSCPM is connected to battery 1211 and battery charger 1212.

ISR Configurations. Within the exemplary ISR system 1200, several ISR configurations operating with the same power management 1202 may also be included, with radio 1208 denoted as "1", radio 1209 denoted as "2", and radio 1210 denoted as "3". These configurations are summarized in Table 2.

TABLE 2

| ISR Radio Configuration | |
|---|---|
| Configuration | Description |
| 1 + 2 + 3 | Radios: 1208, 1209, 1210 |
| 1 + 2 | Radios: 1208, 1209 |
| 1 + 3 | Radios: 1208, 1210 |
| 2 + 3 | Radios: 1209, 1210 |
| 1 | Radio: 1208 |
| 2 | Radio: 1209 |
| 3 | Radio: 1210 |

Within the context of MM 1201, it is preferable to use the following feature relations: hardware (electronic), packaging (mechanical & electric), and software.

Figure 10:
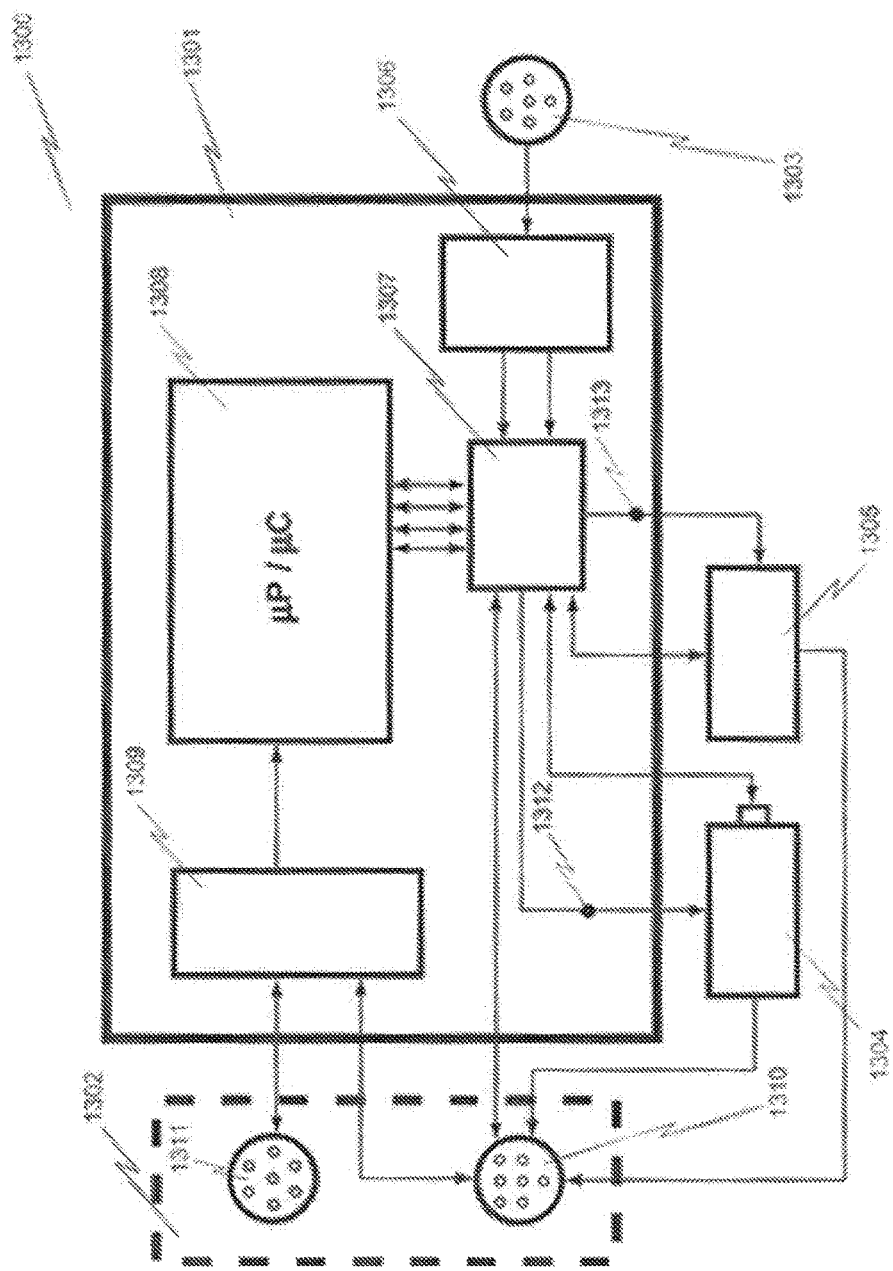
FIG. 10 is a diagram illustrating an example of a Programmable Snap-Connector-based Power Manager (PSCPM) in accordance with one embodiment of the technology described herein.

Example embodiments of the PM, such as Programmable Snap-Connector-based Power Manager (PSCPM) are now described in more detail. FIG. 10 is a diagram illustrating an example of a Programmable Snap-Connector-based Power Manager (PSCPM) in accordance with one embodiment of the technology described herein. In the example illustrated in FIG. 10, the PSCPM subsystem 1300 as Power Manager (PM) with external batteries and auxiliary power input is described. The PSCPM 1300 in this example includes: power and data manager 1301; universal power and data wiring harness 1302; auxiliary power input 1303; conformal battery #1 1304; conformal battery #2 1305; buck/boost regulator 1306; charge/controller 1307; microprocessor (μP)/microcontroller (μC) 1308; data hub 1309; SNAPNET connector (supported by U.S. patents given above) 1310; SNAPNET connector 1311; battery monitoring bus 1312; and a second battery monitoring bus 1313.

SNAPNET connector 1310 provides power to and transports data to/from attached electronic devices. SNAP connector 1311 is a data only version of connector 1310. Battery monitoring bus 1312 provides monitoring data from battery 1304. Battery monitoring bus 1313 provides data monitoring from battery 1305. Conformal battery 1304 provides power to power and data manager 1301. It is charged by charge/controller 1307 and communicates its state of charge via battery bus 1312. Conformal battery 1305 functions in the same way as 1304 except for higher power loads. State of charge is communicated via 1313.

Power and data manager 1301 accepts a wide range of DC inputs which may be varying in nature; this includes conformal wearable batteries and charger inputs. Data (such as USB 2.0 data) is routable between ports 1301 and 1311 on harness 1302.

Harness 1302 provides programmable voltage outputs to attached electronic devices by sensing the needs of the attached device via its embedded electronic serial number. The embedded serial number can be used to assist with automatic routing of data.

Auxiliary Power Input 1303 provides an alternative to power from batteries 1304 and 1305, and supplies charging current to charge/controller 1307. Buck/boost regulator 1306 provides auxiliary power input 1303 with power converter as necessary to supply power to charge/controller 1307.

Charge/controller 1307 is dual functionality device under control of μP/μC 1308 that charges batteries 1304 and 1305; while simultaneously providing power to attached devices through wiring harness 1302.

SNAPNET 1310 provides power to relevant electronic devices, although other connectors can be used. Data connector such as SNAPNET one 1311 provides higher power data than 1310 to relevant electronic devices. Bus 1312 provides monitoring data from battery 1304. Bus 1313 provides monitoring data from battery 1305.

μP/μC 1308 determines the state of each port 1310, 1311 and the electronic devices attached thereto routes power from 1307 as needed. It also identifies and logs faults. Data hub 1309 routes USB 2.0 data between ports 1310 and 1311 based upon instructions from μP/μC 1308.

μP/μC 1308 is attached via electronic serial numbers embedded in each device and/or its attached cabling. In other words, each device attached to the present invention PM 1300 can be configured to transmit a unique identifier, electronically, such that it is recognized before power is applied to it. In response, the power supply reconfigures itself based on the unique identifier to provide the appropriate voltage and current to the device, allowing proper operation of the device and avoiding damage to the device. This this can also be a useful After-Lessons-Learned (ALL) Human Factors (HFs) approach for safety purposes.

Figure 11:
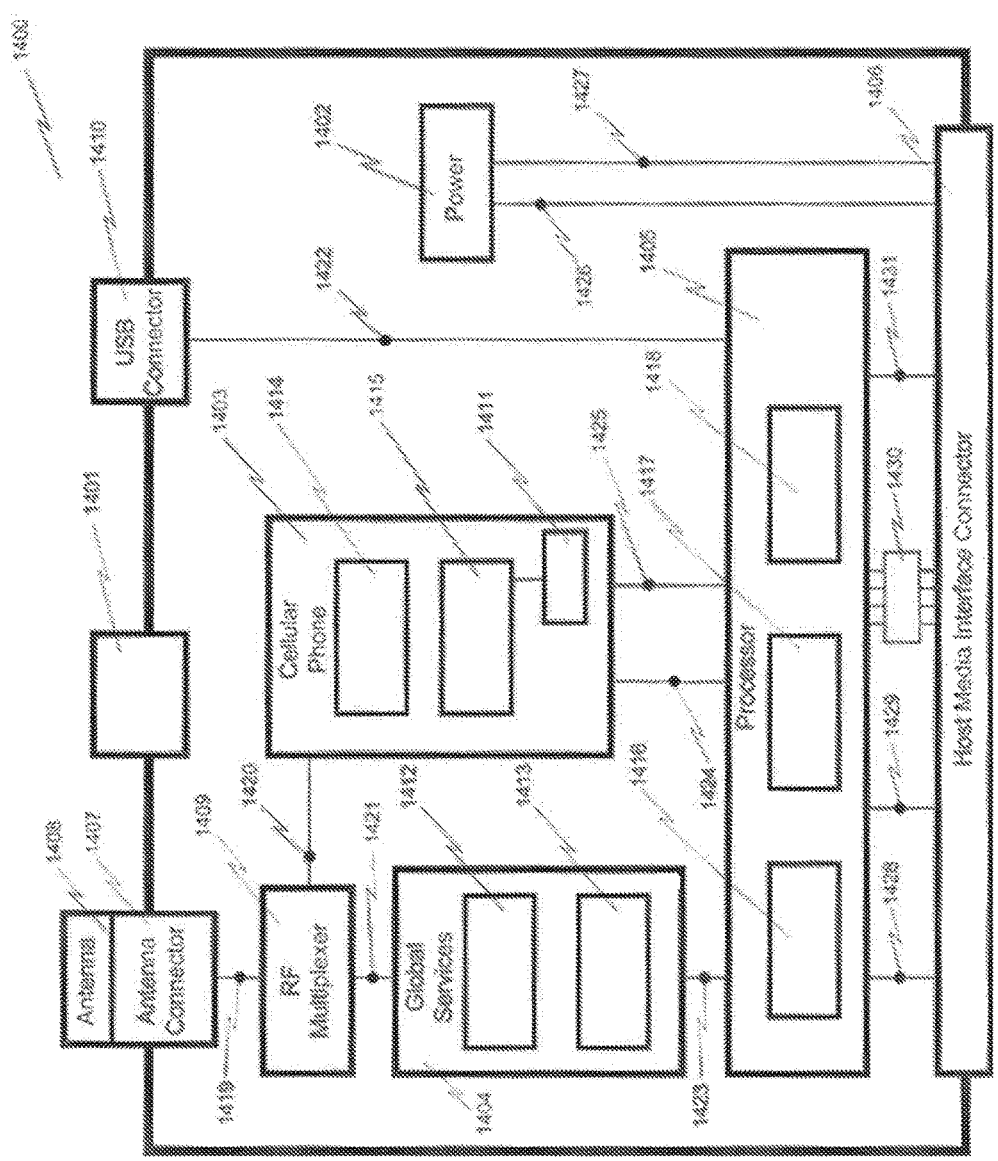
FIG. 11 is a diagram illustrating an exemplary dual radio ISR system in accordance with one embodiment of the technology described herein.

FIG. 11 is a diagram illustrating an exemplary dual radio ISR system in accordance with one embodiment of the technology described herein. More particularly, FIG. 11 presents an exemplary dual radio system 1400 architecture of the ISR, including two radios: satellite phone and cellular phone.

In the example illustrated in FIG. 11, ISR dual-radio system 1400 includes: a mechanical package (environmentally-protected housing) 1401; a power manager subsystem 1402, which may be implemented as the power manager (PM) described above; cellular phone 1403, such as, for example, a 4G LTE cellular phone subsystem for support of GSM/4G-LTE cellular telecommunications; a global services subsystem 1404, such as satellite telephone module for worldwide telecommunications; a processor subsystem 1405, which in some embodiments provides "glue logic" and data transport between radio modules; a host media interface connector 1406, which provides interface to host radio; an antenna connector 1407 that supports multiband shared antenna connection to the multi-radio ISR device; a multiband shared antenna 1408, which may be mounted to the housing and is configured to supports satellite telephone cellular telephone and GPS simultaneously (e.g., may be a multi-band antenna in various embodiments); a Tx/Rx radio frequency multiplexer 1409, which detects RF signals to/from each radio module and which may further be configured to multiplex output signals for transmission and demultiplex receive signals and send them to cellular phone 1403 and global services subsystem 1404; a ruggedized external USB-connector 1410, which provides an industry standard input/output port for digital data; a SIM card/carrier 1411; an Exelis machete module 1412; a module 1413 supporting components (passives connectorization discrete digital etc.); a Sierra wireless 4G LTE module 1414; a module 1415 support components (passives connectorization, discrete digital etc.); a TI Sitara AM 3894 module 1416; a module 1417 supporting components (passives connectorization discrete digital etc.); a memory I/F module 1418 (e.g. RAM flash DMA); RF cables 1419, 1420, 1421; USB cable 1422; RS232 interface 1423; PCIe interface 1424; RS232 interface 1425; power cable 1426; return cable 1427; USB interface 1428; RS232 interface 1429; GPIO (General Purpose I/O) 1430; 1 pps GPS sync 1431.

Figure 12:
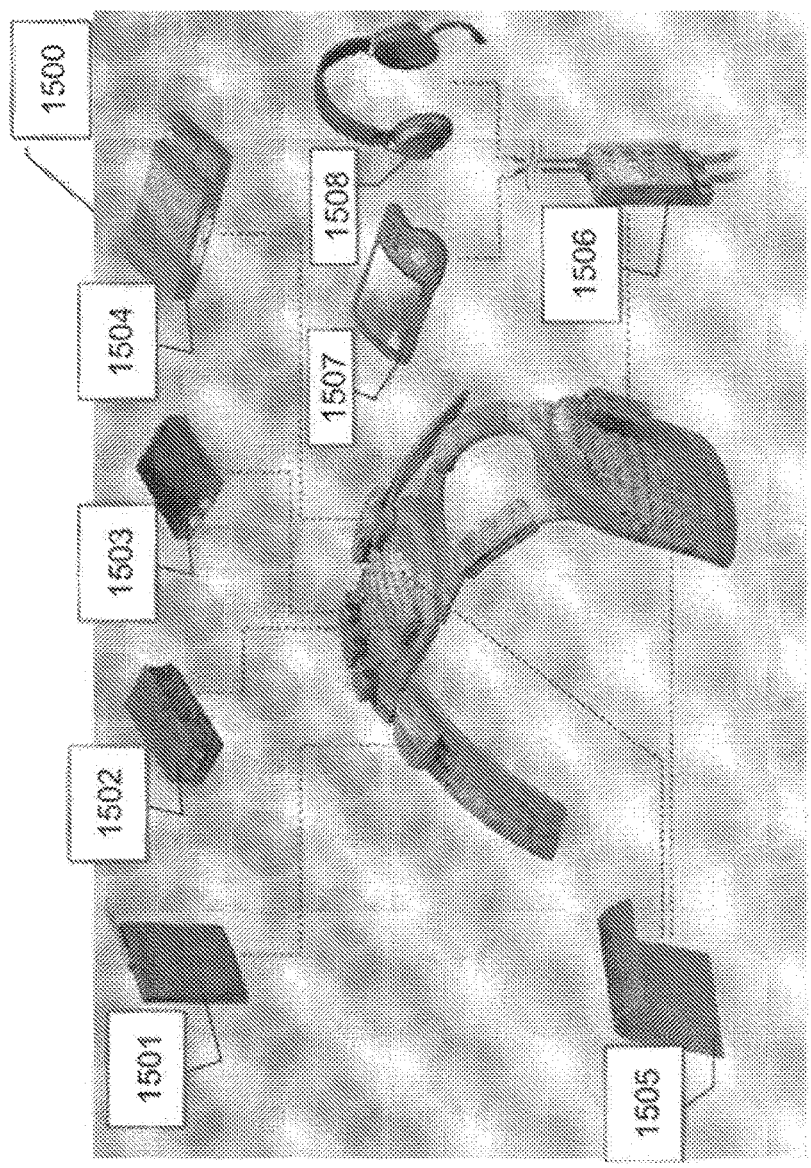
FIG. 12 is a diagram illustrating an example implementation of a DMRD in accordance with one embodiment of the technology described herein.

In some embodiments, a Distributed Multi-Radio Device (DMRD) can be configured as an ALL device, being an element of Human Factors (HFs) as the DMRD is conformably and comfortably distributed around a human body. FIG. 12 is a diagram illustrating an example implementation of a DMRD in accordance with one embodiment of the technology described herein.

In the example illustrated in FIG. 12, a Distributed Multi-Radio Device 1500 is presented as a multi-radio device in a distributed configuration. This example includes: conformal battery/batteries (in environmentally-protective housing) 1501; radio frequency (RF) splitter/combiner for antennas 1502, which supports multiband shared antenna connection to the multi-radio device; mission modules/host radio module 1503, which in some embodiments are commercial off-the-shelf (COTS) modules for supporting GSM/7G-LTE cellular telecommunications, a satellite telephone module for worldwide telecommunications, or walkie-talkie functionality. One module is host radio; power manager 1504, which is ALL PM; a COTS conformal radio frequency (RF) antenna 1505, which supports low profile operation; a processor subsystem 1506, which provides "glue logic" and data transport between radio modules as well as graphical user interface (GUI) functionality; a flexible display 1507, which provides a GUI for host radio and MMs; and a noise cancelling handset 1508 with a built-in microphone. The illustrated example supports binaural operation with one radio module's audio in the left ear, and another in the right ear. This configuration can also support a single radio channel in one or both ears. Embodiments can include noise cancelling functionality for the built-in microphone.

As used herein, the term More Direct Integration (MDI) refers to hardware/packaging integrations that can go deeper than the chassis level without further knowledge of COTS system architecture and functionality. Embodiments of MDI address SWaP (Size-Weight-and-Power) as well as FFF (Form-Factor-Functionality) to enable a more compact radio while still preserving both FFF and SWaP constraints.

Embodiments can be configured that use fewer antennas than the number of radios in the DMRD. Further embodiments can include Fractal Antennas and other amorphous antennas to reduce the form factor of the DMRD.

In some embodiments, RF frequencies can be relocated in a one-to-one or other fashion. In the $1^{st}$ case, they are relocated in such a way that they are separated in a maximal way from each other; i.e., Euclidean distances between the RF neighbors may be maximized including all relevant constraints, such as available RF-ranges; etc. In such a case, a cost function can be used, which, in some embodiments, is the Figure of Merit (FoM) for this problem and discretitize RF-sets, including non-compensated nonlinearitics and RF-linewidths. In the embodiments separating the RF frequencies, mathematical combinatorics are employed to find a total number of RF-configurations and conventional fuzzy-neural methods, genetic algorithms, or like techniques are used to determine the frequency locations. In still further embodiments, Single Purpose Processors may be implemented that are configured to calculate Euclidean distances sufficient to enable frequency relocation with minimal or no loss of data due to RF interference.

Figure 13:
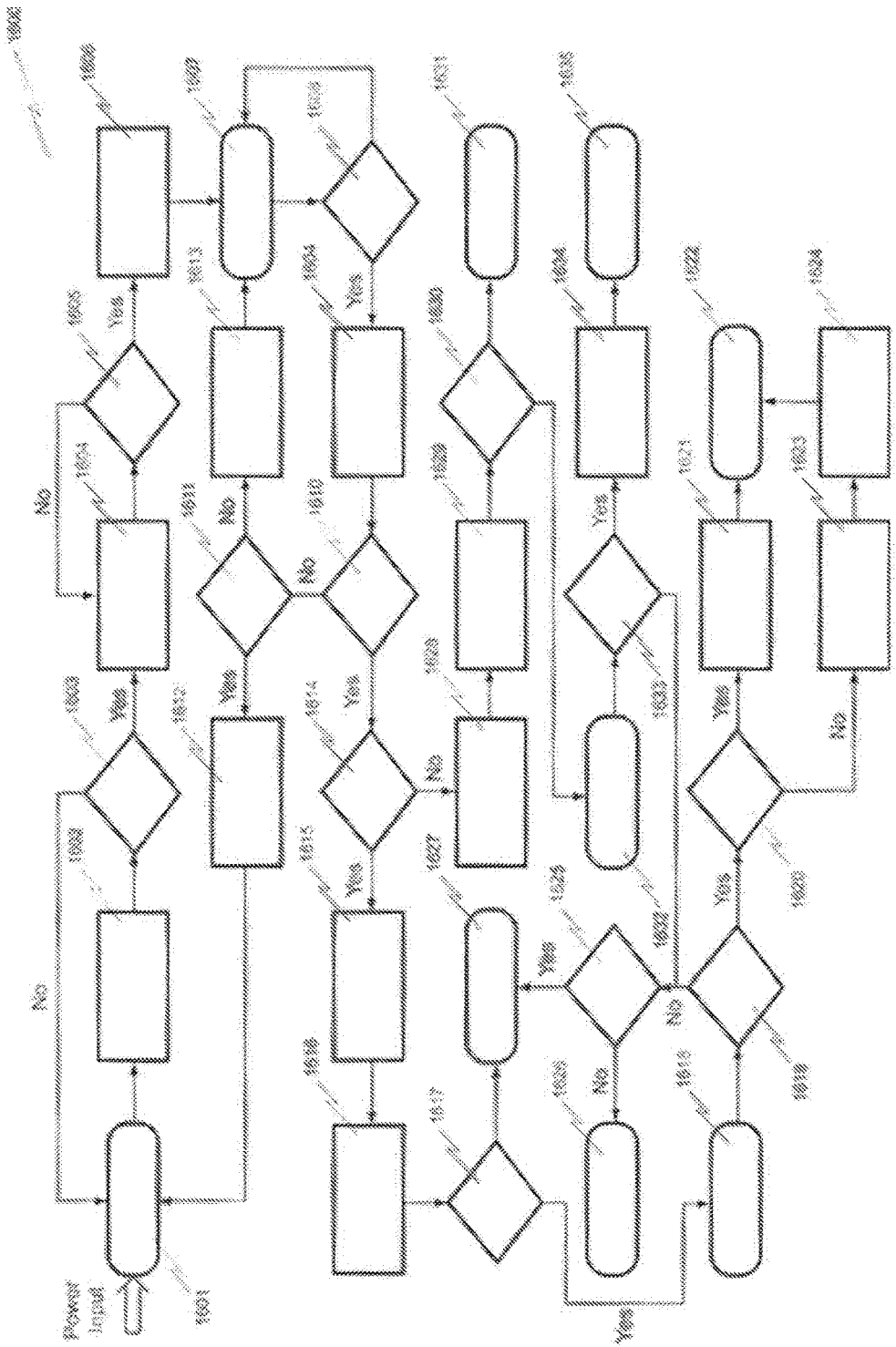
FIG. 13 is an exemplary ISR logic flowchart in accordance with one embodiment of the technology described herein.

FIG. 13 is an exemplary ISR logic flowchart in accordance with one embodiment of the technology described herein. In the example of FIG. 13, exemplary ISR logic flow chart 1600 for the Mission Module (MM) includes a multi-radio system with two (2) radios: a satellite telephone, such as Iridium radio, and a cellular phone, such as a 4G/LTE cellular, for example.

In this exemplary MM, operation begins when external power is applied to the appropriate power input at 1601. Once powered properly, the system begins a boot up process 1602 to initialize the system hardware and operating system. If a hardware or operating system error is found, or if the system cannot boot for any reason, the boot process decision tool 1603 generates "no"-decision, returning to power up state 1601. Upon a successful boot, a "yes" decision is given, and the system loads the operational code and begins querying attached interfaces to find attached external equipment 1604. In other words, in various embodiments the MM can be configured to validate available interfaces. If adequate external equipment is found, then decision tool 1605 provides "yes". If the required subset of I/O is found for the system to operate, then handshaking and communication validation 1606 is provided. Otherwise, the system returns to 1604 and continues polling interfaces until the appropriate inputs and outputs are found.

Once the system is fully operational and communicating with external systems, it enters a smart power mode 1607. Smart power mode 1607 is an operational state in which the system maintains communication with external systems, parses incoming commands, reports status, handles interruptions, and performs other management functions. Based on loading and external system demands, the mission module system can intelligently manage its own power to optimize consumption.

If a command from an external system is received by external command detector 1608, the mission module receives the data and determines (e.g., in software) what the command instructs the system to do, and the mission module parses the received commands 1609. If no commands are detected, the system remains in smart power mode 1607 until a command is detected.

Based on the command instruction, the system can either activate one of two radio interfaces by radio activation command 1610, or perform command and control function within itself (e.g., a "No" command). Various of the commands may be managerial in nature, such as serial number update, status response, etc., (e.g., "no" by Software Load Command 1611) and can be handled during normal operation 1613. Once these managerial commands are handled, the system returns to smart power mode 1607. However, if the command is for a software update to the system (e.g., "yes" for 1611), then the system must obtain the software update via external system interface 1612, and then reboot itself 1602, to complete the change, starting from 1601.

Returning to radio activation command 1610, the system either activates the Iridium radio features of the system (i.e., "yes" to Dual Radio Activator, 1614) or, the 4G/LTE features of the system (i.e., "no" to 1614). As noted above, in various embodiments the system can be configured to include two types of radios: e.g., satellite and cellular, or any other adequate types such as Wi-Fi and cellular, for example. In an exemplary case, as in FIG. 13, the system (MM) initializes either an Iridium satellite subsystem 1615, or the cellular subsystem (e.g., 4G/LTE) 1628, by either a SATCOM initializer 1615 or by a cellular phone initializer 1628.

In the case of satellite radio communication, the mission module hardware elements that support the functionality may be booted and initialized by SATCOM initializer 1615. Once complete, the SATCOM (e.g., Iridium) system hardware then "logs in" to the Iridium constellation 1616. If an error occurs with the network communication, the system returns to smart power mode 1627. At any time, if errors are found during any of the system operations, the system returns to smart power mode 1627 and reports the error status to external equipment 1613.

If network communication is successfully established, the system enters a "satellite data mode" 1618. In other words, the MM enters MM SATCOM data mode 1618, which allows full communication and monitoring of the Iridium link by the system. If data packets are detected from an external system or the satellite network 1619, they are checked to determine whether they are incoming or outgoing with respect to the satellite network 1620. If the data is found to be a command for the system from an external system 1625, the system returns to smart power mode 1627. If the data is not a command, the system remains in satellite data mode and continues waiting for data 1626. If the data is coming from the satellite network, it is decoded, encrypted (if necessary) and streamed to an external system 1621. After a communication is completed, the system returns to satellite data mode and awaits further communication 1622.

If data is to be sent over the satellite network from an external system, the MM first captures GPS data from an internal GPS receiver 1623, and then packages this data for transmission over the satellite network 1624. After a communication is complete, the system returns to satellite data mode and awaits further communications 1622.

If a radio activation command instructs the system to activate the cellular radio 1614 (such as, e.g., 4G/LTE radio functionality) rather than the satellite functionality, then the system boots and initializes the cellular hardware and software components 1628. Once these elements are properly running, the system attempts to log in to the cellular network supported by the system 1629. If an error occurs, the system returns to smart power mode 1631.

If the system successfully joins the cellular network 1630, it enters a cellular mode (e.g. a "4G/LTE data mode") 1632, which allows for full communication and monitoring of the cellular link by the system. If data packets are detected from an external system or the 4G/LTE (or, other cellular radio) network, the data is encoded (outgoing over the network) or detected (incoming from the network) and passed to the appropriate destination 1634. After the communication session is complete, the system returns to the satellite data mode and awaits further communications 1635. If the data is found to be a command for the system from an external system 1625, the command returns the system to smart power mode 1627. If the data is not a command, the system remains in cellular data mode and continue waiting for data, 1626.

The smart power modes 1607, 1631, 1627, 1635, 1622, 1618 are denoted by a routed block, while diamond blocks such as 1633, for example, are decision tools.

A function of the ISR software logic flow 1600 in some embodiments is to detect incompatible modes of the MM radios, such that an operation that would otherwise produce unacceptable co-site interference (e.g., two radios operating in the same band, on the same frequency) is precluded. The operator of the ISR would be informed via visual, audio, or haptic cues of the incompatible operation requested, avoiding the implementation of conflicting or harmful commands. This is in contrast to hardware lockouts found in conventional systems.

Additional applications of this unique "lockout" or "dynamic reconfiguration" logic flow include prevention of incompatible settings from occurring in situations such as personal computer (PC) set-up, configuration, and re-configuration. Inexperienced users of PCs often (re)configure their PC systems' firmware (e.g., basic input/output system (BIOS)) and or operating system (OS) software with conflicting parameter values or other such changeable settings. In such an application, users would be either prevented from making harmful changes, or have poor choices flagged for reconsideration. Alternatively, the logic flow algorithm of the present invention could automatically configure minutiae in an optimal way after the user has made a few high-level choices.

In the application software domain, programs such as computer aided design and drafting (CADD) software enhanced by the logic flow algorithm of the present invention could automatically prevent design errors that inhibit manufacturability, such as flagging aspects/features of physical parts that cannot be fabricated using a specific manufacturing technique (e.g., flagging cuts that cannot be made using a particular computer numeric control (CNC) machine or preventing the inclusion of undercuts that would preclude a part from being injection molded).

When developing software, the logic flow algorithm of the present invention could assist the programmer by identifying incompatible software modules or libraries before valuable time is lost writing code that is destined to fail. Alternatively, it could be used to implement a decision tree that would guide the programmer into selecting the most appropriate set of compatible modules/libraries from the available choices.

In some embodiments, components of the system can be configured to utilize a novel Fail Safe Interlock (FSI) subsystem. This can provide RF Safety features for implementations of the systems described herein. Such a system can be applicable to, for example, a Programmable Snap-Connector-based Power Manager (PSCPM), other Power Manager subsystem, or other data transfer devices. An example embodiment of the FSI system includes a set of small embedded, Electrically Erasable Programmable Read Only Memory (EEPROM) devices embedded in each externally connected cable, and embedded microcontroller (μC) code in the Power Manager (PM). The microcontroller code can be configured to verify proper attachment of approved devices and to control the application of power to all externally connected ports. This feature of the FSI protects the operator from a shock hazard and is intrinsically safe in an explosive atmosphere as it will not allow power to be applied to an exposed output port. Both the EEPROM and μC, as well as other electronic components, cables, etc., can be implemented using conventional devices program to perform the functions described herein.

The FSI methods and systems can be configured to further protect the system from both intentional and unintentional operator abuse, as well as provide grounding for automatic operator safety. For instance, in prior art power managers/distributors, short circuiting (bridging) of exposed power output terminals could easily lead to arcing (which could trigger an explosion if said arcing occurs in the presence of an explosive atmosphere), overheating, fire, and/or undesired battery drain. All of these situations can be avoided when exercising FSI embodiments of the power manager of the technology disclosed herein.

In various embodiments, an FSI EEPROM can be provided in each of the external cables, and can be configured to store the description of a connected device. Each approved device can be coded with a unique identifier describing the device-radio, camera, GPS receiver, etc. this can be encoded in the FSI EEPROM along with its (acceptable) power (e.g., voltage and current), requirements.

Figure 14:
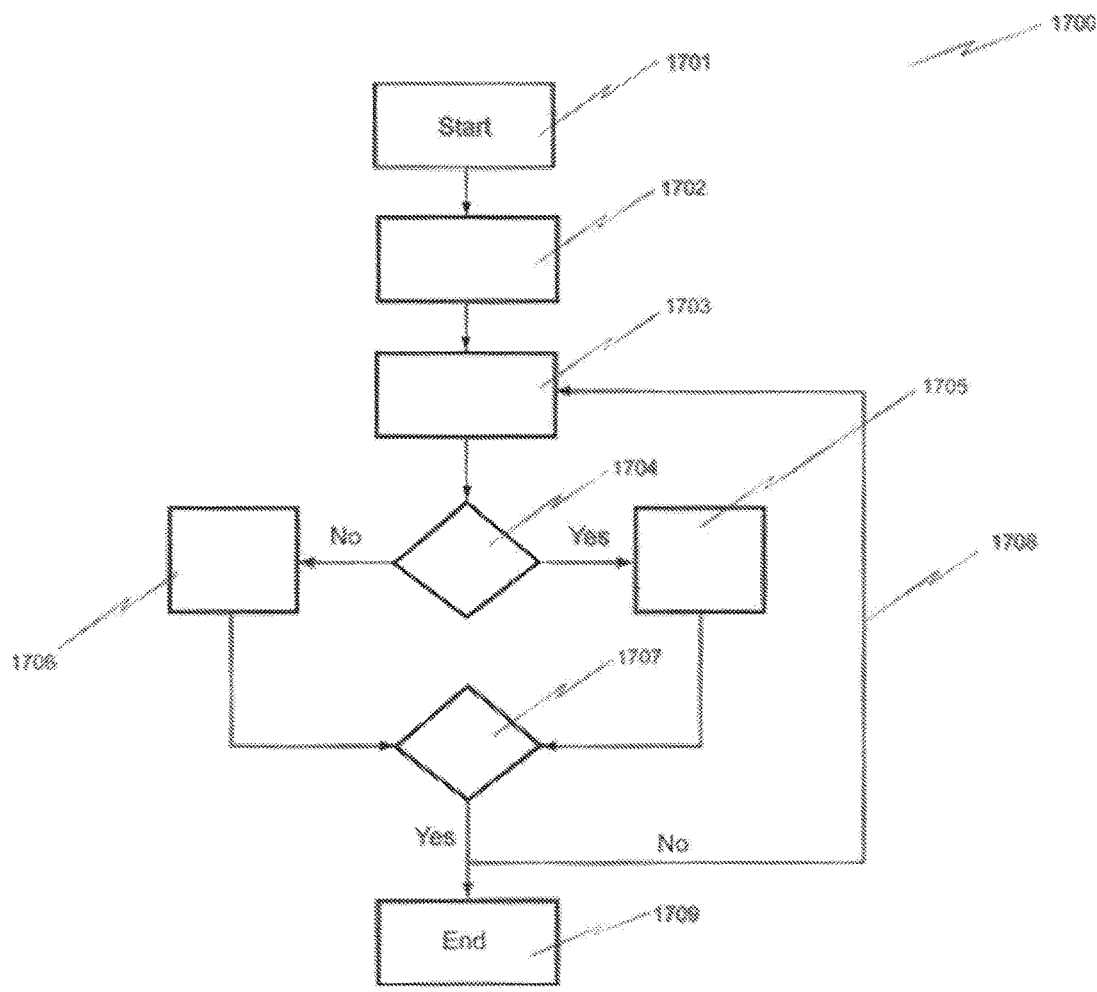
FIG. 14 is a diagram illustrating an example process for implementing a fail-safe interlock in accordance with one embodiment of the systems and methods described herein.

FIG. 14 is a diagram illustrating an example process for implementing a fail safe interlock in accordance with one embodiment of the systems and methods described herein.

In the example illustrated in FIG. 14, the FSI Logic Flow Chart 1700 includes a new type of Built-In-Self-Test (BIST) with all output ports OFF command. The default startup condition of this new BIST 1701 forces all output ports OFF 1702.

The FSI μC, as part of the BIST startup 1701 polls the status of each output port, such as via a read n-port command 1703, for example. If a valid ID command provides identification (ID) of valid EEPROM 1704, its contents are read into the storage array for comparison against a list of appropriate devices. If the attachment is shown to be a recognized device 1704, the μC assigns the appropriate voltage and current settings to that port and flags it as safe 1705, indicating that it can be powered on when needed. This can be done, for example, by storing the information in SAFE Port Storage. If a valid connection is not detected on a given port 1704, that port is flagged as UNSAFE 1706. This identifies the port as an Unsafe Port, and this information is recorded in UNSAFE PORT storage. In various embodiments, a port flagged as an unsafe port cannot be powered on by other firmware routines until its state has changed to safe. This sequence may be repeated for each port in the system 1708 until a complete map of connected (safe), and unconnected (potentially unsafe) ports is created 1709. This map may be stored in μC memory. This sequence can be performed by a query command 1707, which determines whether all of the ports have been tested. If the answer is YES, then the BIST process ends 1709. If NO, then query command 1707 requests further ports to be tested through connection 1708. When complete, the test operation ends at 1709.

Additionally, Information Assurance (IA) functionality may be gained due to the fact that unauthorized device attachment is disallowed in some embodiments. Such unauthorized devices could range from a data probe/extractor installed on the network of the present invention by hostile/enemy forces to COTS mobile telephones or portable music players (PMPs) attached by friendly forces to charge their internal batteries. In any case, such attachment should be avoided due to the possibility of data loss/compromise/corruption. FSI functionality can be configured to effectively prohibit this—as said unauthorized devices will not have a recognized embedded ID encoded that triggers the delivery of electric current to the port to which they are attempting attachment.

In addition to the above uses, the Fail Safe Interlock aspect of the disclosed technology can be applied to the mass consumer market; for example, shock-proof alternating current outlets for child safety could be developed by introducing the FSI CONOPS into standard electrical outlets in the home. The end effect would be that no harmful voltage potential would be present until an electrical appliance is attached to said outlet, thereby removing the potential for injury from unused/unoccupied electrical outlets. Also, all-electric vehicles often utilize dangerously high voltages (as opposed to the low voltage electrical systems present in legacy vehicles with internal combustion engines). Although safety in an integral part of all-electric vehicle design—as is case with household electrical system design—the potential for injuries (including fatal ones) due to electric shock still exists, particularly within in the battery charging subsystem; implementation of the FSI in this environment could prevent harm to people attempting to charge their electric cars improperly under certain circumstances.

The FSI technology could also be applied to access control, wherein attachment of an access control device to a user's wearable electronic system could be used to authenticate an individual (or serve as one authentication factor in a multi-factor authentication system), restricting power, for instance to an electronic lock or other electrical actuator that allows access to a secure/restricted area.

One aspect of the technology disclosed herein involves the introduction of a radio frequency (RF) spectrum analyzer for the purpose of reducing or eliminating co-site interference between radio modules. This may be accomplished in various embodiments by monitoring the host's RF output via an antenna for normal, spurious or undesired signals in real-time, and modifying the behavior of the RF modules in the mission module accordingly. Since spurious and other undesired signals can cause interference to transmitting units, the ability to detect these transmissions and modify the behavior of the radio units in the mission module to "work around" these signals provides superiority over the present state of art by allowing for autonomous action that can mitigate co-site interference in an uncooperative environment (e.g., when there is no cooperation between the host and the mission module).

For example, in some embodiments a mission module configured with an RF analysis unit attached to any host radio in a purely mechanical fashion (i.e., without having to facilitate command and control or promote other signaling communication between the mission module and the host radio) allows unfettered operation of the mission module by monitoring undesired RF energy from the host radio and adapting to avoid frequency conflict(s).

In various embodiments, the mission modules' RF monitoring capability can also be used to monitor the host radio transmissions that are not spurious—that is to say, "normal" transmission(s) and afford the mission module with automatic selection of compatible transmission frequencies without requiring communications coordination with the host radio.

Conventional systems use a detailed communications scheme for multiple radio communications. That necessitates either a great deal of configuration (usually manual) or an upfront customized design in order to make it compatible with the host radio. In contrast to these conventional systems, the embodiments of the technology disclosed herein can be configured to provide for an ad hoc attachment of a mission module to a host radio without any customized design or configuration. The mission module can be configured to provide automatic configuration functionality. Accordingly, embodiments can be configured to use an adaptive mission module that can be attached to any radio using only mechanical fastening (and, optionally, power connections) without the unwanted consequence of co-site interference or inability to operate because of incompatible frequencies that would exist if two (or more) state-of-the-art RF units were to be so affixed to one another.

Such an adaptive mission module could be used, for example, to add cellular telephone capability to a satellite telephone without the need to take any manual or human activated configuration, or set up steps in order to mitigate co-site interference, as this may be done automatically via the mission module's RF analysis subsystem. This novel subsystem, essentially a miniature RF spectrum analyzer, for the purpose of dynamic adaptation of the mission module to work in harmony with the host radio without any prior design knowledge or operation knowledge of the post radio a priori before attaching the mission module.

The mission module's the RF spectrum analyzer is connected to a microprocessor or microcontroller that can be configured to analyze the output from the spectrum analyzer (this output includes a list of frequencies generated by, for example, Fast Fourier Transform (FFT) in near real time) that are being emitted by the host module's antenna(s) and received on the spectrum analyzer's antenna(s). This data may be used to dynamically reconfigure the radio or radios in the mission module, such that the radio(s) in the mission module automatically adapt to the output of the host module radio whether it is spurious emission or normal emission that is desired to be to be worked around. This allows the mission module to work in "virtual cooperation" (VC) with the host radio without having an expressed command-and-control link between the host and the mission module.

An advanced functionality that can be included with embodiments of this "undesired radio frequency emission compensation module" (URFECM) stores the data used for correction in near real time for later use. This can be accomplished by creating libraries for both known and heretofore unknown signal patterns such that the mitigation procedures for resolving exceptions caused by such signals can be recalled rapidly (generally, at least more rapidly than undertaking the analysis from scratch each time). This can be used to reduce the time to exception resolution when said signal patterns are encountered by the mission module in the future. Furthermore, said libraries can be analyzed, off-line, if necessary, so as to introduce (quasi-)heuristic learning functionality to the mission module's capability. Such a learning capacity can be used to extend the mission module's capability to rapidly respond to the presence of undesired RF signaling.

Alternatively—or in conjunction with the foregoing analysis—through the learning functionality gained by analysis of acquired RF signals, an end-to-end feedback system can be established between the mission module's URFECM and the remote target of the mission module's RF communications (i.e., remote transceiver). Such a remote transceiver may be, for example, another mission module as described herein, or a commercial off-the-shelf (COTS)/ modified commercial off-the-shelf (MCOTS) transceiver. An error detection scheme designed specifically to determine if the originating URFECM is, indeed, improving communications throughput/quality can be utilized to provide feedback to the originating URFECM in order to fine-tune its operation. This is a useful functionality, particularly in the rare case where automatic compensation has actually degraded communications—a situation that can occur when attempting to compensate for the presence of heretofore unknown undesired RF signaling. Once this feedback loop has allowed, iteratively, a best-case solution to be established, said best-case solution to the exception(s) caused by said undesired RF signaling, said solution will be stored for future recall (and implementation), as described in the basic URFECM operation, as found above.

Embodiments of the systems and methods disclosed herein can further include various novel connector topologies. A few examples of alternative connector topologies are now described.

Some embodiments include a Planar Electro-Mechanical (PEM) connector that can be configured to have a connector planar topology, which, in spite of having less surface area than conventional high-power USB connectors, results in a lower temperature increase from electrical heating. In other words, despite having a smaller surface area to dissipate heat compared to conventional connectors, the PEM connector displays unexpected results in terms of thermal behavior by staying cooler. Additionally, the PEM connector can be configured to include beneficial electromagnetic (EM) characteristics, such as a reduction in voltage cross-talk (i.e., interference), for example, between adjacent or neighboring connector pins as compared to conventional USB connectors.

For purposes of this disclosure, aspects of thermal management that can be accomplished with embodiments of the PEM connectors are first disclosed. Following that is a discussion of advantages that can be attained in the management of electromagnetic energy and various example configurations. It is noted that embodiments of the new PEM planar topology can be more accomodative to heat dissipation as compared to conventional connector topologies. However, as far as the electromagnetic characteristics are concerned, the magnitude of the voltage drop across a pin carrying an electrical current is determined by the electrical resistance of the pin. This actually facilitates an analogy to the thermal case, in which the magnitude of the heat source power is also affected by the electrical resistance. This enables a symmetry between the two analyses, in which for both, the thermal and EM cases, a reduction in electrical resistance is beneficial.

Figure 15A:
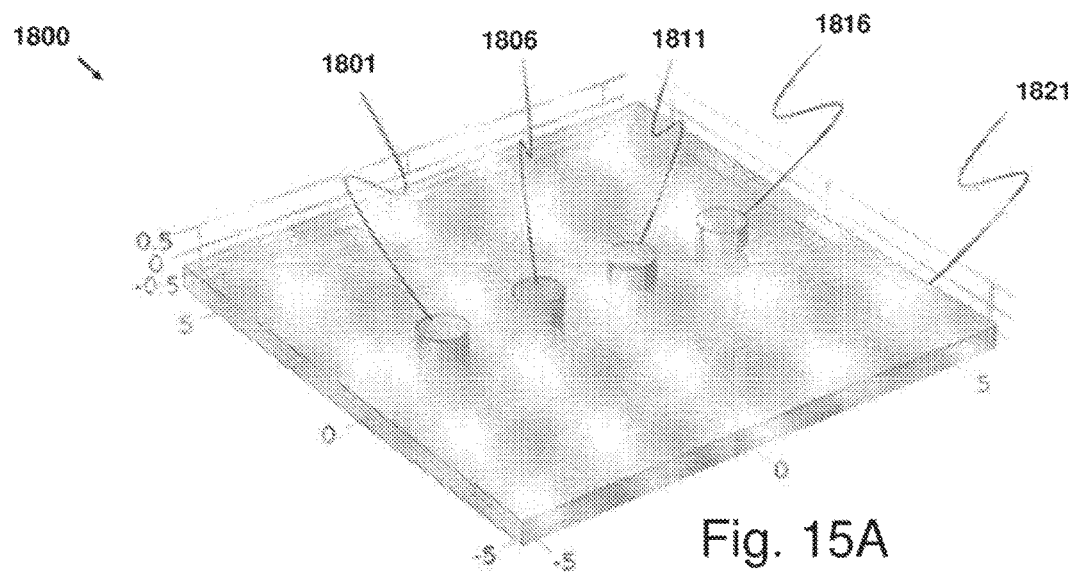
FIG. 15A is a diagram illustrating an example of a finite element analysis model of a PEM connector and a conventional connector.
Figure 15B:
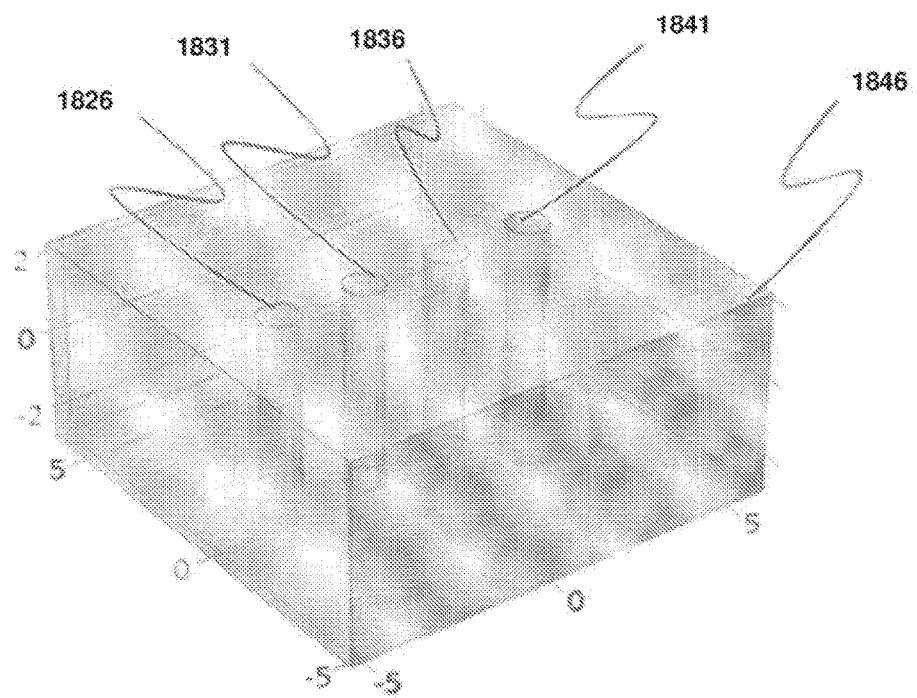
FIG. 15B is a diagram illustrating an example of a finite element analysis model of a PEM connector and a conventional connector.

FIGS. 15A and 15B is a diagram illustrating an example of a finite element analysis model of a PEM connector and a conventional connector. The PEM geometry has a natural tendency to be more accommodative to heat dissipation. This thermal behavior is exemplified using a Finite Element Analysis (FEA) software model of the PEM connector and a typical conventional connector, respectively, with dimensions given in mm. Each connector pin 1801, 1806, 1811, 1816 is held in place in substrate 1821. Each conventional connector pin 1826, 1831, 1836, 1841, is held in place with substrate 1846.

In a preferred embodiment of the PEM connector, a heat source with power P, described by Eq. (2), results when 11.25 amperes of electrical current I is passed through each pin, with electrical resistance R for each pin.

$$P = I^2 R \tag{2}$$

The electrical resistance of each pin is described with Eq. (3), where ρ is pin material resistivity, L is pin length, and A is pin cross-sectional area.

$$R = \frac{\rho L}{A} \tag{3}$$

Heat dissipation from the connector to the ambient environment occurs from the entire outer surface area of each connector via radiation and convection. A fair comparison is achieved between the performance of the PEM connector and conventional USB type A connectors because the same electrical current I is passed through each of the pins of each connector, where the cross-sectional area A of the pins are kept constant, and material resistivity ρ is kept constant. The FEA software (such as COMSOL Multiphysics 5.1 Heat Transfer in Solids) model (see FIGS. 15A and 15B) input parameters are shown in Table 3. For the sake of clarity, callouts from FIGS. 15A and 15B are included.

TABLE 3

Model input parameters

| Input Parameters | Input |
| --- | --- |
| 1801, 1806, 1811, 1816, 1826, 1831, 1836, 1841 physical material | Copper |
| 1821, 1846 physical material | FR4 - fiber glass material used for printed circuit boards (PCBs) |
| Emissivity of entire outer surface of connectors | 0.95 (representative value for a dark outer surface) |
| Heat transfer coefficient between outer surface and ambient environment | 5 W/m$^2$K (typical value for natural convection in still air) |
| Ambient temperature of environment containing connectors | 20° C. (typical room temperature) |
| Power (P) for pins of the PEM connector | 2.7 mW per pin (from Eq. (2)) |
| Power (P) for prior art pins | 13.5 mW per pin (from Eq. (2)) |

Figure 16:
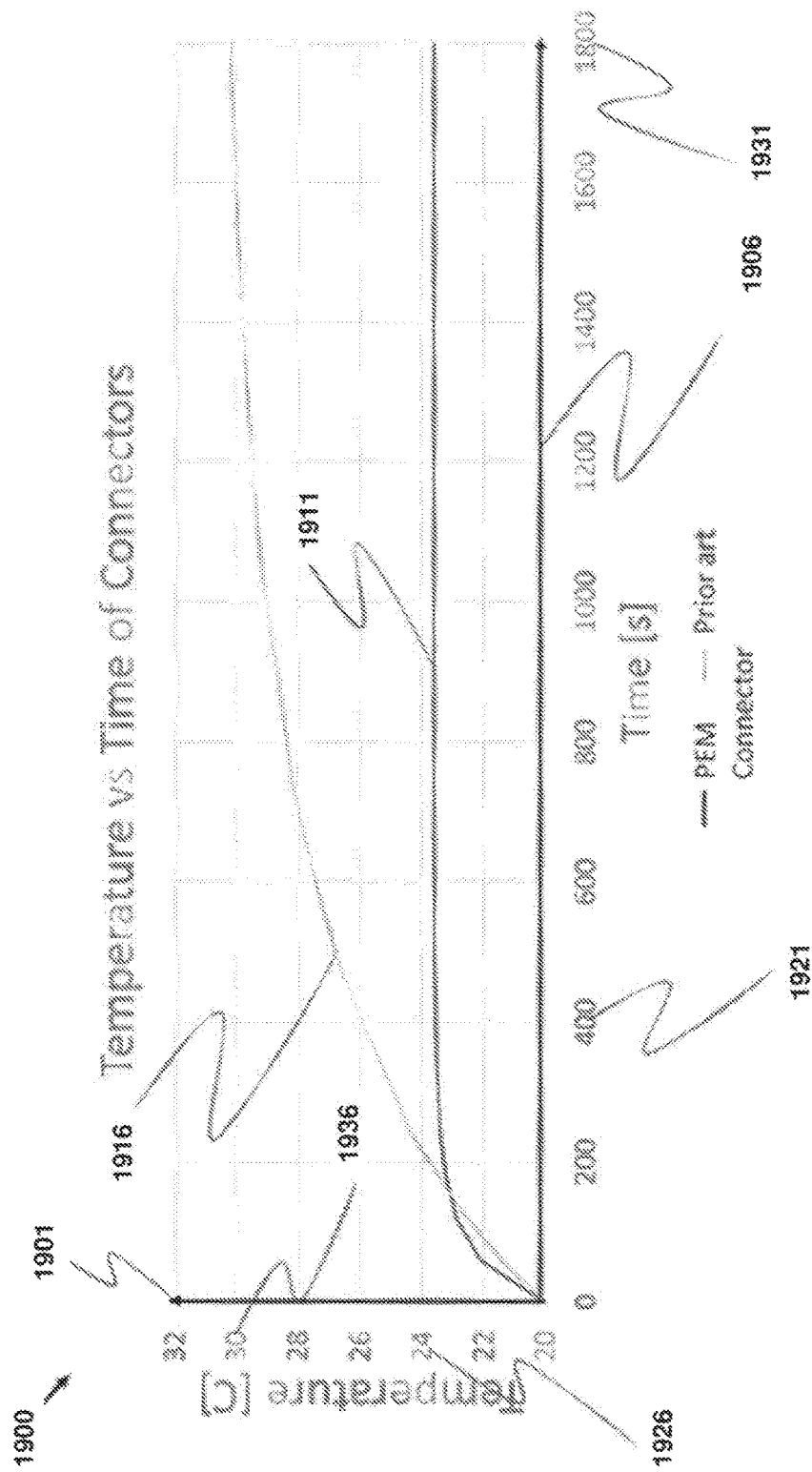
FIG. 16 illustrates a time variation of average connector outside surface temperature for the PEM connector and conventional connector, showing that the PEM connector is cooler by ~6° C. as compared to the conventional connector.

FIG. 16 illustrates a time variation of average connector outside surface temperature for the PEM connector and prior art connector. Referring to FIG. 16, the temperature axis 1901 and time axis 1906 allow illustration of the time variation of the average connector outside surface temperature for the PEM connector 1911, and prior art connector 1916. The PEM connector reaches steady state operation at ~400 seconds 1921, with a steady state temperature of ~24° C. 1926. The conventional connector reaches steady state at a later time of ~1800 seconds 1931, with a higher temperature of ~30° C. 1936. This shows that the PEM connector is cooler by ~6° C. as compared to the conventional connector.

Figure 17:
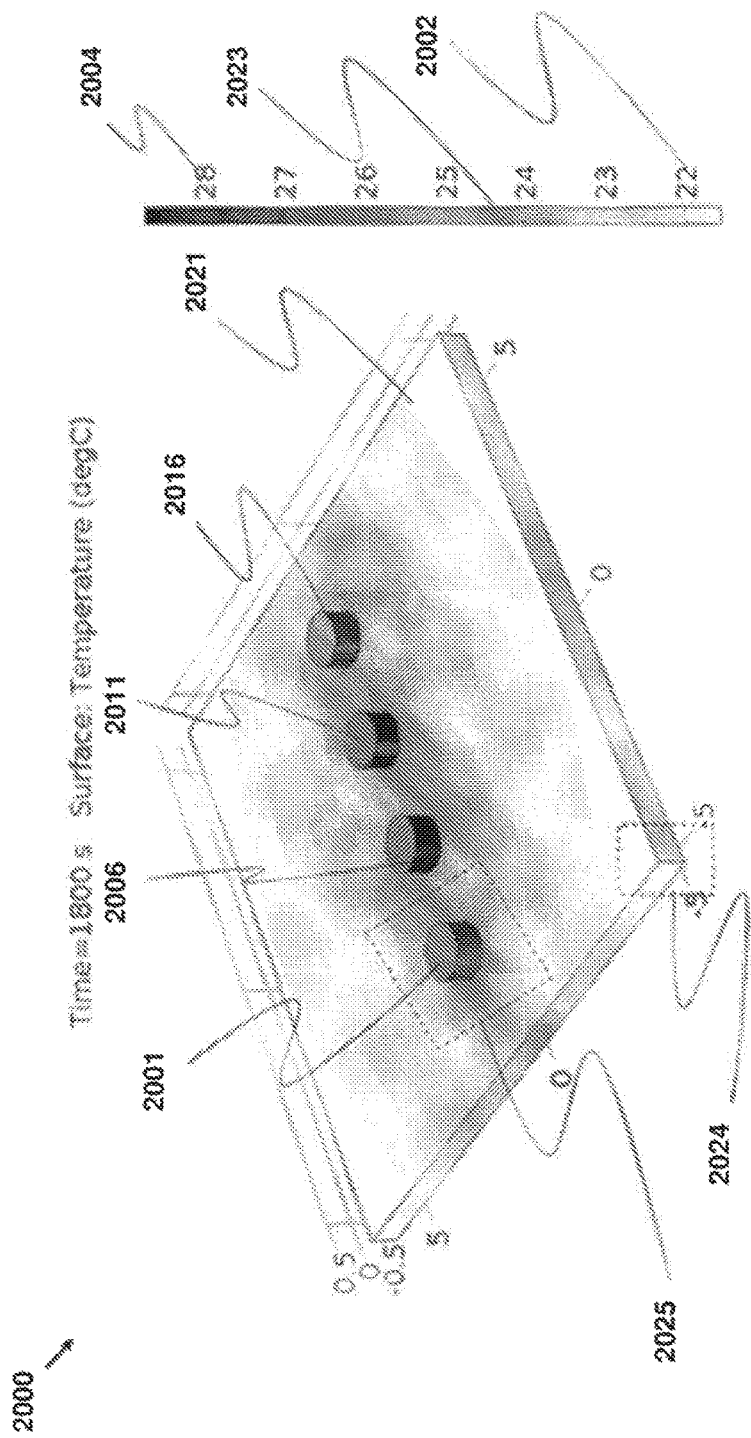
FIG. 17 is a diagram illustrating an example of an outer surface temperature of the PEM connector at 1800 seconds.
Figure 18:
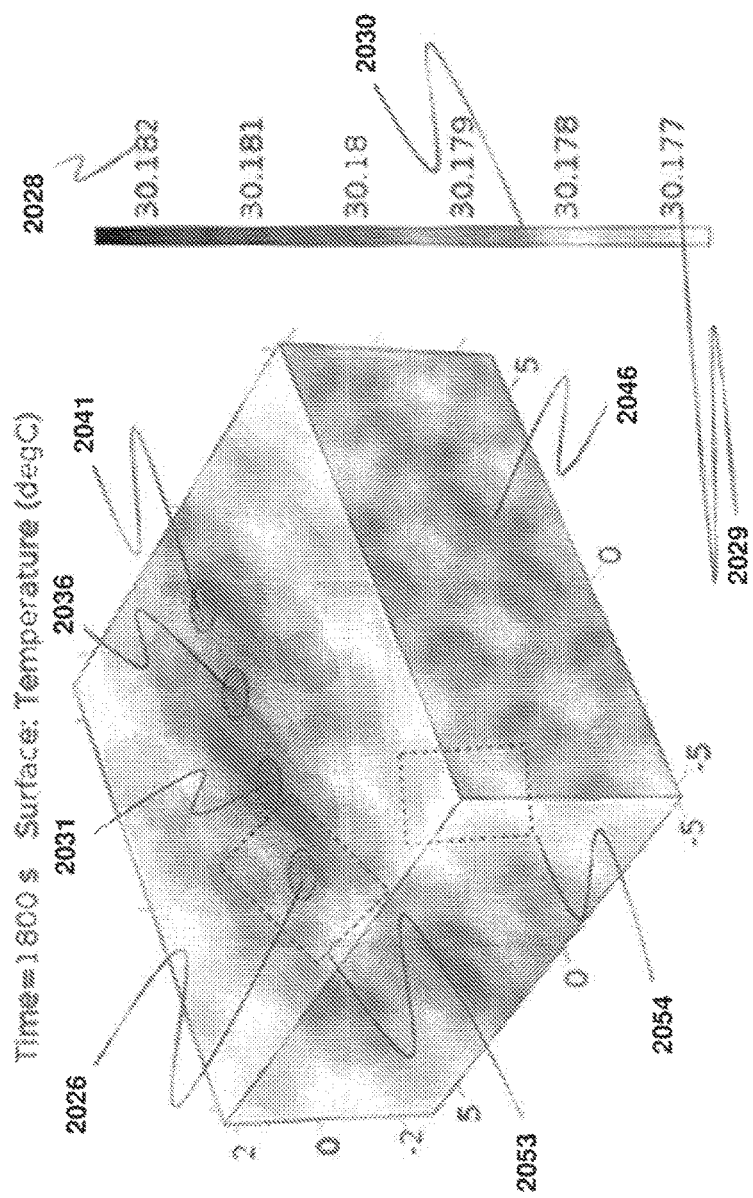
FIG. 18 is a diagram illustrating an example of an outer surface temperature of a conventional connector at 1800 seconds.

FIG. 17 is a diagram illustrating outer surface temperature of the (top) PEM connector at 1800 seconds. FIG. 18 is a diagram illustrating outer surface temperature of a conventional connector at 1800 seconds, illustrating a ~6° C. cooler PEM connector compared to the conventional connector.

FIG. 17 illustrates the outer surface temperature of the PEM connector at 1800 seconds, using the temperature scale 2023, set between the minimum PEM connector temperature of ~22° C. 2002 and maximum PEM connector temperature of 28° C. 2004. The example PEM connector illustrated in this figure includes pins 2001, 2006, 2011, 2016 in substrate 2021. As the example illustrates, the higher temperatures occur in regions near the pin heat sources, for example region 2025, and the lower temperatures occur in regions farther from the heat sources, for example region 2024. The illustration on FIG. 18 shows the outer surface temperature of the conventional connector at 1800 seconds, using the temperature scale 2030 set between the minimum temperature 2029 and maximum temperature 2028. FIG. 18 also shows the prior art connector that is comprised of pins 2026, 2031, 2036, 2041, in substrate 2046. The higher temperatures occur in regions near the pin heat sources, for example region 2053, and the lower temperatures occur in regions further from the heat sources, for example region 2054.

Figure 19:
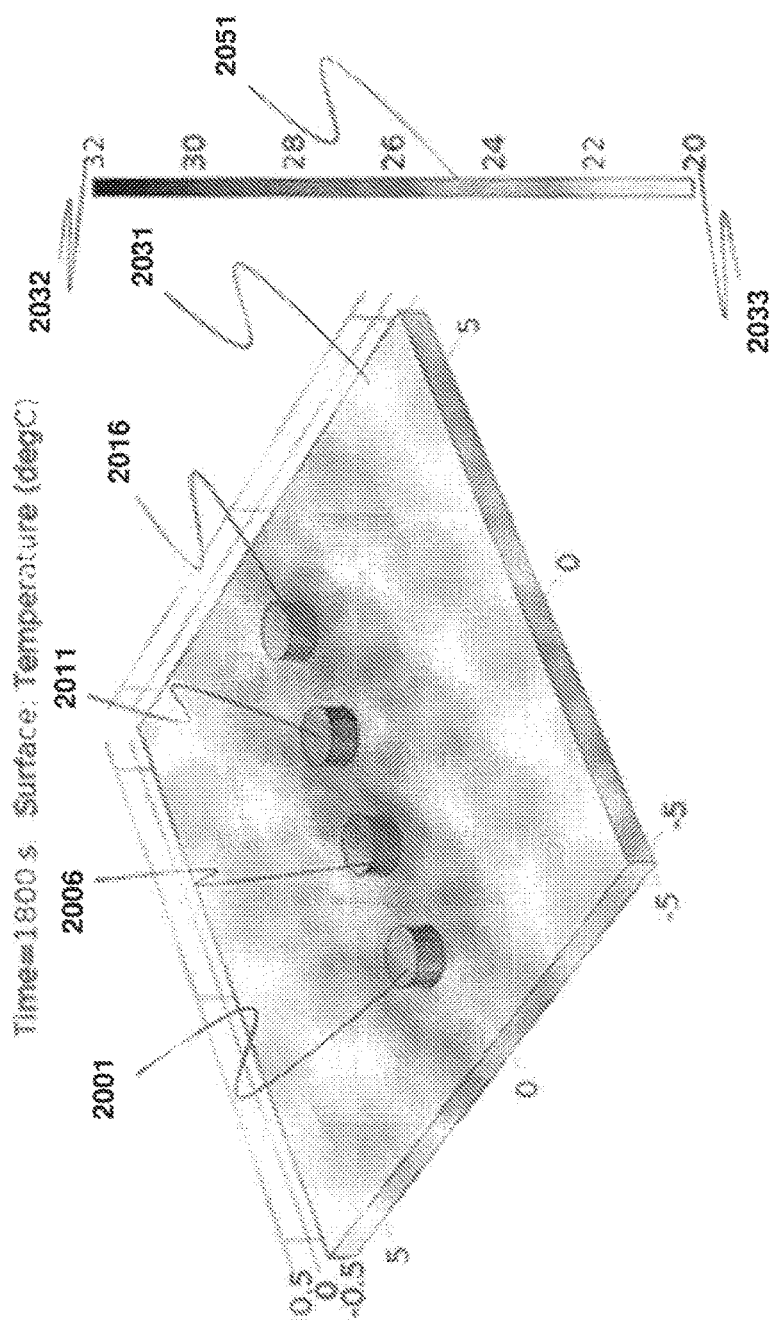
FIG. 19 is a diagram illustrating an example of an outer surface temperature of a PEM connector at 1800 seconds.
Figure 20:
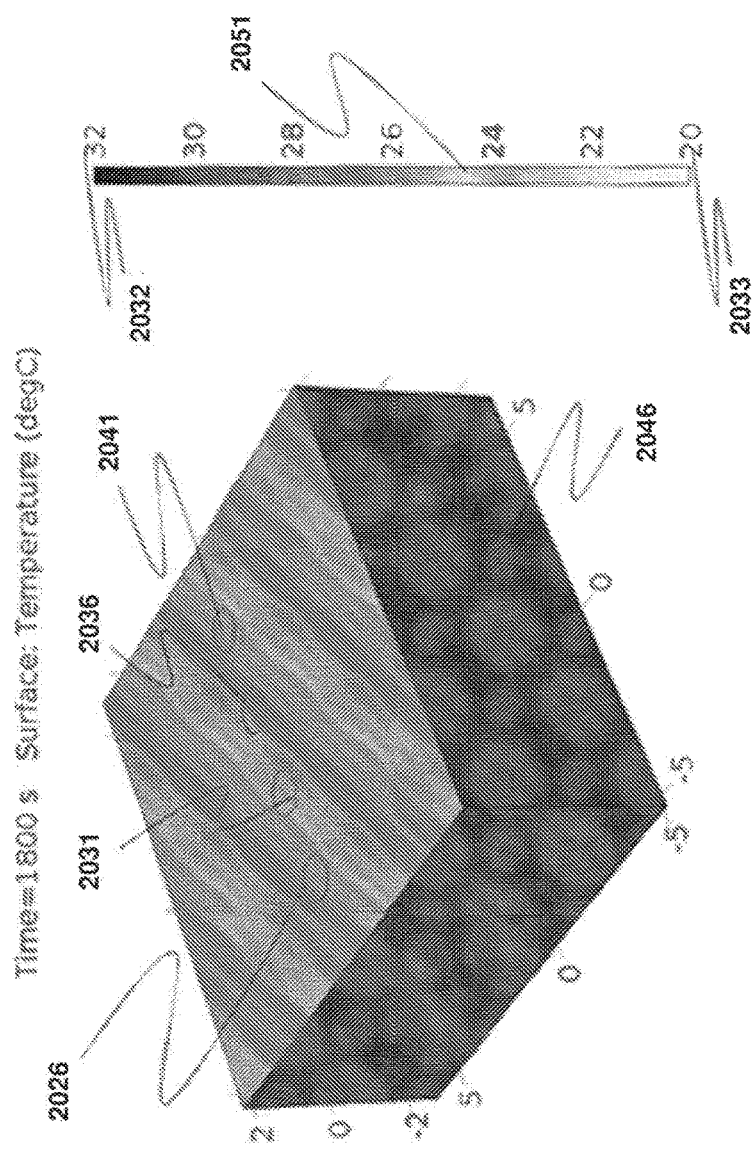
FIG. 20 is a diagram illustrating an example of an outer surface temperature of a conventional connector at 1800 seconds.
Figure 21:
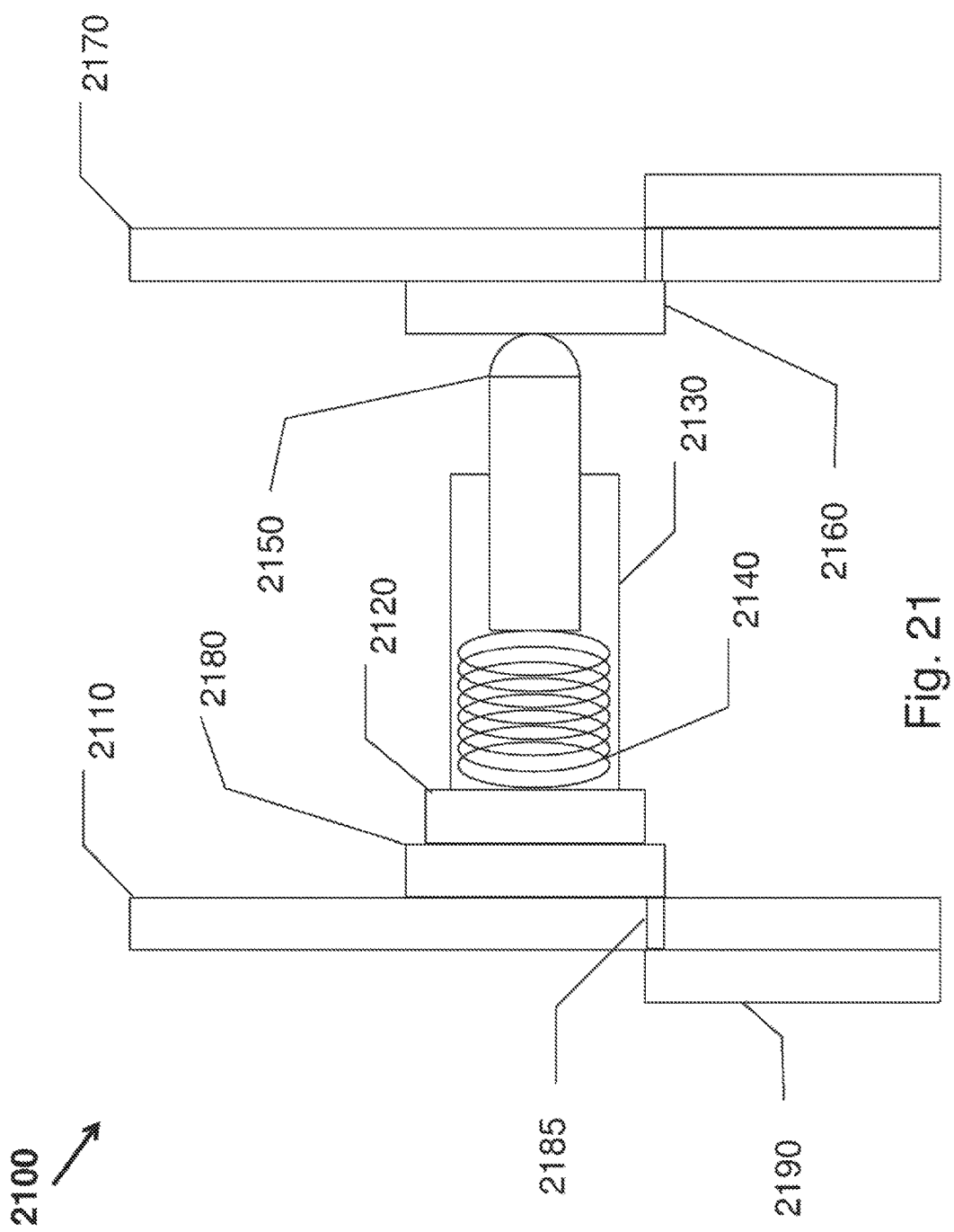
FIGS. 21 and 22 are diagrams illustrating an example of an individual contact pin within the PEM connector with the Connector halves mated (FIG. 21); and the connector halves unmated (FIG. 22).
Figure 22:
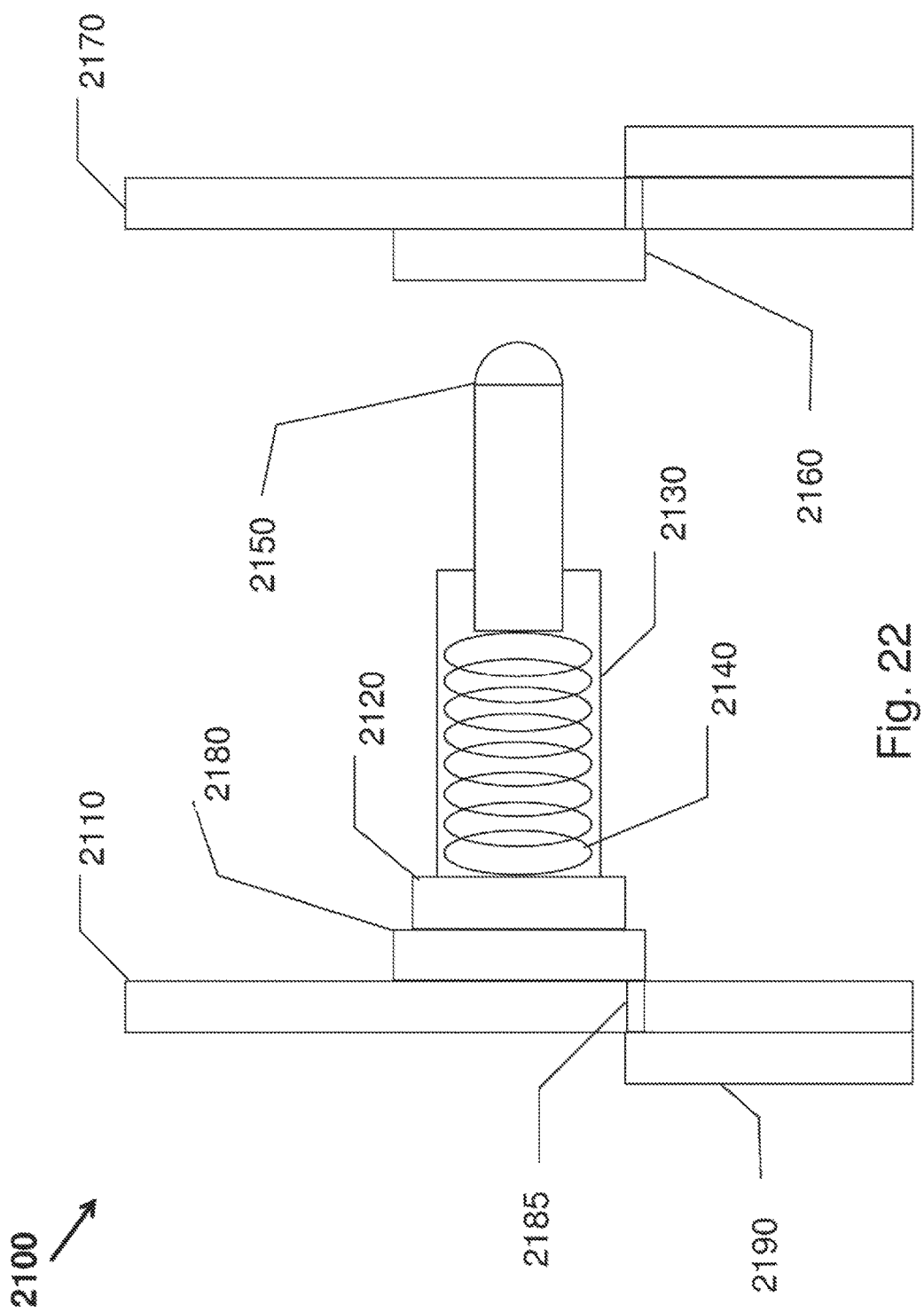

To help appreciate the difference in temperature rise exhibited by the PEM connector versus the conventional connector, and to aid in comparison, the temperature profile of both connectors at 1800 seconds is displayed using the same temperature scale 2051 as shown in FIGS. 19 and 20. In this depiction, the temperature scale is set between the same minimum temperature, chosen as the ambient temperature of 20° C. 2033, and maximum temperature 32° C. 2032. These temperatures 2033 and 2032 are set so that the minimum and maximum temperatures of the PEM connector and prior art connectors 2002, 2004, 2029, 2028 are contained on the scale 2051. The results show that the average outer surface temperature of the PEM connector is lower than the conventional connector by ~6° C., even though the PEM connector has a much smaller outer surface area, for example only ~59% of the conventional connector outer surface area. Embodiments achieve this temperature reduction, in part, by reducing electrical heating, as depicted in FIGS. 21 and 22 (discussed below). Also, the arrangement is in planar geometry, which is a new design. This compact design, which has less surface area than conventional high power USB connectors, results in less electrical heating. So, despite having smaller surface area, compared to prior art, from which to dissipate heat, the PEM connector exhibits a lower temperature rise for a given amount of electrical current flow.

FIGS. 21 and 22 illustrate an example of an individual contact pin within the PEM connector with the Connector halves mated (FIG. 21); and the connector halves unmated (FIG. 22). Within the spring loaded pin arrangement shown in FIG. 21 2100 of the PEM connector (which is analogous to any one of the pins (1801, 1806, 1811, 1816) in model 1800 of FIG. 15A, and any one of the pins (2001, 2006, 2011, 2016) in the simulation plot 2000 of FIGS. 17-20, the overall length of the male contact pin comprising the pin base 2120, pin shaft 2130, compression spring 2140, and spring-loaded pin 2150, mounted upon the conductive pad 2180 (on male-side printed circuit board (PCB), 2110) is variable and depends upon the pressure applied to the spring-loaded pin tip 2150, by the conductive pad 2160 (on female-side printed circuit board 2170). This results in a shortened electrically conductive path length (L in Eq. (3)) from the pin base 2120 to the tip of spring-loaded pin 2150, when the male and female connector halves are mated—leading to reduced electrical resistance (R in Eq. (3)), with A and ρ remaining constant, and reduced electrical heating (P in Eq. (2)). The electrical current (I in Eq. (2)) passed through the pin arrangement is sourced from the conductive via, 2185, which connects the pin pad 2180 and input trace line 2190. The current exits via conductive pad (on Female PCB) 2160. When not mated (i.e., the tip of spring-loaded pin 2150 and conductive pad (on Female PCB) 2160 are not touching one another), the spring-loaded pin tip 2150 is pushed out to its maximum extension by the force applied from compression spring 2140 effectively lengthening the conductive path from the pin base 2120 to the tip of spring-loaded pin 2150.

In the EM case, the PEM geometry in the illustrated example and similar embodiments has a natural tendency to reduce voltage cross-talk between connector pins as compared to conventional connectors. This is because voltage drops across the length of the current-carrying pin are reduced compared to prior art, for a given current, which reduces the voltage felt at neighboring pins. In particular, for the same pin current excitation, the magnitude of voltage interference experienced by adjacent pins, is less in the PEM connector compared to conventional connectors. This crosstalk is exemplified using a Finite Element Analysis (FEA) software model of the PEM connector and a typical prior art connector, shown in FIGS. 15A and 15B, with dimensions given in mm. Each connector pin 1801, 1806, 1811, 1816 is held in place in substrate 1821. Each prior art connector pin 1826, 1831, 1836, 1841 is held in place with substrate 1846.

In a preferred embodiment of the PEM connector, an electrical voltage drop, V in Eq. (4), results when a given amount of electrical current I (e.g. 1 ampere) is passed through pin 1801 in the PEM connector, or 1826 in the conventional connector. Without any particular attention to impedance matching, necessary when considering time varying currents, we obtain quite satisfactory results, demonstrating the reduction of voltage cross-talk in the PEM connector as compared to the prior art, and extrapolate from these results to higher speed applications, as decreasing electrical resistance in either case is better.

$$V=IR \quad (4)$$

The electrical resistance R of each pin is described with Eq. (3), where ρ is pin material resistivity, L is pin length, and A is pin cross-sectional area. A fair comparison is achieved between the performances of the PEM connector and conventional USB type A connectors, because the same electrical current is passed through each connector, the cross-sectional area A of the pins are kept constant, and material resistivity ρ is kept constant. The FEA software (such as COMSOL Multiphysics 5.1 Electric Currents) model (see FIGS. 15A and 15B) input parameters are shown in Table 4. For the sake of clarity, we add callouts from FIGS. 15A and 15B.

TABLE 4

Model input parameters

| Input Parameters | Input |
| --- | --- |
| 1801, 1806, 1811, 1816, 1826, 1831, 1836, 1841 physical material | Copper |
| 1821, 1846 physical material | FR4 - fiber glass material used for printed circuit boards (PCBs) |
| Current (I) into pin 1801 of the PEM connector | 1 amp |
| Electric potential on bottom of PEM pin 1801 | 0 volt - ground pin to facilitate current flow from the top of the pin to the bottom of the pin |
| Electric potential on bottom of PEM pin 1816 | 0 volt - ground pin |
| Current (I) into pin 1826 of the prior art connector | 1 amp |
| Electric potential on bottom of prior art pin 1826 | 0 volt - ground pin to facilitate current flow from the top of the pin to the bottom of the pin |
| Electric potential on bottom of prior art pin 1841 | 0 volt - ground pin |

Figure 23:
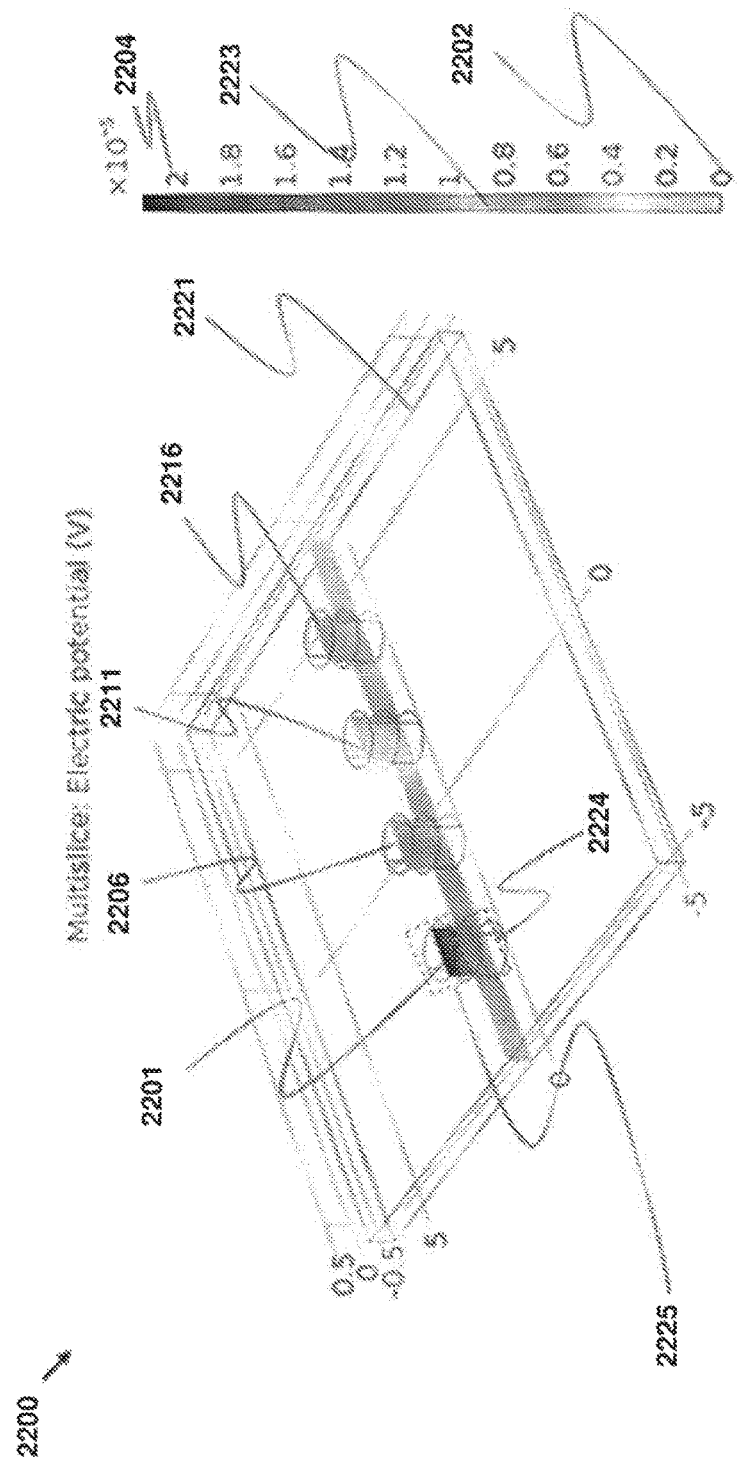
FIGS. 23 and 24 illustrate an example of the electric potential through the center of the PEM connector (FIG. 23) as compared to a conventional connector (FIG. 24).
Figure 24:
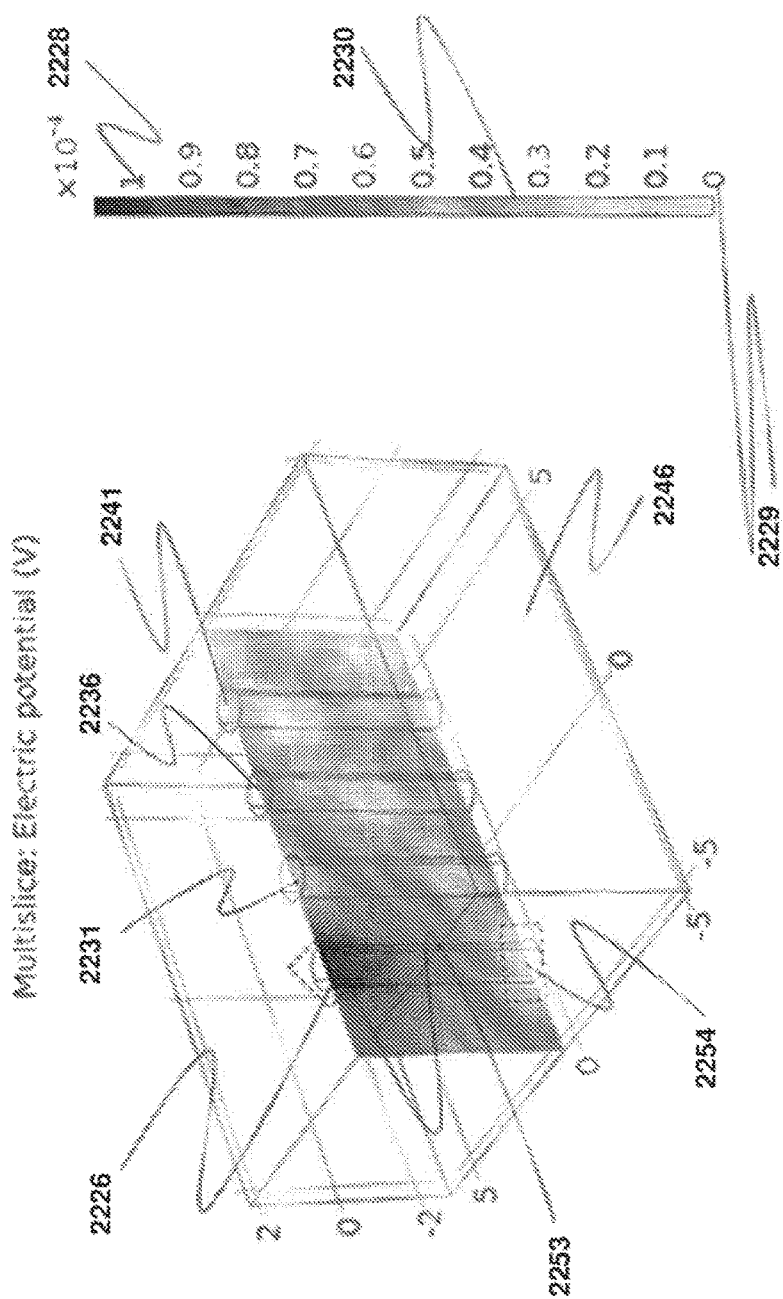
Figure 25:
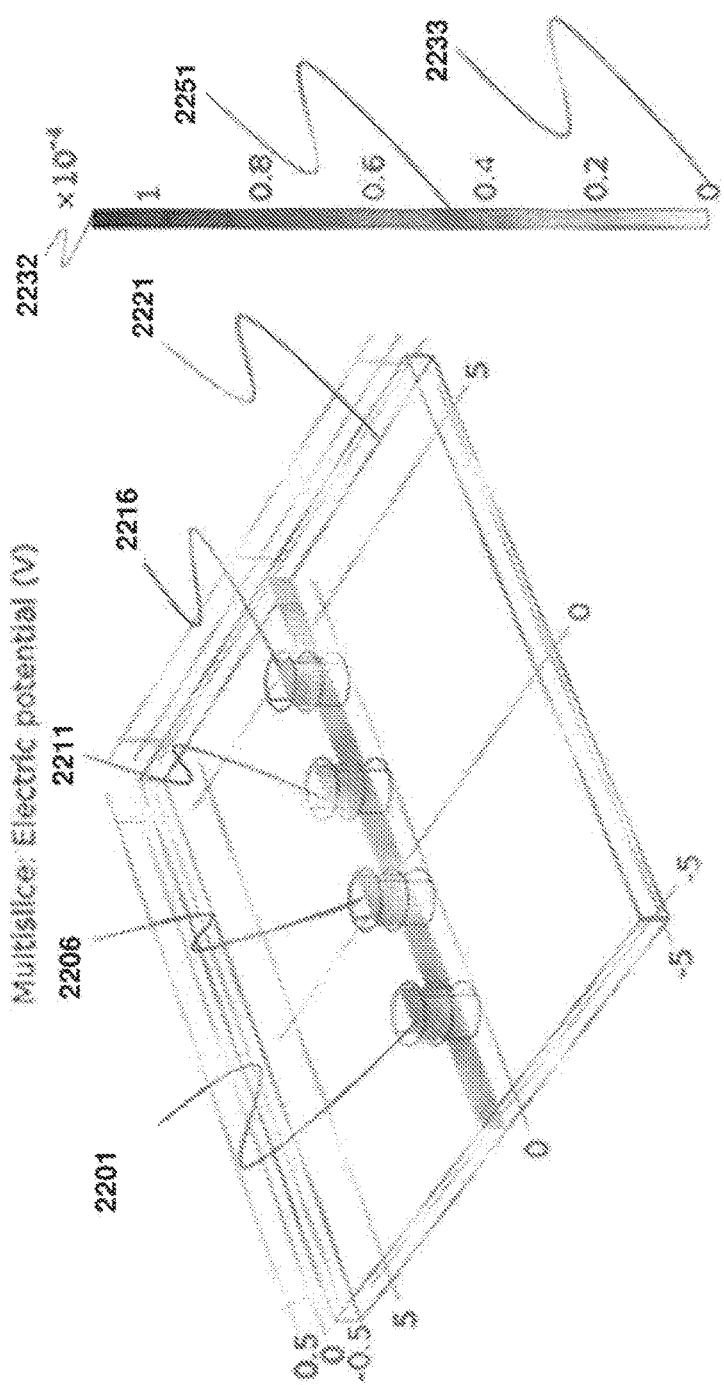
FIGS. 25 and 26 illustrate an example of the reduction in electrical potential interference/cross-talk in the PEM connector (FIG. 25) as compared to the conventional connector (FIG. 26), where the electric potential is displayed using the same scale.
Figure 26:
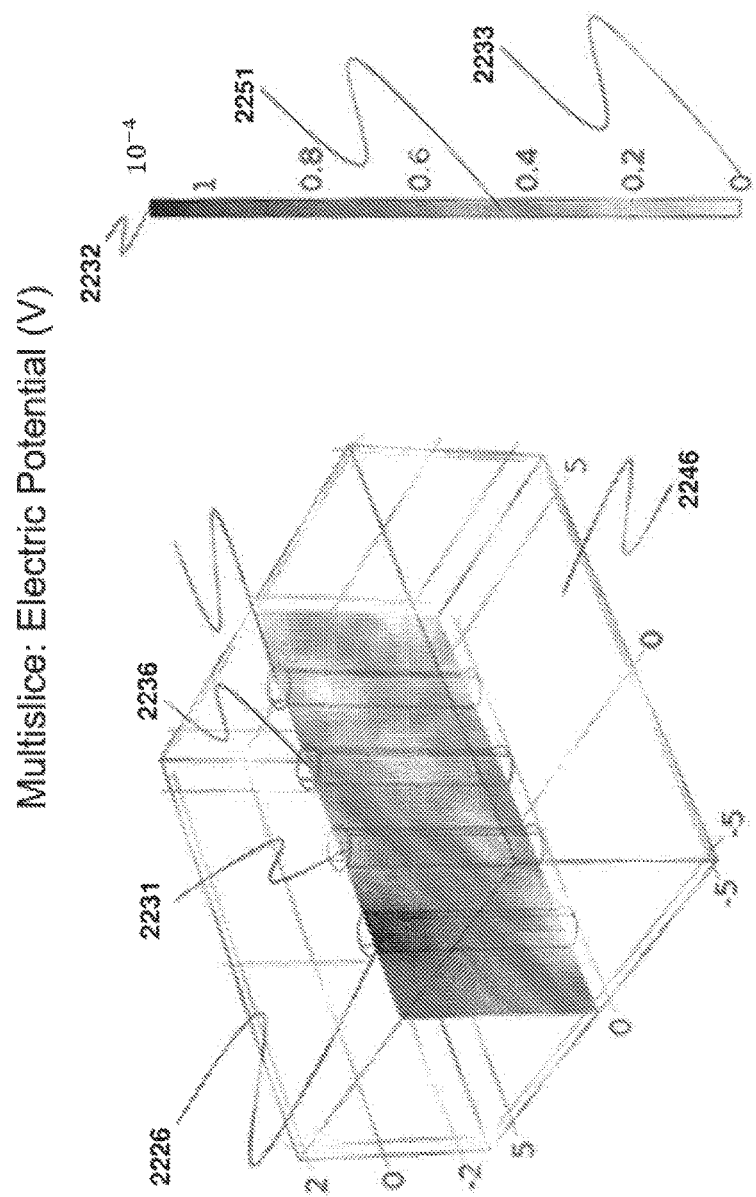

FIGS. 23 and 24 illustrate the electric potential through the center of the PEM connector as compared to a conventional connector. The illustration shows the electric potential through the center of the PEM connector (FIG. 23) as compared to the electric potential through the center of a conventional connector (FIG. 24), showing that the PEM connector reduces the electrical potential on the pin adjacent to the current carrying pin to ~3 microvolts, as compared to the conventional connector whose adjacent pin to the current-carrying pin shows an electric potential increase of 34 microvolts. To appreciate the reduction in electrical potential interference/cross-talk in the PEM connector (FIG. 25) compared to the conventional connector (FIG. 26), the electric potential is displayed using the same scale, which from which the lower potential in the PEM is immediately apparent.

More particularly, FIGS. 23 and 24 illustrate the potential using the electric potential scale 2223, set between the minimum PEM connector electric potential of 0 volt (due to grounding) 2202, and maximum PEM connector electrical potential of ~20 micro volt 2204. FIG. 23 also shows the PEM connector that is comprised of pins 2201, 2206, 2211, 2216 in substrate 2221, which are analogous to the pins and substrate of FIG. 15A. It is noted that the higher electrical potential occurs where electrical current enters the pin, for example region 2225, and the lowest electrical potential occurs in regions that are grounded, for example region 2224. FIG. 24 illustrates the electric potential through the center of the conventional connector, using the electric potential scale 2230 set between the minimum electric potential 2229, and maximum electric potential 2228. FIG. 24 also shows the conventional connector that is comprised of pins 2226, 2231, 2236, 2241, in substrate 2246. For the sake of explanation, the higher electric potential occurs in regions where electrical current enters the pin, for example region 2253, and the lowest electric potential occurs in regions that are grounded, for example region 2254.

To help appreciate the difference in electrical potential cross-talk exhibited by the PEM connector versus the conventional connector, and to aid in comparison, the electrical potential profile of both connectors is displayed using the same temperature scale 2251 set between the same minimum electrical potential of 0 volt 2233 and maximum electrical potential ~110 micro volt 2232. These 2233 and 2232 are set so that the minimum and maximum electrical potential of the PEM connector and conventional connectors 2202, 2204, 2229, 2228, are contained on the scale 2251. The results show that the electrical potential across the top of the pins of the PEM connector are ~20 micro volt for pin 2201, ~3 micro volt for pin 2206, ~2 micro volt for pin 2211, and 0 volt for pin 2216. The results show that the electrical potential across the top of the pins of the conventional connector are ~100 micro volt for pin 2226, ~34 micro volt for pin 2231, ~19 micro volt for pin 2236, and 0 volt for pin 2241. This reduction in electrical potential change on adjacent connectors is achieved, in part, by reducing electrical resistance, as depicted in FIGS. 21-22. Also, all components used to make up the PEM connector can be conventional off-the-shelf components, nevertheless, the arrangement in planar geometry is new. This compact design, which is smaller than conventional high power USB connectors, still results in less voltage cross-talk between adjacent pins for the same current flow. In other words, despite having the same distance between pins, the PEM connector displays unobvious electrical behavior, by reducing the voltage on pins adjacent to the current carrying pin.

Figure 27:
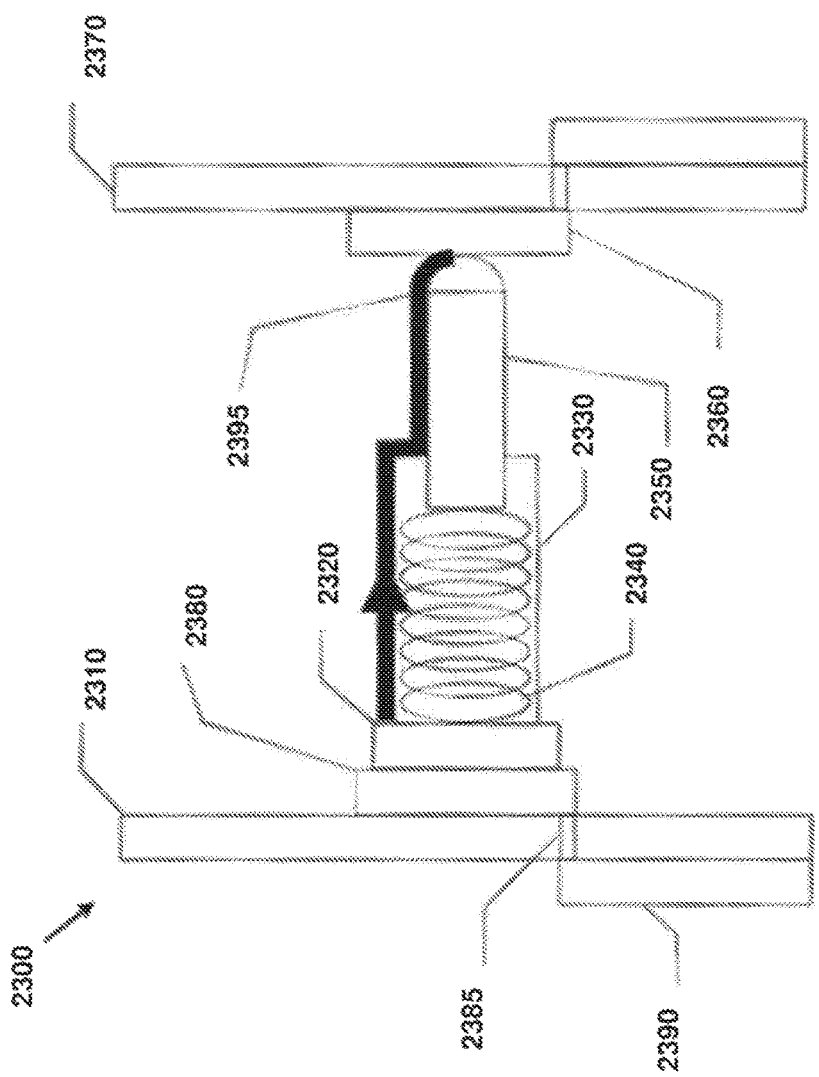
FIGS. 27 and 28 are diagrams illustrating an example configuration of an individual contact pin within the PEM connector in accordance with one embodiment of the technology described herein, wherein the connector halves in FIG. 27 are mated but the compression spring is not completely compressed, while in FIG. 28 the connector halves are mated and the compression spring is completely compressed.
Figure 28:
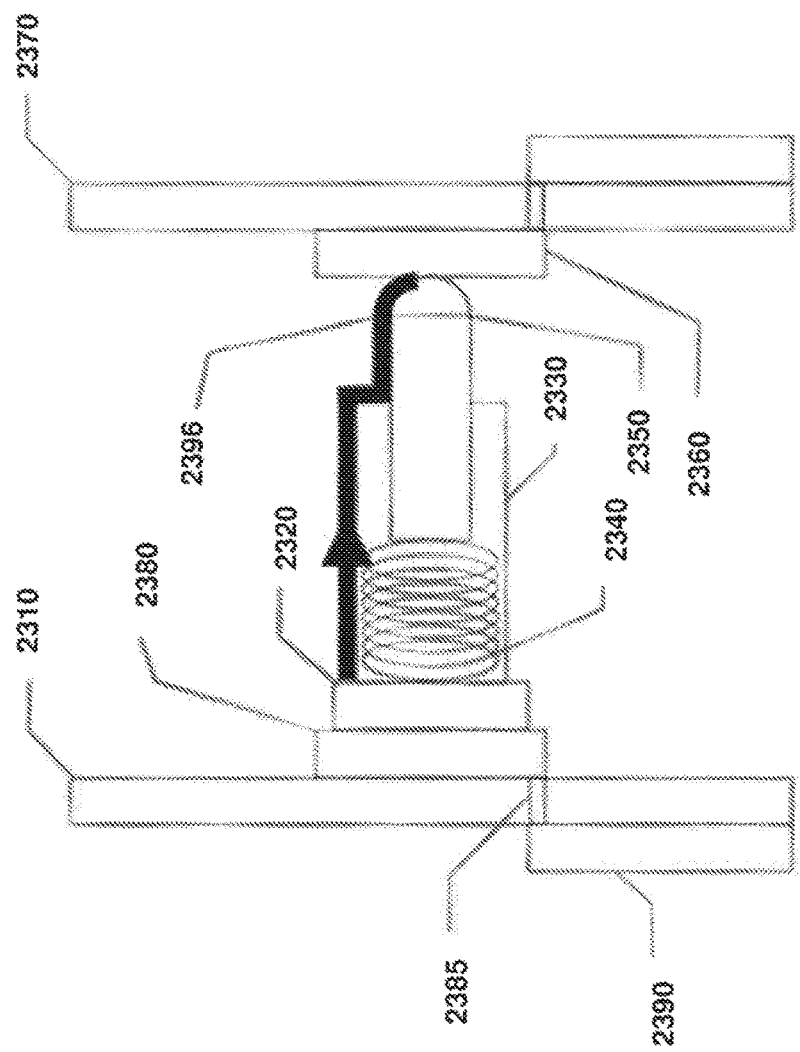

FIGS. 27 and 28 are diagrams illustrating an example configuration of an individual contact pin within the PEM connector in accordance with one embodiment of the technology described herein. In the example illustrated in the FIG. 27, the connector halves are mated but the compression spring is not completely compressed, thus showing a longer electrical path length. In the configuration illustrated in FIG. 28, the connector halves are mated and the compression spring is completely compressed, thus showing a shorter electrical path length.

Within the spring loaded pin arrangement shown 2300, of the PEM connector (which is analogous to any one of the pins (1801, 1806, 1811, 1816) in model 1800 of FIG. 15A and any one of the pins (2201, 2206, 2211, 2216) in the simulation plot 2200 of FIGS. 23-26, the overall length of the male contact pin comprising the pin base 2320, pin shaft 2330, compression spring 2340, and spring-loaded pin 2350, mounted upon the conductive pad 2380, (on male-side printed circuit board (PCB), 2310) is variable and depends upon the pressure applied to the spring-loaded pin tip 2350, by the conductive pad 2360 (on female-side printed circuit board, 2370). This results in a shortened electrically conductive path length (L in Eq. (3)) from the pin base 2320 to the tip of spring-loaded pin 2350, when the male and female connector halves are mated—leading to reduced electrical resistance (R in Eq. (3)), with A and ρ remaining constant, and reduced electrical potential drop (V in Eq. (4)). The electrical current (I in Eq. (4)) passed through the pin arrangement is sourced from the conductive via, 2385, which connects the pin pad 2380 and input trace line, 2390. The current exits via conductive pad (on Female PCB) 2360. When not mated (i.e., the tip of spring-loaded pin 2350 and conductive pad (on Female PCB), 2360, are not touching one another), the spring-loaded pin tip, 2350, is pushed out to its maximum extension by the force applied from compression spring, 2340, effectively lengthening the conductive path from the pin base, 2320, to the tip of spring-loaded pin, 2350. For the sake of explanation, FIG. 27 shows the pin arrangement with the connector halves mated, but with the compression spring, 2340, not completely compressed, leading to a longer electrical path length (L in Eq. (3)), as illustrated with the longer electrical path length, 2395. When the compression spring, 2340, is fully compressed, the electrical path length is shortened, as illustrated with the shorter electrical path length 2396 of FIG. 28.

The PEM solution is a preferable solution for an integrative software radio such as that described in this document. One reason this is preferred is due to the multiple advantages of the PEM connectors as compared to conventional solutions such as: reduced heat, reduced EM cross-talk, reduced weight, reduced size, increased simplicity of operation, improved logistics, unusually high speed, etc.

Conventional connectors have mechanical features designed only to affix the connector housing to the device. In contrast, embodiments of the PEM can be configured to include mechanical features that allow it to not only affix a mechanical subsystem, but also to affix the electrical connections to the target device simultaneously. Accordingly, embodiments can be configured to provide a joint connector solution combining both mechanical and electromechanical features. Therefore, these joint electromechanical features, can have a fundamental impact on equipment with which they are used, including the ISR. This is because, by lacking of the above joint features, the multi-radio solution may suffer from poor performance, including negation of all the advantages presented as described herein for the PEM connector. In other words, this joint connector called PEM, adds to the solution, the following platform operational and environmental (POE) features, such as, reduced heating, reduced EM cross-talk, reduced weight, reduced size, increased simplicity of operation, improved logistics, and increased speed.

In high performance platforms, POE parameters are of extreme concern. This is because, if one element does not satisfy POE requirements, they typically become the weakest link in the platform system. In our PEM, adding shielding is an obvious addition for EMI purposes. However, in addition to using shielding to mitigate EMI, the PEM connector pin topology itself in various embodiments, naturally reduces EMI that arise in high speed (e.g. 480 Mbit/s USB 2.0) applications. This reduction in EMI, enhances high speed data transmission capabilities. This is because, generally, the geometry of the conductor is related to the frequency at which it radiates efficiently; typically a shorter conductor radiates efficiently at higher frequencies compared to a longer conductor. Therefore, the shorter PEM pin will radiate efficiently at a higher frequency than prior art pins, thus pushing the data transmission speed limit (DTSM) to higher frequencies, in order to allow higher data transmission rates. In other words, the PEM pin will not generate EMI cross-talk at the same frequency as prior art pins, but rather, enabled by its shorter (e.g. 5X) length, will radiate at a higher frequency (e.g. ~5× higher) than conventional solutions, and enabling higher (~5× higher) data transmission rates compared to those conventional solutions.

Figure 29:
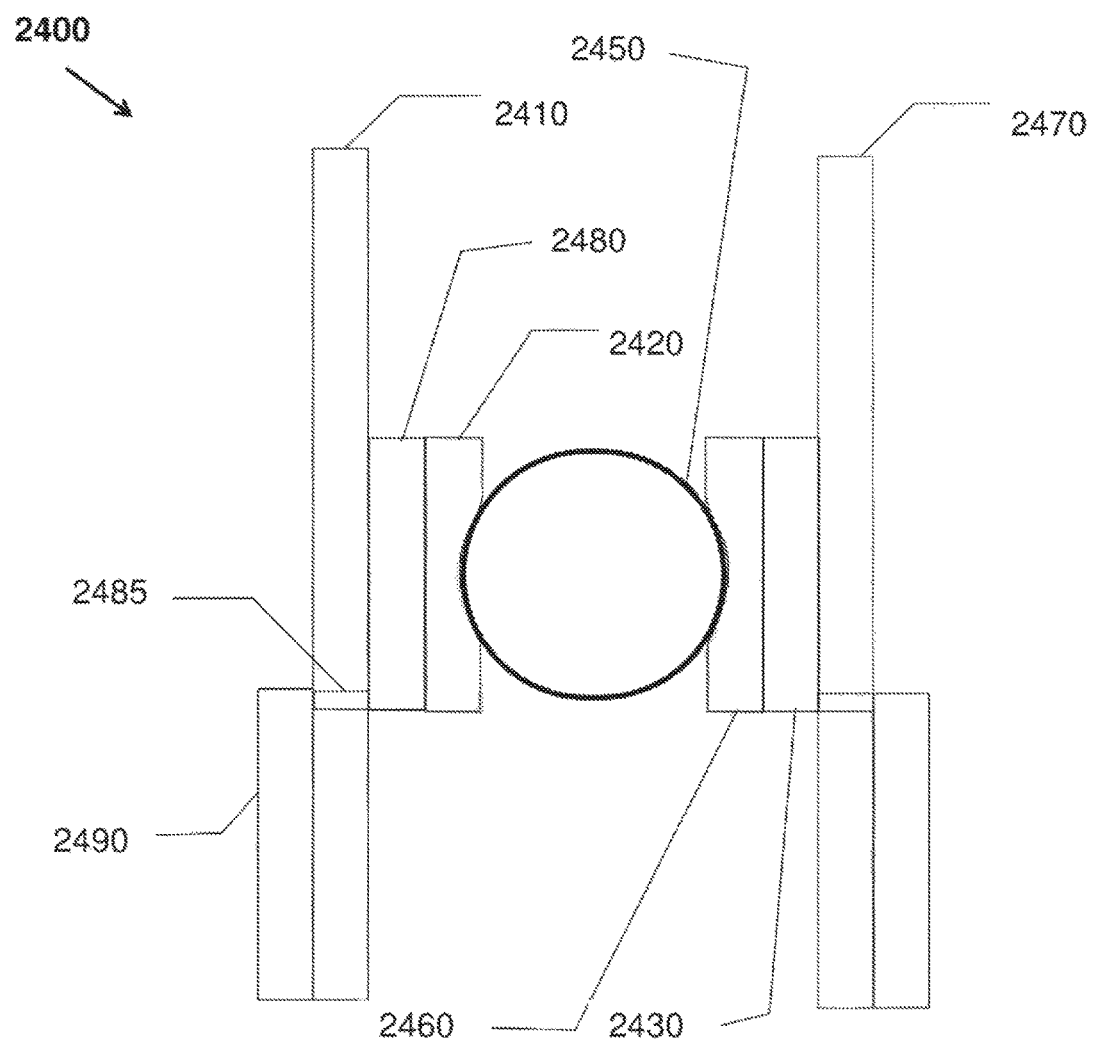
FIG. 29 is a diagram illustrating an intrinsically spring-loaded contact ring assembly in accordance with one embodiment of the technology described herein.

Referring to FIG. 29, the Intrinsically Spring-loaded Contact Ring Assembly, 2400, one aspect of the present invention is a type of electrical contact. This contact, when used (alone or in an array, which is more often the case) in conjunction with an insulative housing, comprises an electrical connector suitable for use as a replacement for spring loaded (e.g., "pogo") pins with fewer moving parts. In fact, the Intrinsically Spring-loaded Contact Ring, 2450, acts as both a contact "pin" and a "spring" simultaneously. The Intrinsically Spring-loaded Contact Ring, 2450, physically touches (contacts) the Contact Ring Receiver, 2460, to provide for electrical conductivity through the connector. Exemplarily, electrical conductivity can be provided from Input Trace, 2490, connected by Conductive via between pin pad and input trace, 2485, to Conductive Pad, 2480, located onboard the Male-side PCB, 2410, through Contact Ring Base, 2420, to the Conductive Pad 2430 onboard the Female-side PCB, 2470. This electrically conductive path formed by mating element 750 with element 760 is further described in FIG. 30.

Figure 30:
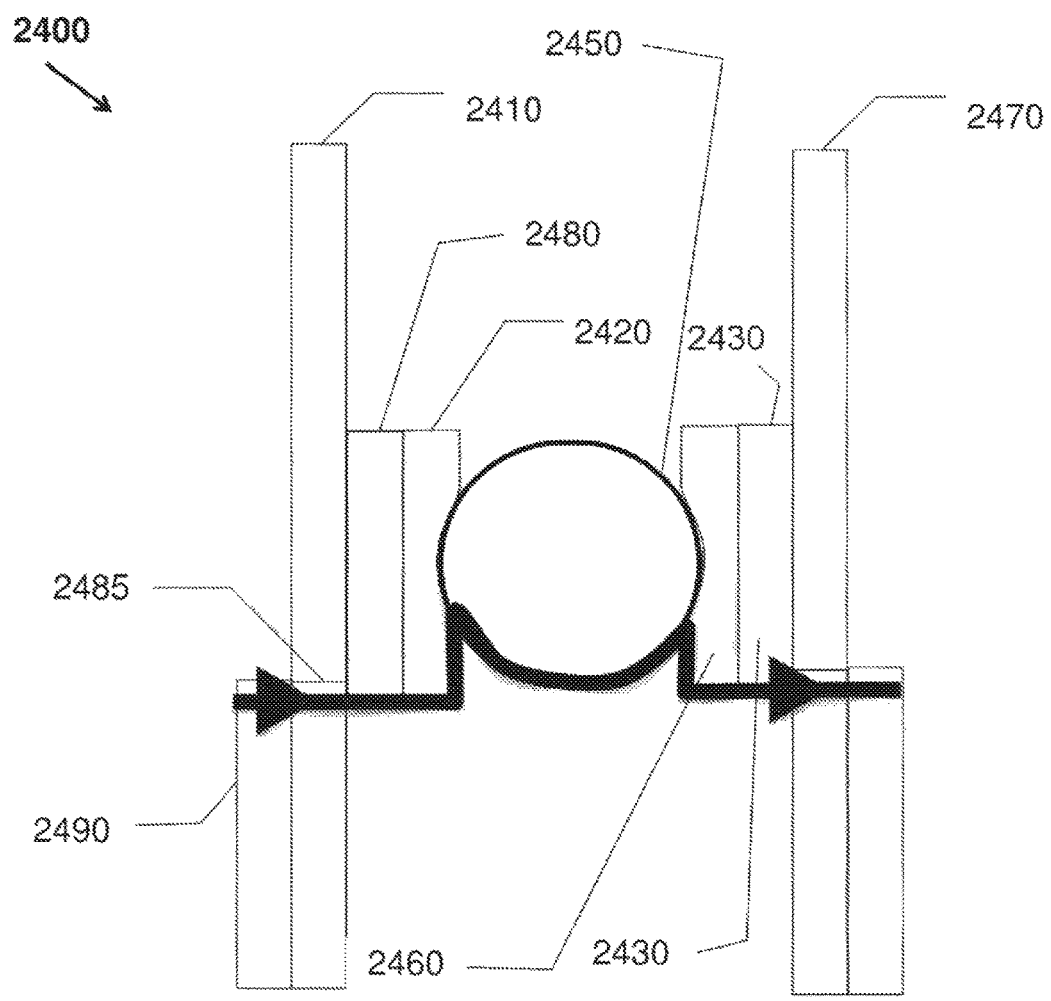
FIG. 30 is a diagram illustrating an example of an electrically conductive path formed by mating the elements in the intrinsically spring-loaded contact connector of FIG. 29.

Referring to FIG. 30, the Intrinsically Spring-loaded Contact Ring Assembly, 2400, one aspect of the present invention is a type of electrical contact. This contact, when used (alone or in an array, which is more often the case) in conjunction with an insulative housing, comprises an electrical connector suitable for use as a replacement for spring loaded (e.g., "pogo") pins with fewer moving parts. In fact, the Intrinsically Spring-loaded Contact Ring, 2450, acts as both a contact "pin" and a "spring" simultaneously. The Intrinsically Spring-loaded Contact Ring, 2450, physically touches (i.e., contacts) the Contact Ring Receiver, 2460, to provide for electrical conductivity through the connector. Exemplarily, electrical conductivity can be provided from Input Trace, 2490, connected by Conductive via between pin pad and input trace, 2485, to Conductive Pad, 2480, located onboard the Male-side PCB, 2410, through Contact Ring Base, 2420, to the Conductive Pad 2430 onboard the Female-side PCB, 2470, forming conductive path 2498. Furthermore, demating elements 2450 and 2460, as described in FIG. 31, can break this conductive path.

Figure 31:
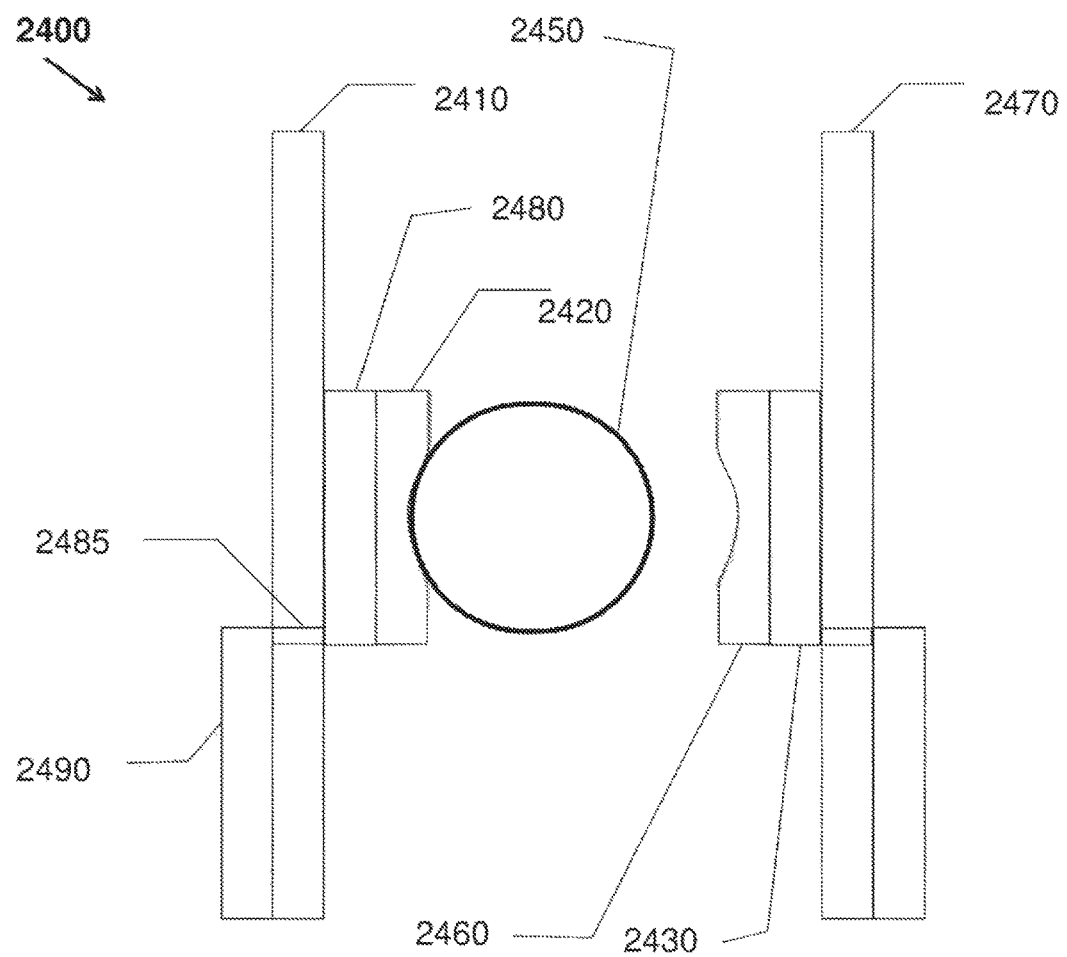
FIG. 31 is a diagram illustrating an example of unmating the contact elements of an intrinsically spring-loaded connector.

Referring to FIG. 31, the Intrinsically Spring-loaded Contact Ring Assembly, 2400, according to one aspect of the disclosed technology is a type of electrical contact. This contact, when used (alone or in an array, which is more often the case) in conjunction with an insulative housing, comprises an electrical connector suitable for use as a replacement for spring loaded (e.g., "pogo") pins with fewer moving parts. In fact, the Intrinsically Spring-loaded Contact Ring, 2450, acts as both a contact "pin" and a "spring" simultaneously. The Intrinsically Spring-loaded Contact Ring, 2450, is removed from contacting (i.e., no longer touching one another) the Contact Ring Receiver, 2460, electrical conductivity in broken (i.e., discontinued). Exemplarily, electrical conductivity no longer takes place from Input Trace, 2490, connected by Conductive via between pin pad and input trace, 2485, to Conductive Pad, 2480, located onboard the Male-side PCB, 2410, through Contact Ring Base, 2420, to the Conductive Pad 2430 onboard the Female-side PCB, 2470.

Figure 32A:
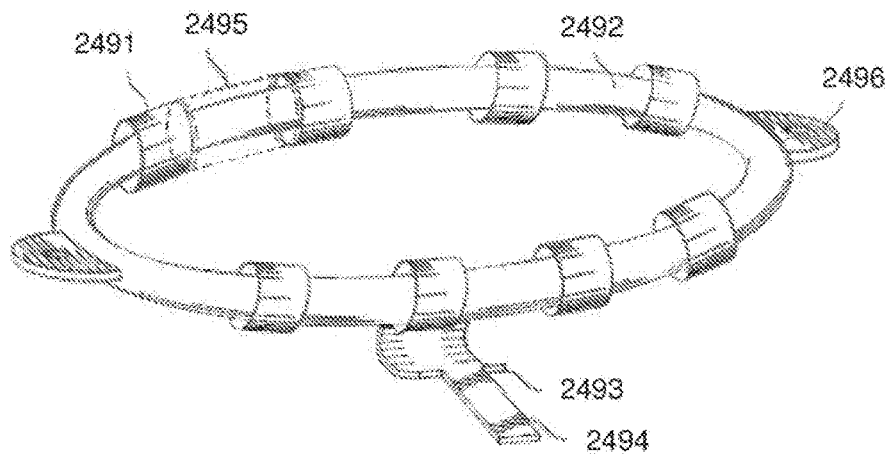
FIG. 32A is a diagram illustrating an example of a multiple-contact assembly configured using intrinsically spring-loaded annular contacts.
Figure 32B:
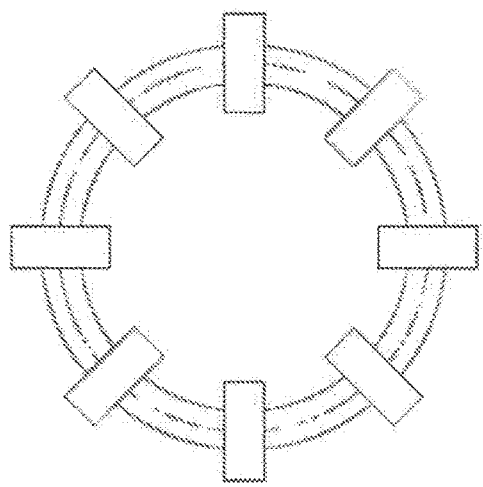
FIG. 32B is a diagram illustrating a top view of an example of a multiple-contact assembly configured using intrinsically spring-loaded annular contacts.
Figure 32C:
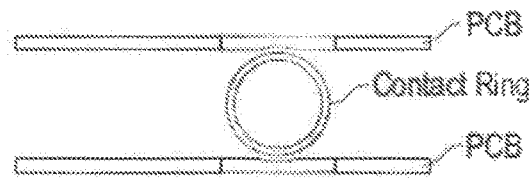
FIG. 32C is a diagram illustrating a side view of an example of a multiple-contact assembly configured using intrinsically spring-loaded annular contacts.

In various embodiments, a plurality of intrinsically spring-loaded contact rings 2450 can be configured to make a multi-pin connector in a variety of different patterns or configurations. FIGS. 32A, 32B, and 32C is a diagram illustrating an example of a plurality of intrinsically spring-loaded contact rings 2450 configured in an annular or ring-like pattern to form an eight-pin connector ring in accordance with one embodiment of the technology described herein. As seen in this example, a plurality of intrinsically spring-loaded contact rings 2450 are arranged in a circular configuration about a support structure, which in this example is in the shape of a ring 2492. A perspective view of this is shown in FIG. 32A, a top-down view is shown in FIG. 32B, and a side view is shown in FIG. 32C. Also provided in this example or a plurality of spacers 2495 to maintain spacing between the intrinsically spring-loaded contact rings 2450 about the annular ring. Spacers 5 are made from a nonconductive or dielectric element so as to avoid shorting between the intrinsically spring-loaded contact rings 2450. Spacers 2495 can also be overlapped intrinsically spring-loaded contact rings 2450, to help avoid intrinsically spring-loaded contact rings 2450 contacting ring 2492. Spacers 2495 can be made from an elastomeric or other spring-like non-conductive material.

As seen in this example, the contact rings 2450 are spaced equidistant about support ring 2492, and support ring 2492 is configured in a circular fashion. As one of ordinary skill in the art would appreciate after reading this description, a different quantity of intrinsically spring-loaded contact rings 2450 can be provided, and they need not be equally spaced about the ring 2492. Likewise, ring 2492, can be configured in a shape other than circular as may be desired for a particular application. The example of FIG. 32A also shows a contact ring receiver 2493 and a contact lead 2494.

Figure 33A:
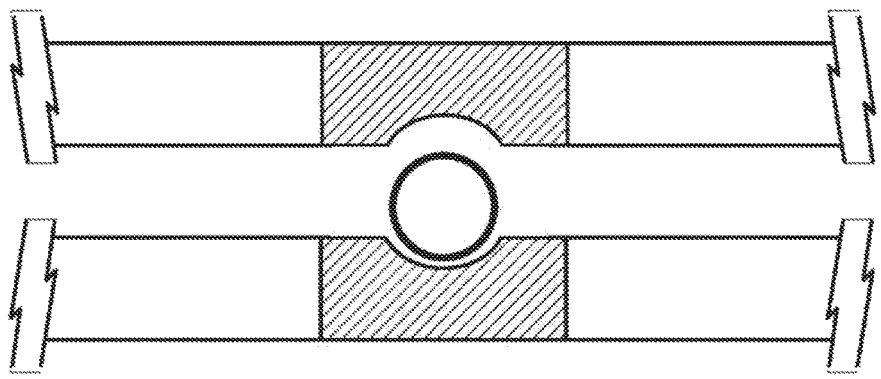
FIG. 33A is a diagram illustrating an example of an intrinsically spring-loaded annular contact in the unmated configuration.
Figure 33B:
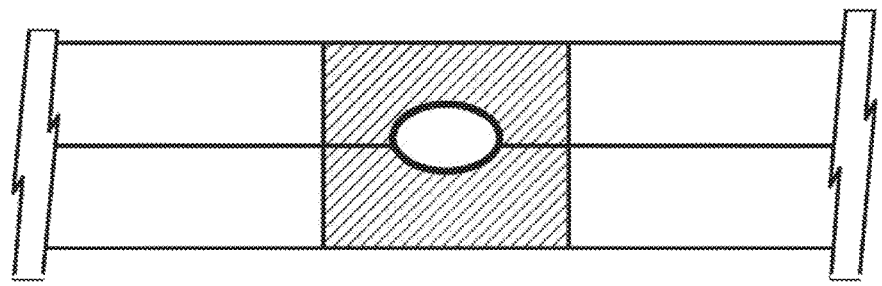
FIG. 33B is a diagram illustrating an example of an intrinsically spring-loaded annular contact in the mated configuration.

FIGS. 33A and 33B shows an example of an intrinsically spring-loaded contact ring 950 between two contacts on their respective printed circuit boards. An unmated configuration is shown at FIG. 33A, and a mated configuration is shown at FIG. 33B. As this example illustrates, the contact pad or ring receiver 2493 in this example embodiment is formed to have an ovate or elliptical contact surface as opposed to a arcuate surface of constant radius. This is so that full contact can be made with the intrinsically spring-loaded contact ring 2450, when the contact ring is compressed between the two contact elements or ring receivers 3 as shown in FIG. 33B.

Figure 34A:
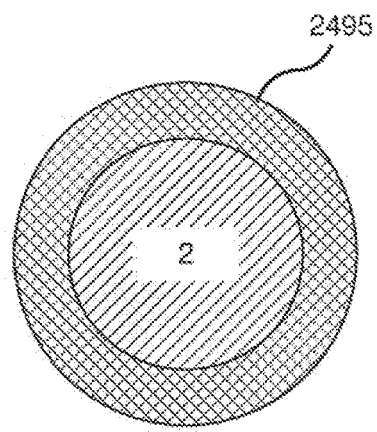
FIG. 34A is a diagram illustrating an example of a cross sectional view of the example ring assembly illustrated in FIG. 32A.
Figure 34B:
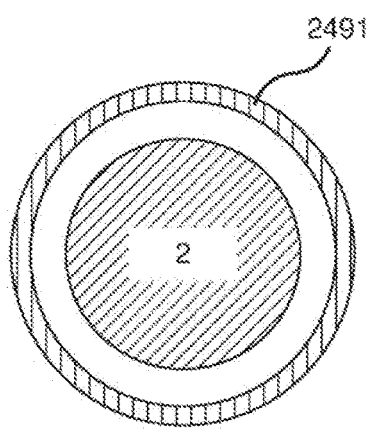
FIG. 34B is a diagram illustrating an example of a cross sectional view of the example ring assembly illustrated in FIG. 32A.

FIGS. 34A and 34B is a diagram illustrating cross-sectional views of spacers 2495 and intrinsically spring-loaded contact ring 2450. FIG. 34A shows spacers 2495 about ring 2492, and FIG. 34B shows intrinsically spring-loaded contact rings 2450 about ring 2492 in a spaced-apart configuration.

Conventional snap connectors, can be represented by U.S. Pat. Nos. 7,462,035; 7,335,067, 8,308,489; 7,556,532; 7,658,612; 7,753,685; and 7,731,517. However, now described is a Universal Ergonomic Bulkhead Snap Connector, (UNEBSC) that can be configured to form, when mated, a secure mechanical connection to the host unit, in addition to making the requisite electrical connection simultaneously with one device.

Embodiments of the systems and methods disclosed herein can be configured to form a novel combination of electrical and mechanical functionality to provide distinct advantages over conventional connectors. Superiority over conventional connectors in various embodiments can be manifested in the form of: reduced weight (e.g., can be configured such that lesser quantity of fasteners and other redundant elements may be achieved); reduced size (e.g., can be configured such that overall form factor reduction is afforded); increased simplicity of operation (e.g., can be configured such that only one step is needed to perform electrical and mechanical attachment); and improved logistics (e.g., can be configured such that fewer parts need to be accounted for, shipped, kept in inventory, and assembled), among others.

Embodiments of the UNEBSC can be implemented as an advanced version of a snap connector utilizing bulkhead male snap connectors (BMSC), including three (3) fasteners and two (2) locking mechanisms that provide a means to affix to the host body securely. This enables the UNEBSC to perform load bearing function. Embodiments of the UNEBSC can be implemented to have efficient ergonomics: e.g., requiring only 2 fingers to disengage the connector's portions (e.g., halves). Embodiments can also be implemented to have a predefined angle of mating.

In various embodiments, implementations of the single-lever bulk head snap connector in the host, such as a multi-radio device, can be provided with an electromechanical geometry that is fully customizable for each mission module configuration. Embodiments can be configured to minimize electromagnetic interference (EMI) and radio frequency interference (RFI) while simultaneously optimizing power and signal integrity over the interface between the male and female connector halves. With conventional solutions, mechanical fixtures separate from the electrical fixtures are necessary to affix the mechanical assemblies or devices associated with the connector halves (e.g., host device and mission module), so the two devices of an electronic assembly (e.g., a handheld radio) are held securely together. The mechanical fixtures that do exist within the envelope of conventional electrical connectors exist solely to attach the body (i.e., housing) of the electrical connector to the target device, and not to affix another mechanical subassembly.

Figure 35:
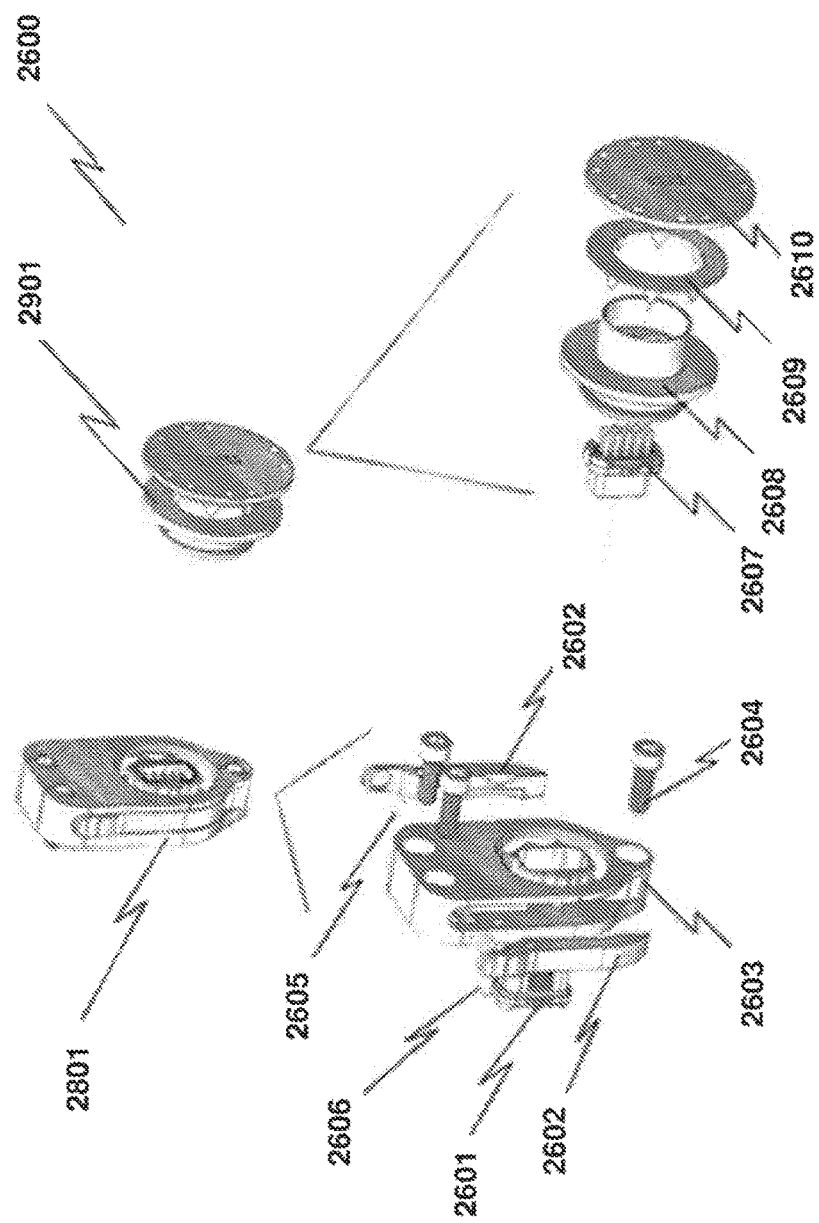
FIGS. 35 and 36 present alternate views of an exploded view of example male and female bulkhead assemblies for a UNEBSC in accordance with one embodiment of the technology described herein.
Figure 36:
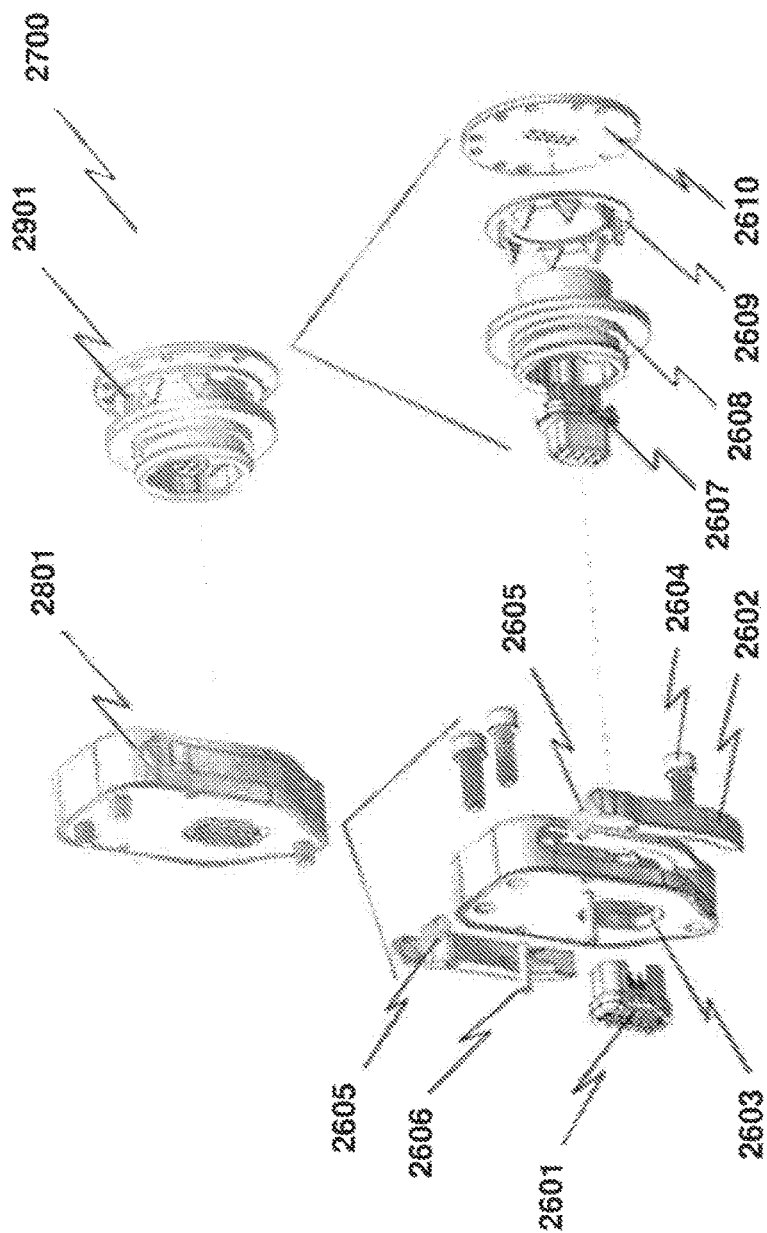

FIGS. 35 and 36 present alternate views 2600, 2700 of an exploded view of example male and female bulkhead assemblies for a UNEBSC in accordance with one embodiment of the technology described herein. This example bulkhead male locking snap connector uses pin-based electrical connections and includes: male right latch 2602; main housing retainer 2603; male left latch 2602; male electrical connector 2601; fasteners 2604; male registration shaft 2606; and compression springs 2605. The example bulkhead female locking snap connector includes modified spur washer, 2609 (which bites into the carrier housing); rivetable printed circuit board, 2610; female rivet stud, 2608; and female electrical connector 2607.

Figure 37:
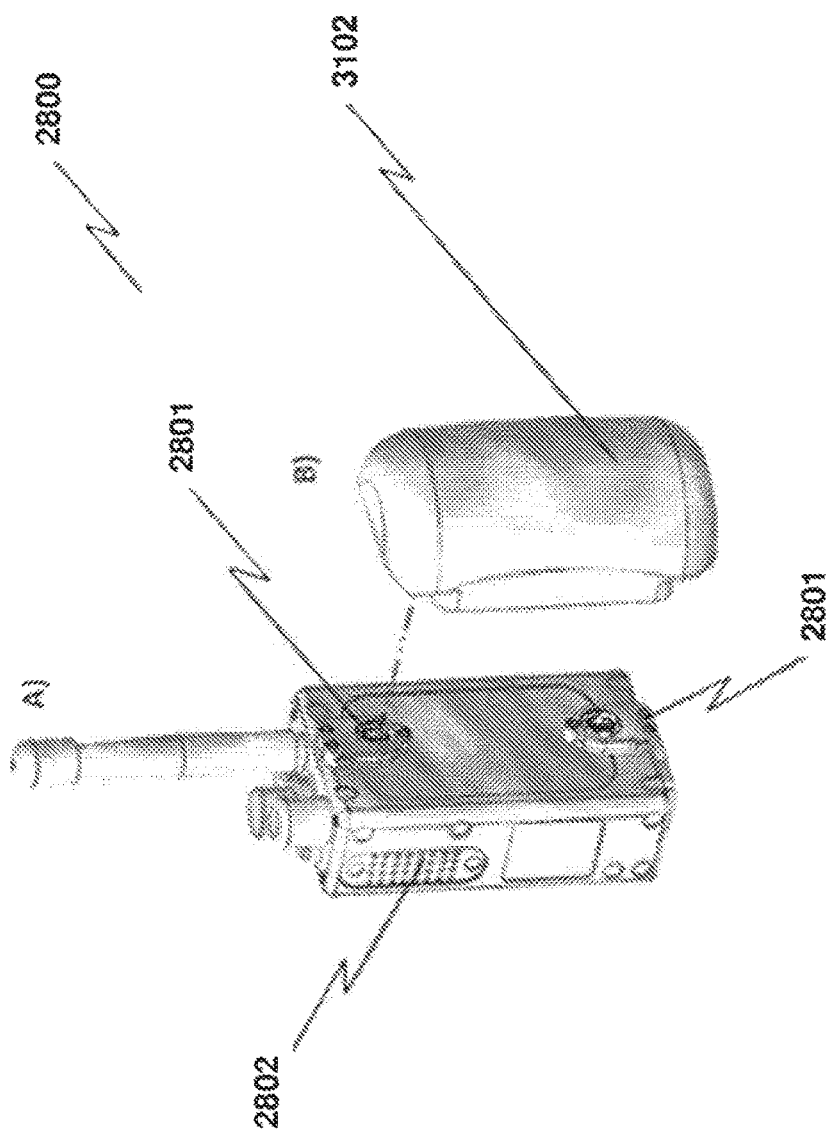
Figure 39:
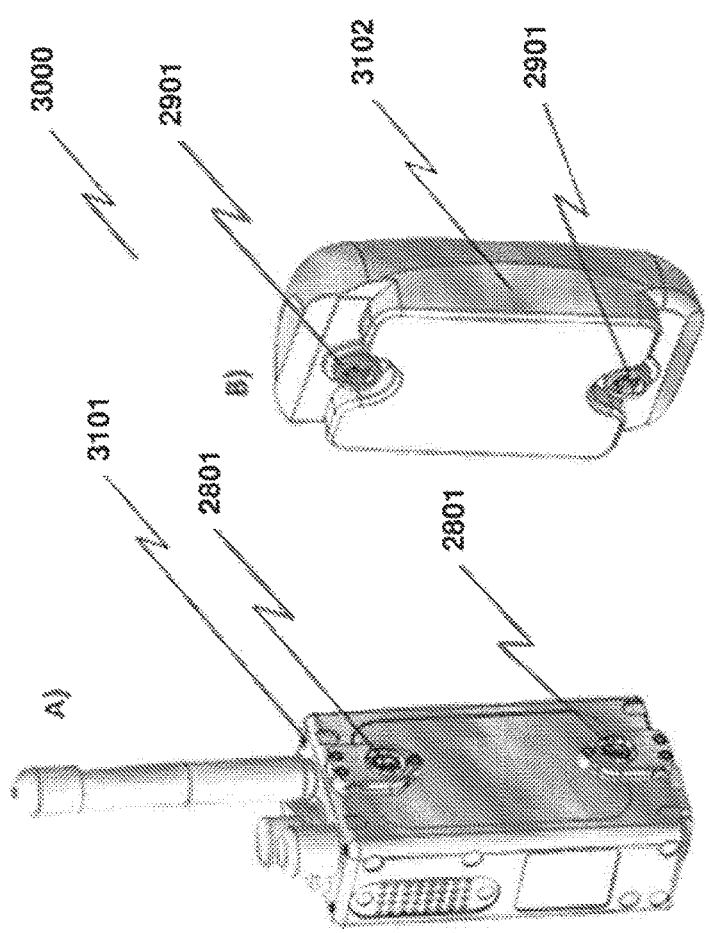

FIGS. 37, 38 and 39 illustrate an example of unmated UNEBSC female and male halves integrated with hosts, 3000, 2900, and 2800. FIG. 37 illustrates an example of a mission module separated from a host radio showing a male bulkhead snap, including A) a radio host, and B) a Mission Module. FIG. 38 illustrates an example of the Mission Module separated from a host showing a female snap, including A) a radio host, and B) a Mission Module. FIG. 39 illustrates an example of a Mission Module separated from a host showing both male and female snaps, including A) a radio host, and B) a Mission Module.

These male and female locking snap connectors with two locking tabs ready to mate, 2900, include: assembled female connector (half), 2901; assembled male connector, 2801; a host, 3101, and a mission module, 3102.

Referring to FIG. 39, in a preferred embodiment of the present invention, a Host Device (Mother Radio Unit), 3101, connects to a Mission Module (Daughter Unit), 3102, via the present invention's Male Snap Bulkhead Connector, 2801 and the Female Snap Rivet Connector, 2901, affixed to Mission Module (Daughter Unit), 3102, as shown in FIG. 4. This mating of the two portions of the radio 3100, 2800, the Host Device (Mother Unit), 3101, and the Mission Module (Daughter Unit), 3102, represents a significant advancement over prior art in that a secure mechanical connection is made in addition to the requisite electrical connection simultaneously, and with one device.

Figure 40:
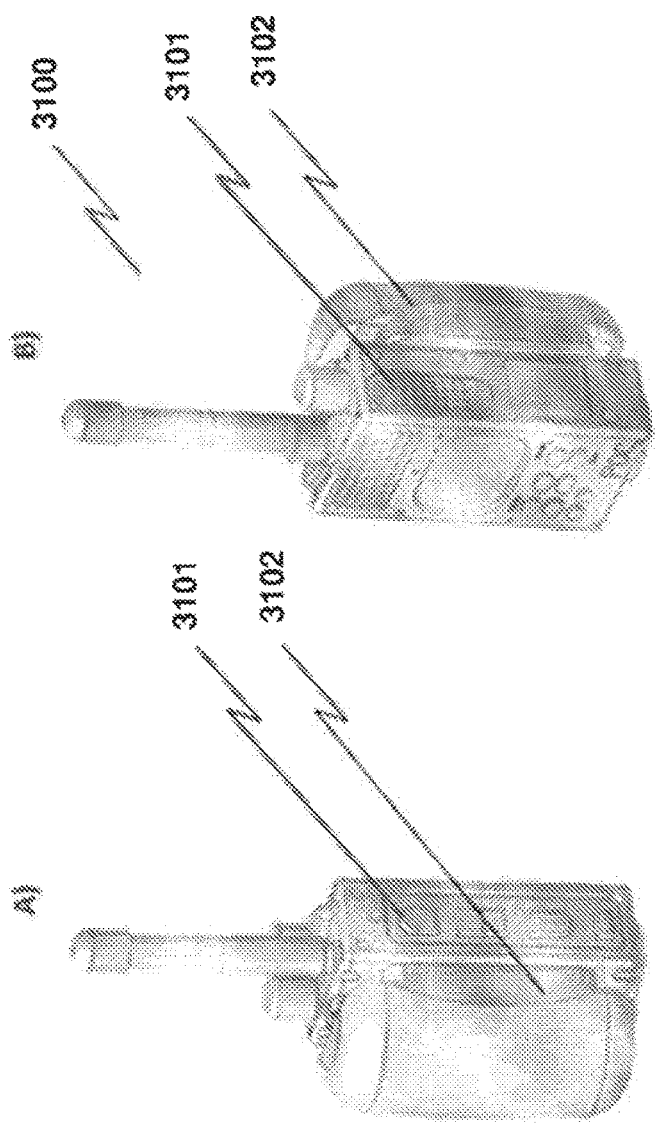
FIG. 40 is a diagram illustrating an example of a Mission Module integrated with a host radio including an A) Isometric View, and B) a perspective view.

FIG. 40 is a diagram illustrating an example of a Mission Module integrated with a host radio including an A) Isometric View, and B) a perspective view. As these examples illustrate, one feature of embodiments of the UNEBSC over conventional snap connectors is most manifested by the fact that the main housing, 2603, can be tuned to customize UNEBSC into various configurations of snap connector, as shown in FIG. 39 and FIG. 40.

Figure 41:
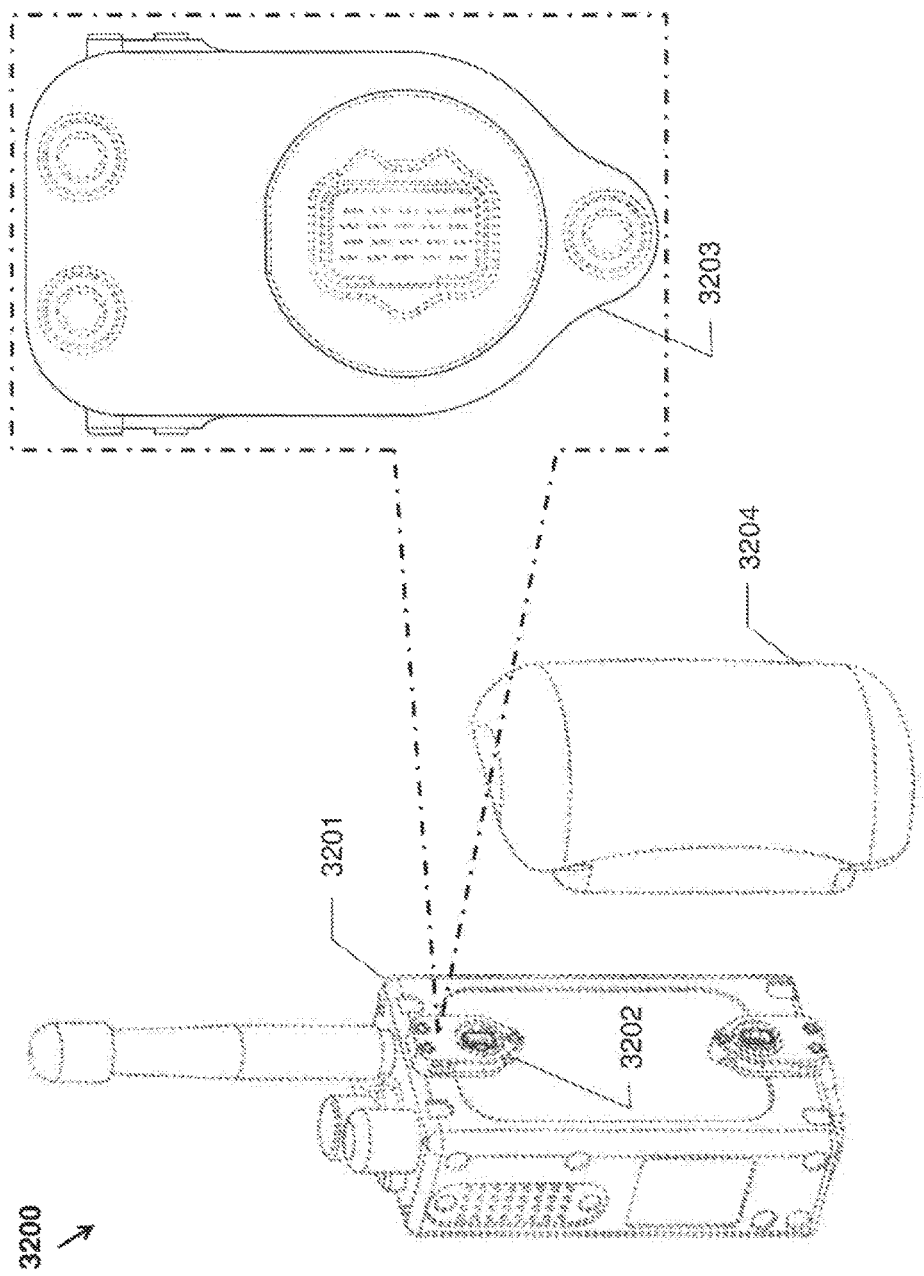
FIG. 41 is a diagram illustrating an example of a female snap bulkhead connector for connecting a host device to a mission module.
Figure 42:
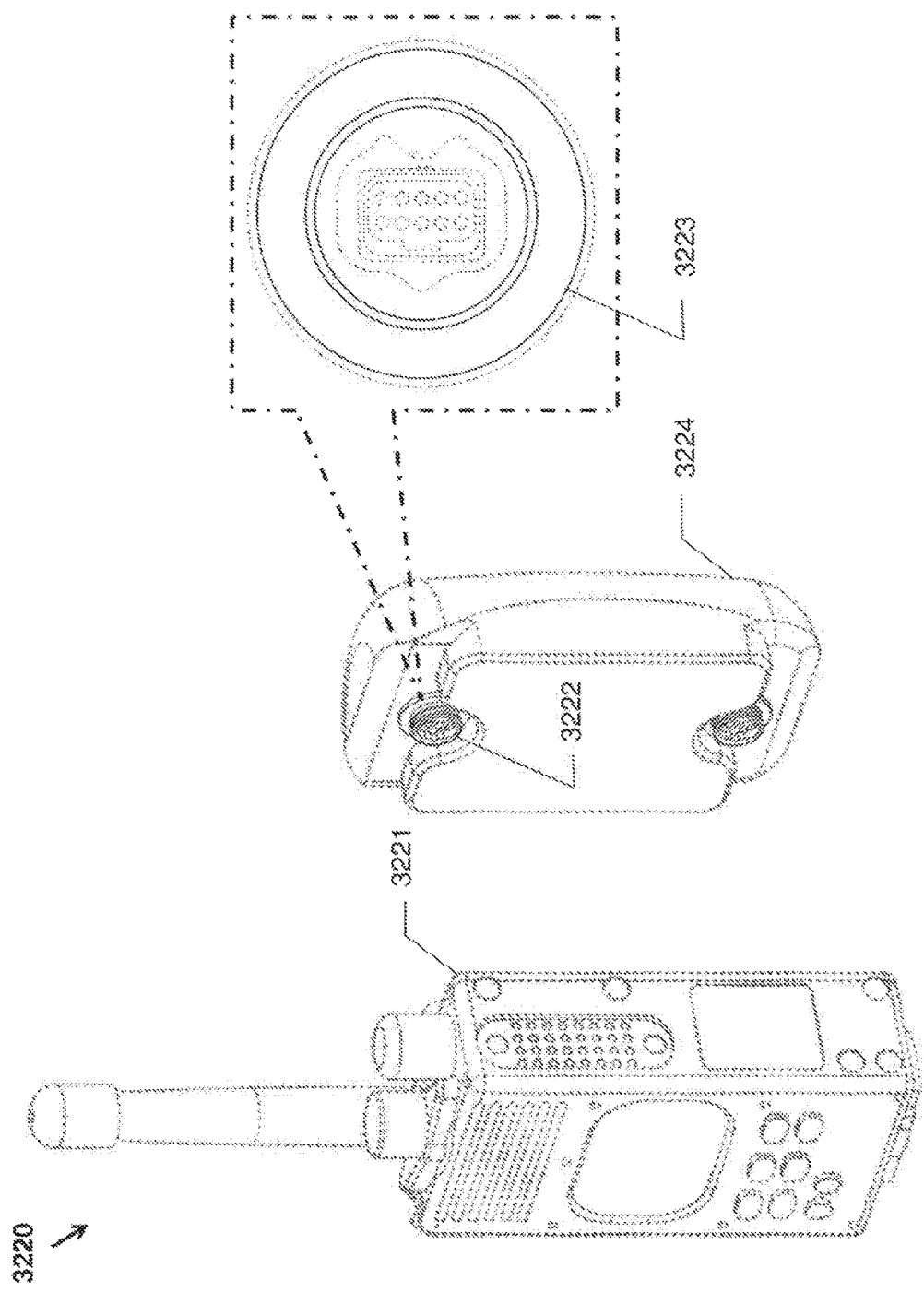
FIG. 42 is a diagram illustrating a male snap bulkhead connector and an example configuration meeting a host device to a mission module.

Referring to FIG. 41, in a preferred embodiment of the present invention, a Host Device (Mother Unit), 3101, connects to a Mission Module (Daughter Unit), 3104, via the present invention's Male Snap Bulkhead Connector, 3102, 3103 and the Female Snap Rivet Connector, 3202, 3203 affixed to Mission Module (Daughter Unit), 3204, as shown in FIG. 42. This mating of the two portions of the radio 3100, 3200, the Host Device (Mother Unit), 3101, 3201, and the Mission Module (Daughter Unit), 3104, 3204 represents a significant advancement over prior art in that a secure mechanical connection is made in addition to the requisite electrical connection simultaneously, and with one device. In prior art, mechanical fixtures separate from the electrical fixtures are necessary to affix portions, e.g., host device and mission module, of an electronic assembly, e.g., a handheld radio, securely together. The mechanical fixtures that do exist within the envelope of prior art electrical connectors exist solely to attach the body (i.e., housing) of said electrical connector to the target device, not to affix another mechanical subassembly. This novel combination of electrical and mechanical functionality gives the electromechanical connector 3102, 3103, 3202, 3203 of the present invention distinct advantages over said prior art. Superiority over prior art is manifold: reduced weight (number of fasteners and other redundant elements is achieved); reduced size (overall form factor reduction is afforded); increased simplicity of operation (only one step is needed to perform electrical and mechanical attachment); and improved logistics (fewer parts to be accounted for, shipped, kept in inventory, and assembled), among others.

The technology disclosed herein can further include systems and methods for extending the communication range of radio frequency systems in general, and systems and methods for increasing communication range without impacting compatibility of the radio frequency device with other radio frequency devices. In various embodiments, a communications range extension method (CREX, FIG. 43) can be configured to allow radio frequency communication between User Equipment (UE) and Base Station (BS) over a greater communication range than would normally be achieved.

Successive generations of commercial wireless communication protocols have been designed and optimized for specific concepts of operations (CONOPS). First generation (1G) systems used analog radio techniques for voice communications. When digital wireless telecommunications appeared, these 2G systems, including the Global System for Mobile Communications (GSM) and IS-95 (CDMA), provided more efficient use of the radio spectrum, but were still designed for voice communications. As the Internet boomed these 2G systems added capability to download data to mobile devices, leading to so-called 2.5G or 2G+ systems: the General Packet Radio Service (GPRS), Enhanced Data Rates for GSM Evolution (EDGE), and IS-95B. Third generation (3G) systems (Universal Mobile Telecommunications Systems (UMTS) and CDMA2000) targeted higher data transfer rates. However, with the widespread use of smartphones, even 3G networks reached their capacity limits and the latest generation (4G) communications systems, specifically Long Term Evolution (LTE) and LTE-Advanced, have targeted very high spectral efficiency to increase data capacity within the fixed spectrum available for commercial mobile use.

However, this high-data-capacity CONOPS impacts the range of wireless communications. Increased bandwidth reduces receive sensitivity, and modulation schemes with high spectral efficiency (bits per hertz) require higher signal-to-noise ratios to recover data with acceptable bit error rates. LTE specifically, is optimized for cell sizes up to 5 km, although it can support cell sizes of up to 100 km. It is also optimized for mobile speeds of 10-75 mph, although it can support speeds of over 200 mph.

Although technically most wireless communication protocols should work equally well (and possibly even better) from the air as on the ground, most base stations are designed with directional antennas that have very low gain in the direction of aircraft altitudes. Another factor that affects the range of commercial wireless mobile devices is the power output of the mobile device, which must be maintained at levels deemed safe for operation when held up against the side of the head. The limits for permissible levels are regulated by the Federal Communications Commission (FCC). The upshot of this is that the average transmit power of a mobile device is typically no more than 23 dBm, or 0.2 W.

For the base station, or eNodeB (eNB), one challenge is to operate the power amplifier as efficiently as possible to maximize transmit power while minimizing operational costs. Unfortunately, operating a wideband power amplifier at its most efficient power levels typically means operating it in a regime where the amplifier is highly nonlinear. Nonlinear response in the amplifier will generate harmonics and intermodulation products. Particularly troublesome are modern orthogonal frequency division multiplexed (OFDM) waveforms, such as LTE, since these wideband, spectrally efficient waveforms have very sharp spectral edges, which makes analog filtering of nonlinear sidebands extremely challenging.

Waveform modifications are one method to increase communication range. Software-defined radios, in which the waveform is implemented in software, provides a method to implement such changes to the waveform. However, making changes to the waveform in this way will typically result in the modified waveform being incompatible with the unmodified waveform. This results in the need for all radios in the network to be modified to maintain communications between devices on the network. Even if all radios on the network are software-defined radios (and they may easily not be, since most commercial cell phones do not have software-reconfigurable waveforms), this situation is undesirable due to the extensive amount of reconfiguration and recertification that would be required prior to deployment.

Embodiments of the range extension disclosed herein can be configured to address this issue by applying changes to the waveform in a signal-agnostic manner. In other words, the software algorithms applied by embodiments of the CREX are invisible to the radio medium access control (MAC) and physical (PHY) layer. Specifically, CREX can be configured to apply a digital RF predistortion technique prior to amplification of the RF signal which reduces nonlinear signal components and allows greater power levels to be transmitted from the radio antenna without risk of exceeding out-of-band RF emissions.

Figure 43:
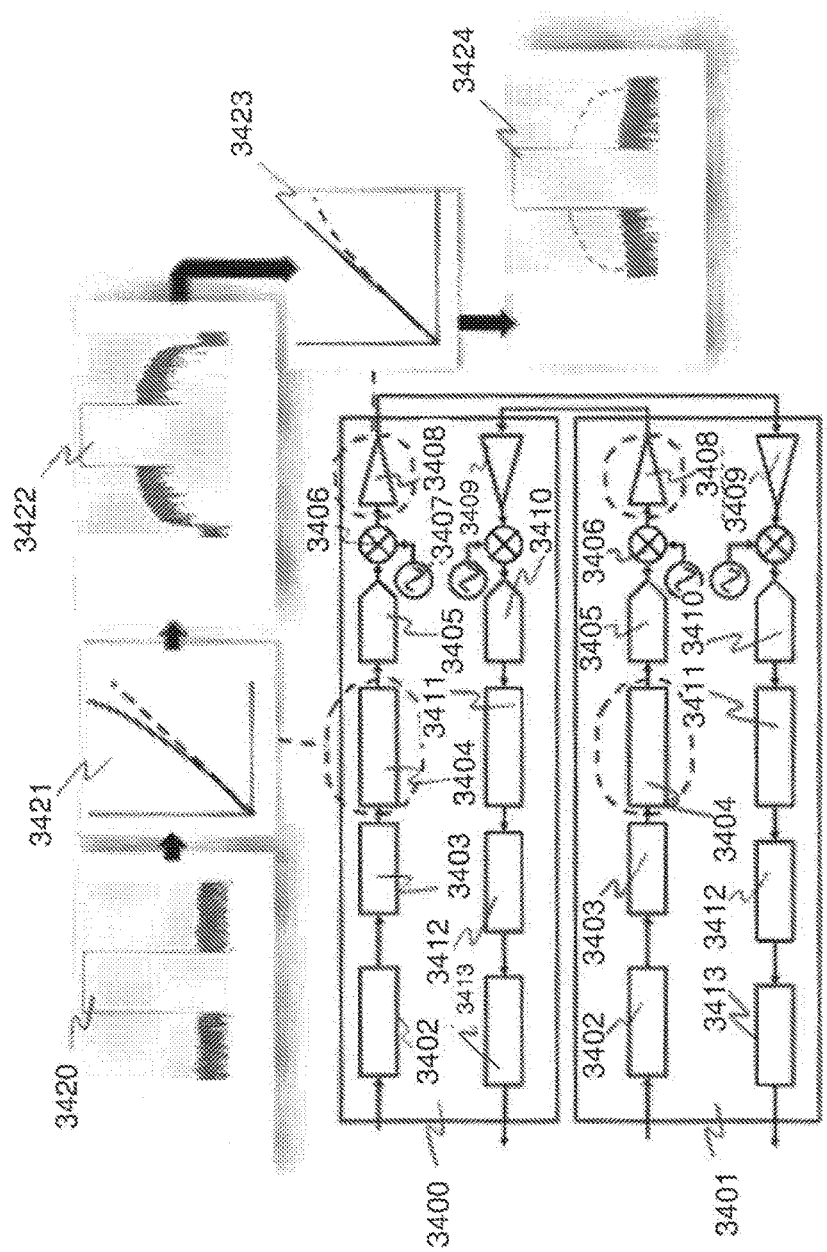
FIG. 43 is a diagram illustrating an example of communication range extension in accordance with one embodiment of the technology described herein.

Embodiments can be configured to provide a communications range extension (CREX) system and method, that can be implemented on a software-defined radio to increase the communications range of existing commercial wireless communication protocols. FIG. 43 illustrates an example of a communications range extension (CREX). This illustrates an example of major constituent components of two radios, 3400 and 3401, with bi-directional communication between the two radios. The communication could be symmetric as in an ad-hoc network (in which case 3400 and 3401 are identical radios), or asymmetric as in a cellular network (in which case 3400 could be a user equipment and 3401 could be a base station, or vice versa). In addition, for both the symmetric and asymmetric cases, one or both radios may incorporate CREX, i.e. it is not necessary for both radios to include CREX to obtain the enhancement of the communication range.

In one data path shown in FIG. 1, the input data stream 3402 is read by the transmitting radio 3400, then processed by the MAC 3403 and PHY 3404 layers, then converted to an analog signal by the digital-to-analog converter (DAC, 3405). This analog signal is upconverted to the RF transmission frequency by a mixer 3406 which mixes the signal with an RF carrier from a frequency source 3407. The RF signal is then amplified by a power amplifier 3408 and broadcast over the air by an antenna (not shown). The receiving radio 3401 collects the broadcasted signal via its receive antenna (not shown) and amplifies the signal with a low-noise amplifier 3409. The RF signal is downconverted then digitized by an analog-to-digital converter (ADC, 3410). The digital data is then processed by the PHY 3411 and MAC 3412 layers to decode the digital data stream 3413.

An example of the effect of CREX on the waveform is indicated by the dashed lines in FIG. 43. The unmodified digital communications waveform 3420 is predistorted in a manner that exactly compensates for the nonlinear response of the power amplifier 3421. The resulting digitally predistorted waveform 3422 is then converted to an analog signal and supplied to the input of the power amplifier. As a result of the amplifier nonlinear response 3423 the waveform transmitted over-the-air 3424 is free of nonlinear sidebands. Since the permissible power levels are determined by out-of-band permissible emissions, the overall transmitted power can be increased compared to operation without CREX. When applied to a communications link budget this increase in transmit range leads to a longer range of communications.

Some embodiments of the systems and methods disclosed herein relate to an Integrative Software Radio Frequency Management System (ISRFMS) that can be implemented to mitigate or eliminate nonlinear distortion (including intermodulation products (IMPS), harmonics, and sidebands) of non-linear devices in a communication system.

Figure 44:
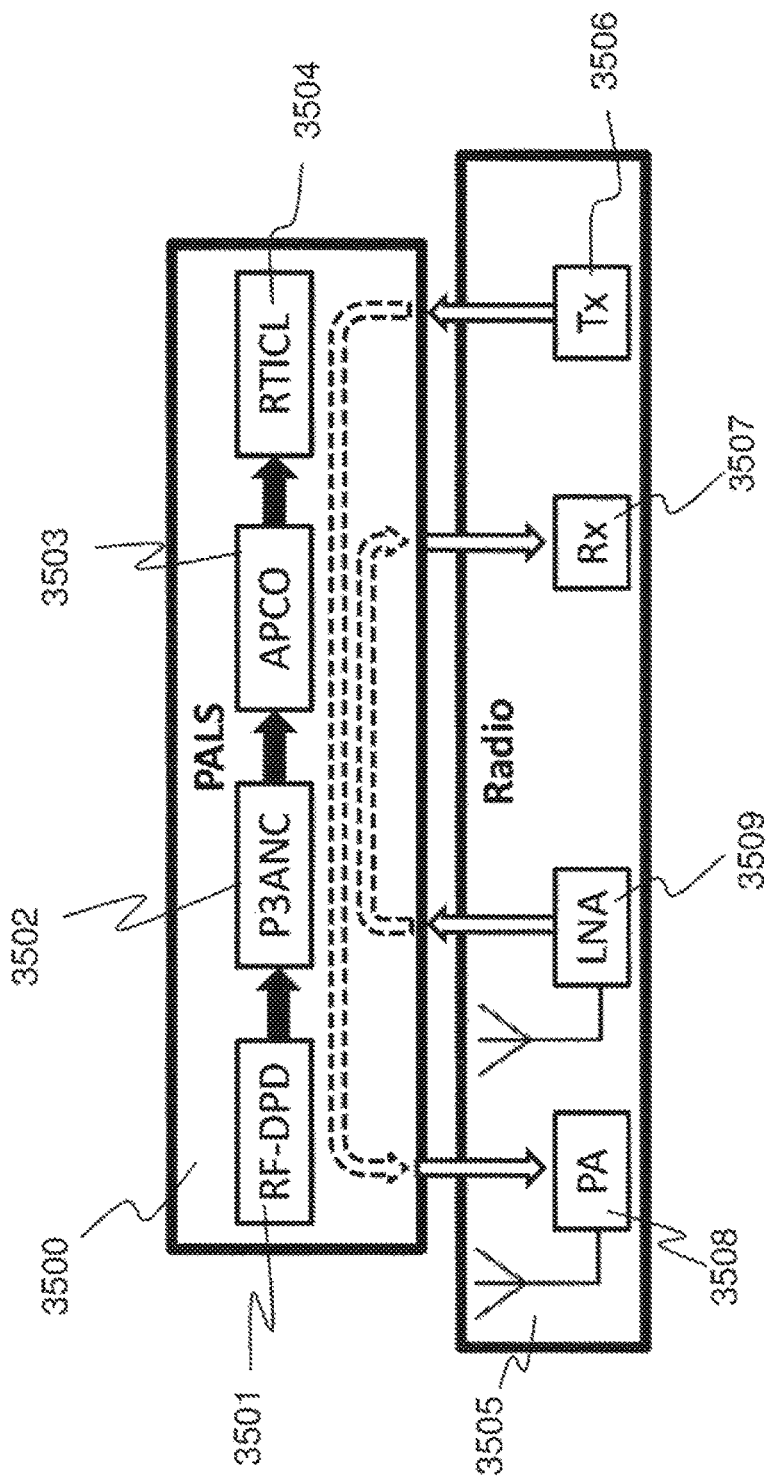
FIG. 44 is a diagram illustrating an example of an Integrative Software Radio Frequency Management System (ISRFMS) for mitigating or eliminating nonlinear distortion in accordance with one embodiment of the systems and methods described herein.

FIG. 44 is a diagram illustrating an example of an Integrative Software Radio Frequency Management System (ISRFMS) for mitigating or eliminating nonlinear distortion in accordance with one embodiment of the systems and methods described herein. Referring now to FIG. 44, in this example, the ISRFMS 3500 includes four innovative components: (1) an RF Digital Pre- or Post-Distortion Paradigm (RF-DPD) 3501; (2) a Parallel Pipelined Polynomial Algorithm for Nonlinear Compensation (P3ANC) 3502; (3) an Automated Polynomial Coefficient Optimizer (APCO) 3503; and (4) Remote Transmitter Impairments Compensated Locally (RTICL) 3504.

The ISRFMS 3500 may be integrated into a wide variety of RF systems. FIG. 44 shows an example of the ISRFMS 3500 integrated with a generic radio 3505. In this example, radio 3505 includes an RF transmitter 3506 and a receiver 3507. On the transmit side, ISRFMS 3500 is integrated in the radio 3505 between the transmit signal generator 3506 and the RF power amplifier (PA) 3508. In some embodiments, the ISRFMS 3500 can be implemented as a Predistortion-based Adaptive Linearization System (PALS).

On the receive side, ISRFMS 3500 is integrated in the radio between the low-noise amplifier (LNA) 3509 and the receive signal acquisition 3507. Although both PA 3508 and LNA 3509 may include one or more stages, only one is shown in FIG. 44 for clarity of illustration. Also, the ISRFMS 3500 may be integrated into the receive segment of the radio, the transmit segment of the radio, or both segments.

RF Digital Pre- or Post-Distortion Paradigm (RF-DPD) 3501 can be implemented and configured to provide an effective and versatile methodology for addressing the source of nonlinearity in an RF system. Parallel Pipelined Polynomial Algorithm for Nonlinear Compensation (P3ANC) 3502 can be implemented and configured to enable effective implementation of the RF-DPD paradigm, in some embodiments with readily-available commercial-off-the-shelf hardware components. Automated Polynomial Coefficient Optimizer (APCO) 3503 can be implemented and configured to adapt to changes in the nonlinear response of the RF system; and a remote impairments compensation module, or Remote Transmitter Impairments Compensated Locally (RTICL) 3504, can be implemented and configured to add the capability to compensate for nonlinearities in received signals not necessarily generated within the receiver itself, including algorithms for Adaptive Exfiltration of Spectral Signals (ADESS) from wideband spectral data.

In accordance with various embodiments, a new class of Wideband Adaptive Intelligent Software-Defined Radio (WAISDR) is provided, integrating ISRFMS components, listed above, with additional radio components to provide advanced radio capabilities. These capabilities could not be implemented with prior art approaches, and embodiments may be configured to address two fundamental challenges of any software-defined radio (SDR) system: computational efficient processing of wideband signals, and mitigation of nonlinear artifacts from the analog RF front end.

In various embodiments, ISRFMS may be configured to enable postdistortion to be implemented on a receiver to compensate for nonlinear effects external to the receiver, for example from a remote nonlinear transmitter—we refer to this capability as Remote Transmitter Impairments Compensated Locally (RTICL).

Figure 45:
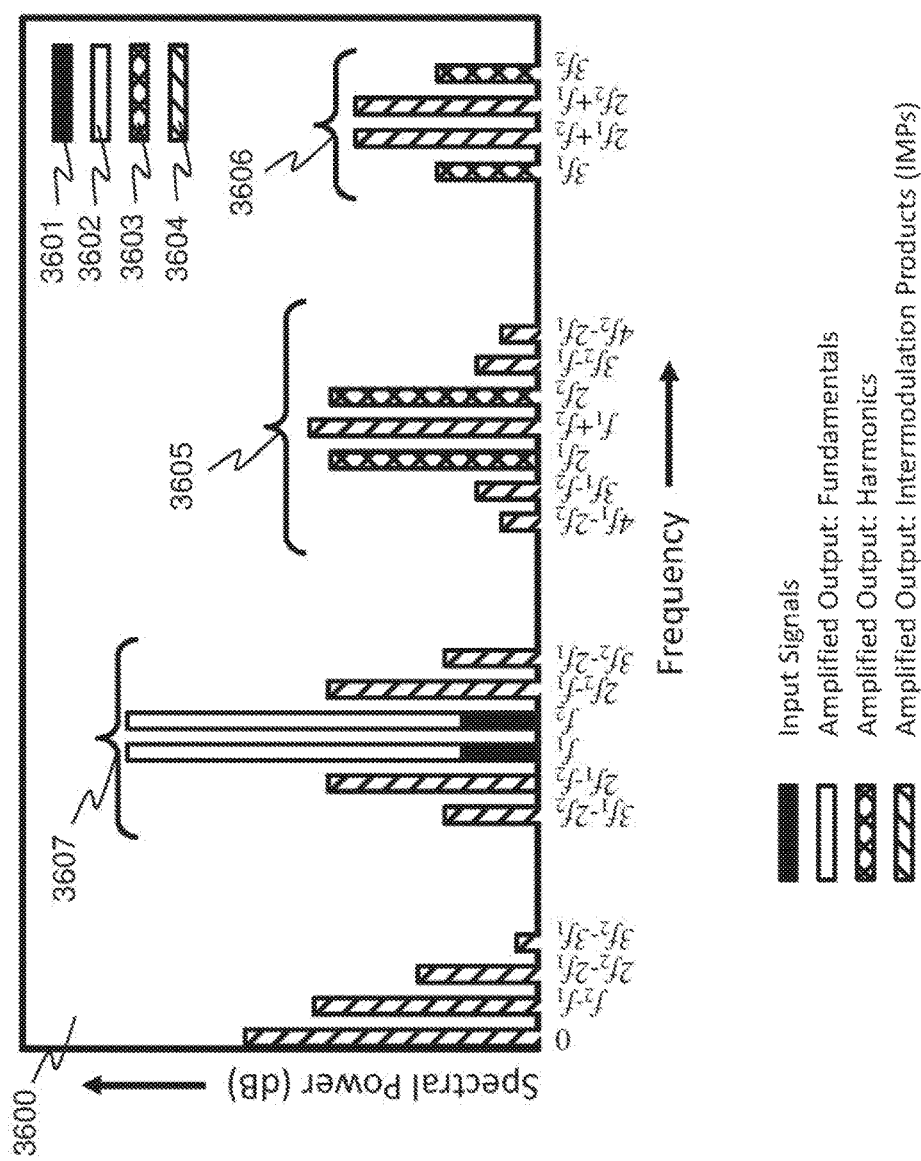
FIG. 45 shows an example of the RF frequency spectrum at the output 200 of a nonlinear amplifier.

FIG. 45 shows an example, based on measured data obtained by the inventors, of the RF frequency spectrum at the output 3600 of a nonlinear amplifier. In this case, an input signal 3601 having two tones, $f_1$ and $f_2$, is supplied to the input port of the amplifier. The amplified signals at the output port contain these two fundamental signals 3602 at a power level determined by the linear gain of the amplifier. A whole host of additional signals also exit the amplifier, including harmonics (multiples) of the fundamental signals 3603 and intermodulation products (multiples of additive combinations of the fundamental signals) of the two fundamental frequencies 3604. These nonlinear products can also be grouped according to the harmonics around which they are centered. Higher order harmonic bands, such as the $2^{nd}$ harmonic band 205 or the $3^{rd}$ harmonic band 3606, can sometimes be removed or reduced at the transmit or receive segment by use of bandpass filters. However, it is much harder to use bandpass filters to remove nonlinear components in the fundamental band 3607 due to the sharp roll-off required of the filter to avoid attenuation of the fundamental frequencies 3602.

Figure 46:
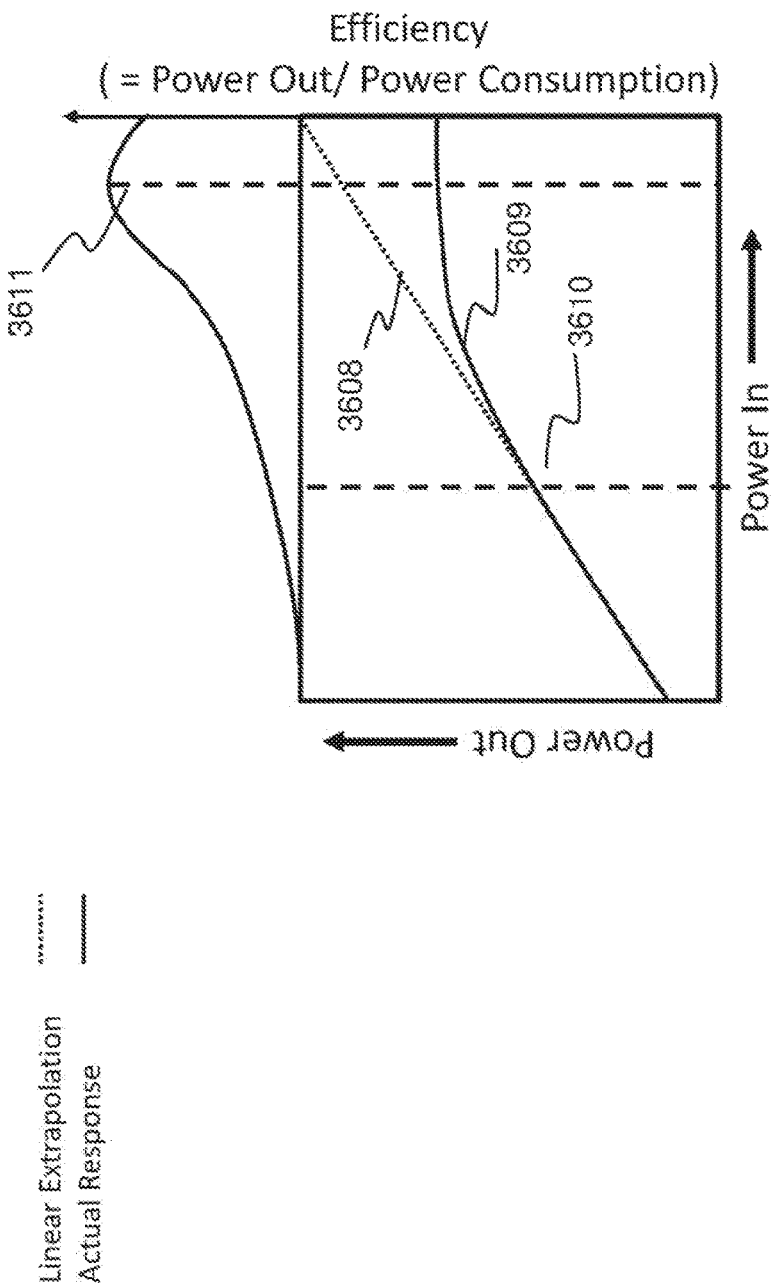
FIG. 46 is a diagram illustrating a comparison of a working point for conventional state-of-the-art (SOTA) and nonlinear compensation in accordance with various embodiments of the systems and methods described herein.

FIG. 46 is a diagram illustrating a comparison of a working point for conventional state-of-the-art (SOTA) and nonlinear compensation in accordance with various embodiments of the systems and methods described herein. The example of FIG. 46 shows a simplified transfer function (power out versus power in) for an amplifier. In practice, above 1 dB compression point (P1 dB 3610) of the amplifier, the amplifier response deviates from the ideal linear response 3608 to follow a nonlinear curve 3609. The simplest approach to maximizing the linearity of the PA would therefore be to operate it backed off from its 1 dB compression point (P1 dB). However, the amplifier is much less power efficient in this regime. In fact, for many amplifiers, the maximum efficiency point 3611 is well within the nonlinear regime of the amplifier. Therefore, this back-off approach would result in using a larger, more costly amplifier operated at less-than-optimal efficiency.

Predistortion methods, in which the input signal to the amplifier is predistorted to compensate for nonlinearities in the amplifier response, do not require modification of the amplifier, and they are intrinsically compatible with high power amplifiers (as they operate on the relatively low-power input signal to the amplifier). Predistortion approaches are quite versatile, and are generally compact, low-cost, low-power solutions, as they can be applied in software mode to a digitally-generated waveform, or via a hardware toolkit that contains mixed signal and digital signal processing hardware to process the analog waveform.

In contrast to conventional systems that apply predistortion to baseband and intermediate frequency (IF) signals, embodiments of the ISRFMS may be configured to compensate for the nonlinearity itself, rather than compensating for individual nonlinear signals. Accordingly, such embodiments may be much more effective when applied to radios that operate with wideband, dense signal sets. Embodiments of the ISRFMS achieves this by operating directly on the full RF carrier signal entering the amplifier, which is referred to herein at times as digital predistortion (RF-DPD). This is differentiated over conventional digital predistortion, which operates on baseband signals much further from the main source of nonlinearity (typically the RF power amplifier), as shown in FIG. 46.

Moving the predistortion closer to the amplifier in the RF chain has been performed by the inventors using both analog RF predistortion, and digital RF predistortion, measurement test results of which are provided below. However further embodiments of the systems and methods disclosed herein provide a nonlinear compensation methodology to effectively and efficiently implement this RF-DPD paradigm using innovative nonlinear compensation functions and algorithms and readily-available hardware components. Comparison between example implementations of these two embodiments are shown in FIG. 47A and FIG. 47B.

Figure 47A:
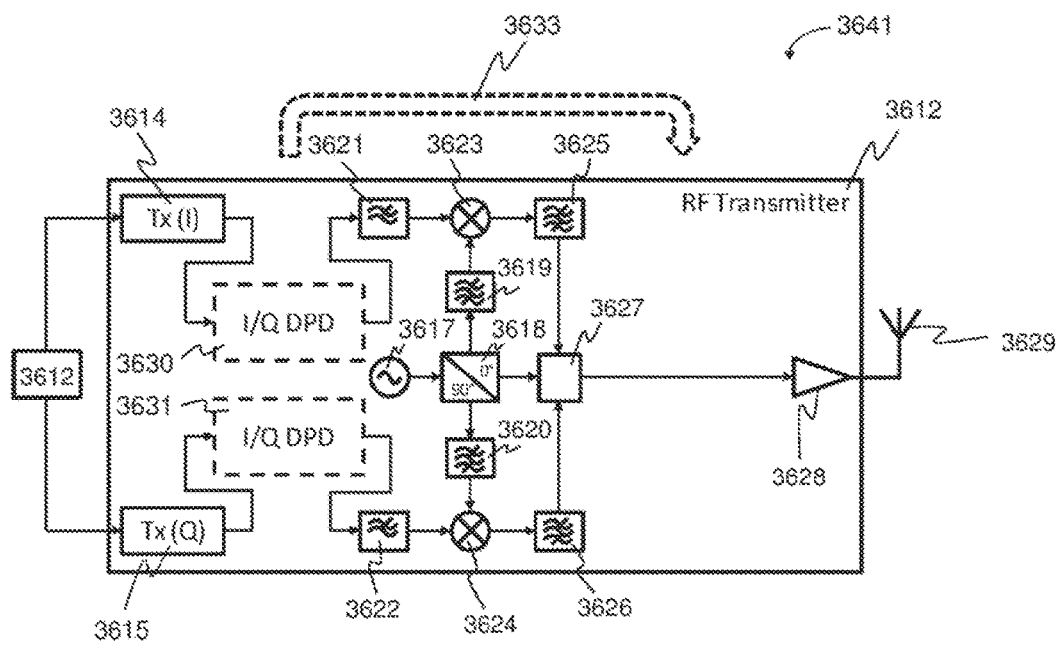
FIG. 47A illustrates a digital predistortion (DPD) operating on baseband I/Q signals in accordance with embodiments of the technology disclosed herein.
Figure 47B:
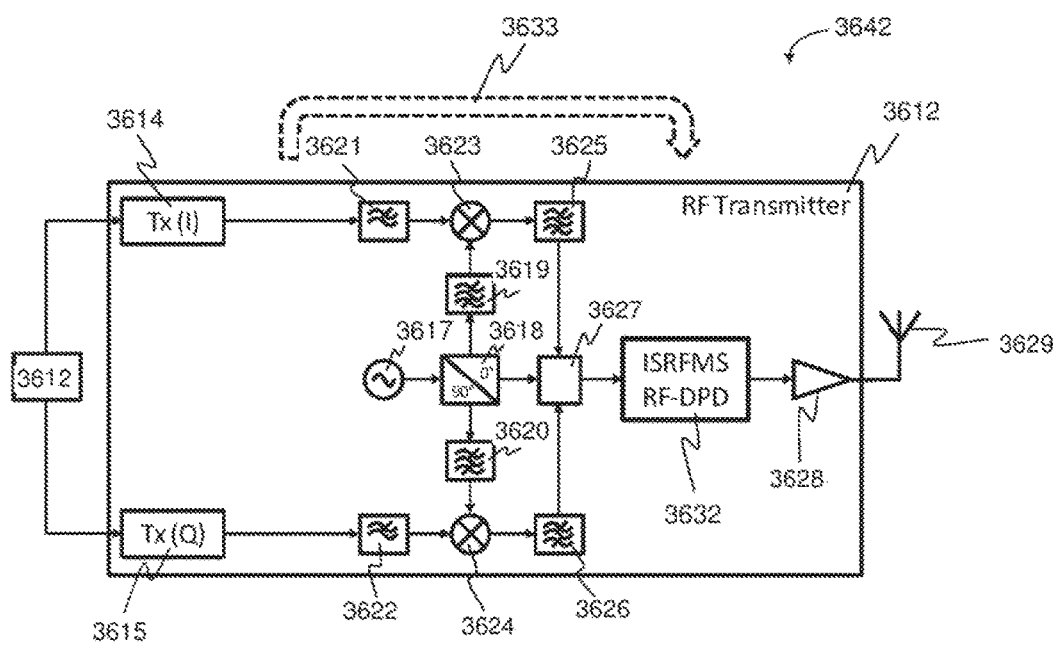
FIG. 47B illustrates a RF-DPD operating on the RF signal in accordance with embodiments of the technology disclosed herein.

FIGS. 47A and 47B illustrates a comparison of digital predistortion (DPD) operating on baseband I/Q signals 3641, and the RF-DPD operating on the RF signal 3642 in accordance with embodiments of the technology disclosed herein. Referring now to FIG. 47A, this example illustrates an RF transmitter 3612, in which the signal to be transmitted 3613 is encoded into in-phase (I) 3614 and quadrature (Q) 3615 components, then upconverted to the RF carrier frequency by means of an upconverter, also sometimes referred to as a tuner or a modulator. The illustrated upconverter includes lowpass filters 3621, 3622, mixers 3623, 3624, bandpass filters 3619, 3620, 3625, 3626, RF oscillator 3617, 90-degree RF splitter 3618, and RF coupler 3627. The signal is then amplified at the RF carrier frequency by an RF amplifier 3628 prior to exiting the transmit antenna 3629. The upconverted signal could be constructed from analog RF hardware components or digital RF software components.

In the embodiment 3641, as illustrated in FIG. 47A, the digital predistortion (DPD) 3630, 3631 is applied to the I/Q signals, where this predistortion is applied away from the primary source of nonlinearity, which is the RF power amplifier 3628. In contrast in the second embodiment 3642, as illustrated in FIG. 47B, the ISRFMS RF-DPD 3632 acts on the RF signal entering the amplifier 3628. Since the nonlinear compensation has been moved from a point distant from the nonlinearity to a point closer to the primary source of the nonlinearity in this second embodiment 3642, the nonlinear compensation can be more effective as compared to the first embodiment 3641.

To reduce the nonlinear effects of an amplifier through predistortion, in various embodiments a mathematical model of the nonlinear response may be created and used to generate an inverse of the nonlinearity. This inverse is then applied to the input signal of the amplifier to cancel out some or all of the nonlinearities. Signal nonlinearities can be divided into three main categories: (1) memoryless (static) nonlinearities; (2) nonlinearities with linear memory; (3) nonlinearities with nonlinear memory. In systems with memoryless nonlinear response, the instantaneous output value, y, is a function of only the instantaneous input value, x. Although this is the simplest category of nonlinear response, it often forms a good starting point for introducing memory effects. Two simple conventional functions that may be used to qualitatively model a static nonlinearity are: the hyperbolic tangent, $y=\tan h(x)$, and the inverse tangent, $y=\arctan(x)$. Both functions are linear for small values of x, and saturate at a constant value for large (positive or negative) values of x. Other models of static nonlinearity are the Saleh model and Hetrakul-Taylor model. These functions have only a few tunable parameters, and hence are limited to specific nonlinear responses. More general approaches use series models, such as power series and Fourier series, which can have an unlimited number of tunable parameters in principle.

The next level of complexity in modeling nonlinear response involves the introduction of linear memory. This is equivalent to a frequency-dependent static model. Thus, many models of nonlinear responses with linear memory are based on the above static models, but with frequency-dependent parameters. The frequency degree of freedom is accounted for in real-time nonlinearity compensation methods by adding a second dimension to the LUT or compensation function, indexed by the (current-previous) value, which effectively is a measure of the instantaneous rate of change of the signal.

Nonlinear models with nonlinear memory are the most complex of the nonlinear models. The most common, although not necessarily the simplest, models in this category are the Volterra series-based models. The Volterra series approach takes the convolutional integral description of a causal linear system with memory, and combines it with a power series model of a memoryless nonlinear system.

Embodiments of the systems and methods described herein provide a nonlinear model that provides accuracy and versatility while reducing or minimizing computational complexity in order to operate on high-throughput (e.g. 50 Gbps or more) RF digital data streams with reduced or minimal hardware size, weight, and power consumption required for practical implementation.

Further embodiments of the systems and methods described herein provide a nonlinear model that can be implemented within the RF-DPD paradigm and methodology, i.e. the nonlinear compensation is applied to the RF carrier signal. With conventional models, the input and output signals (x and y), as well as the model parameters, are complex-valued (containing real and imaginary components), since the models were designed to operate on baseband I/Q data with the RF carrier frequency removed. In some cases, as in the Saleh model, the nonlinear model is specified in terms of amplitude and phase of the baseband signal, rather than I/Q. Neither case can be directly applied to nonlinear compensation of the full RF signal without modification to account for the inclusion of the carrier frequency.

RF Digital Predistortion (RF-DPD) in accordance with various embodiments may be configured to provide a versatile methodology that can be implemented with readily-available commercial-off-the-shelf hardware components, to reduce the nonlinear response of an amplifier by performing either a predistortion (on the input of a power amplifier) or a post-distortion (on the output of a low-noise amplifier) in the digital domain. This may be performed directly on the RF signal entering or exiting the amplifier. This may be referred to herein as RF Digital Pre(Post)Distortion (RF-DPD).

The biggest challenge in implementing digital processing of RF signals at the carrier frequency is developing algorithms that can be implemented with extremely high data throughput (e.g. 50 Gbps). To accommodate this, embodiments may be configured incorporating readily-available off-the-shelf analog-to-digital converters (ADCs), field programmable gate arrays (FPGAs), and digital-to-analog converters (DACs), with data rates and processing power sufficient for direct digital acquisition, processing, and generation of the full RF waveform. For example, silicon-based ADCs and DACs with sampling rates of 5 GHz and 10-bit resolution per sample may be used, as may off-the-shelf components with greater than a 50 GHz sampling rate, which are becoming available commercially. Although the technology disclosed herein does not require specific hardware components for implementation, these readily available state-of-the-art digital signal processing components may be used.

Figure 48:
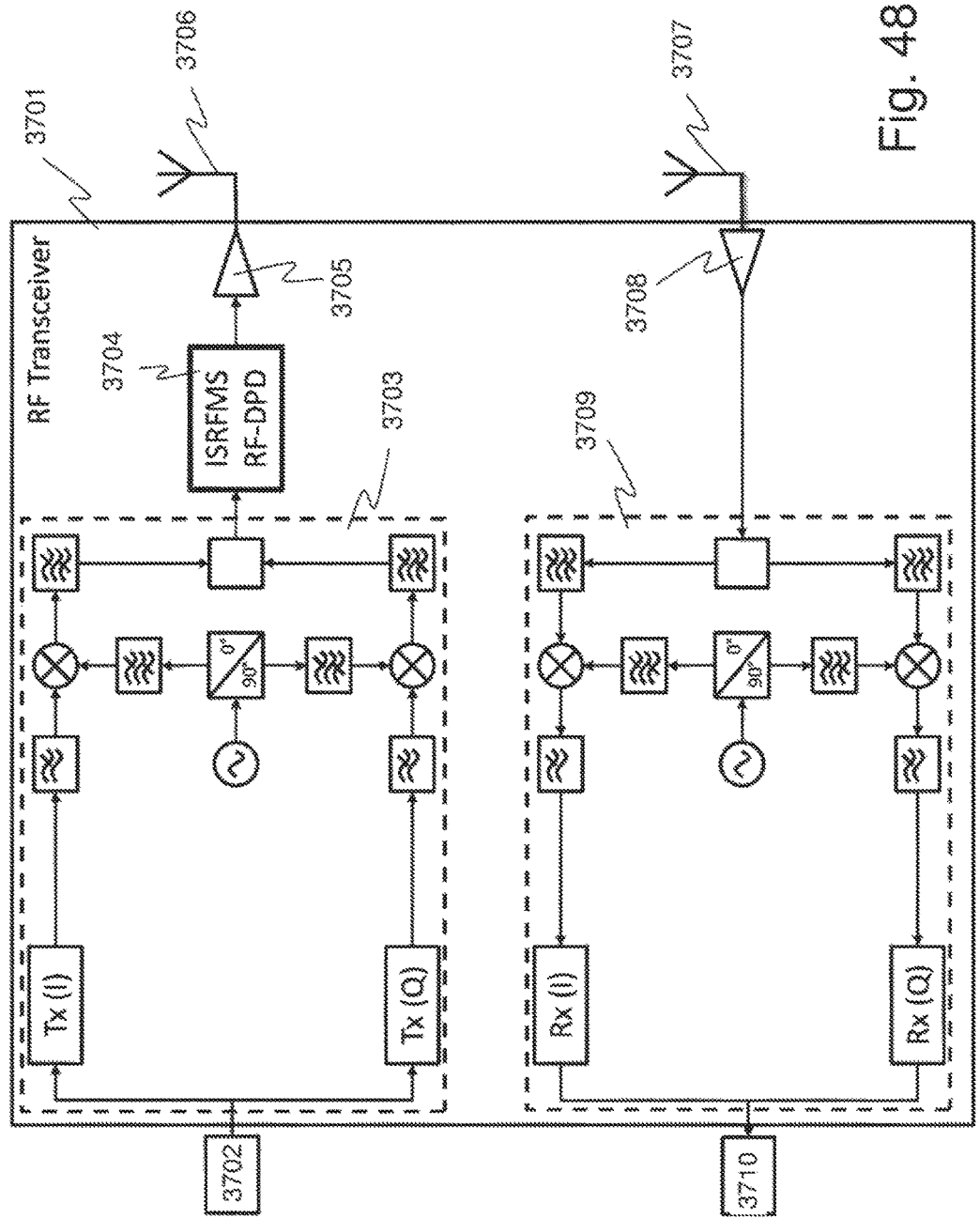
FIG. 48 is a diagram illustrating an example RF transceiver with the ISRFMS RF-DPD integrated into the RF transmitter in accordance with one embodiment of the technology described herein.

One implementation of the above nonlinear compensation methodology incorporates digital RF predistortion for reducing nonlinear components in the output signal of a radio transmitter. The term radio transmitter is used herein to refer to any RF transmitter that generates an RF output signal by using an RF mixer (analog or digital) to upconvert a baseband or IF signal to a desired RF carrier frequency. This includes the majority of conventional radios in use today, including commercial cellular phones, and most software-defined radios (which typically generate baseband or IF signals in software). FIG. 48 is a diagram illustrating an example RF transceiver with the ISRFMS RF-DPD integrated into the RF transmitter. Referring now to FIG. 48, this example shows an RF transceiver 3701. The information to be transmitted 3702 is encoded and upconverted 3703 whereupon the signal nonlinearity is compensated via RF digital predistortion 3704. The compensated signal is amplified by an RF power amplifier 3705 and transmitted over the air by a transmit antenna 3706. The receive antenna 3707, receives over-the-air RF signals, amplifies them via a LNA 3708, then extracts the message information 3710, via a downconverter (analog or digital) 3709.

The dominant nonlinear response is normally introduced by the power amplifier. However, the nonlinear compensation methodology in accordance with the systems and methods disclosed herein can also compensate for other sources of nonlinearity in the RF chain, such as the RF coupler, mixers, ADC, or DAC. However, to maximize the effectiveness of the nonlinear compensation, the ADC and DAC are preferably operated with input signals at levels that the nonlinear effects from these components are negligible. This can be achieved through insertion of appropriate attenuators at the input ports of the ADC and DAC, as required. Note that, unlike conventional predistortion methods that attempt to compensate for the nonlinear response of the amplifier at a point in the RF chain far removed from the primary source of the nonlinearity, digital RF predistortion approaches according to various embodiments perform the nonlinear compensation closer to the source of the non-linearity and indeed as close to the source of the nonlinearity as is possible, e.g., right next to the amplifier. The resultant simplification of the nonlinear compensation process enables this method to compensate for the nonlinear response itself, rather than simply cancelling individual signals resulting from the nonlinear response.

Another implementation of the above nonlinear compensation methodology incorporates RF digital postdistortion (RF-DPD) for reducing nonlinear components in a radio receiver. The term radio receiver can be used to refer to any RF receiver that acquires a signal by using an RF mixer (analog or digital) to downconvert a baseband or IF signal from the RF carrier frequency. This definition includes the majority of conventional radios in use today, including commercial cellular phones, and most software-defined radios (which typically generate baseband or IF signals in software).

Figure 49:
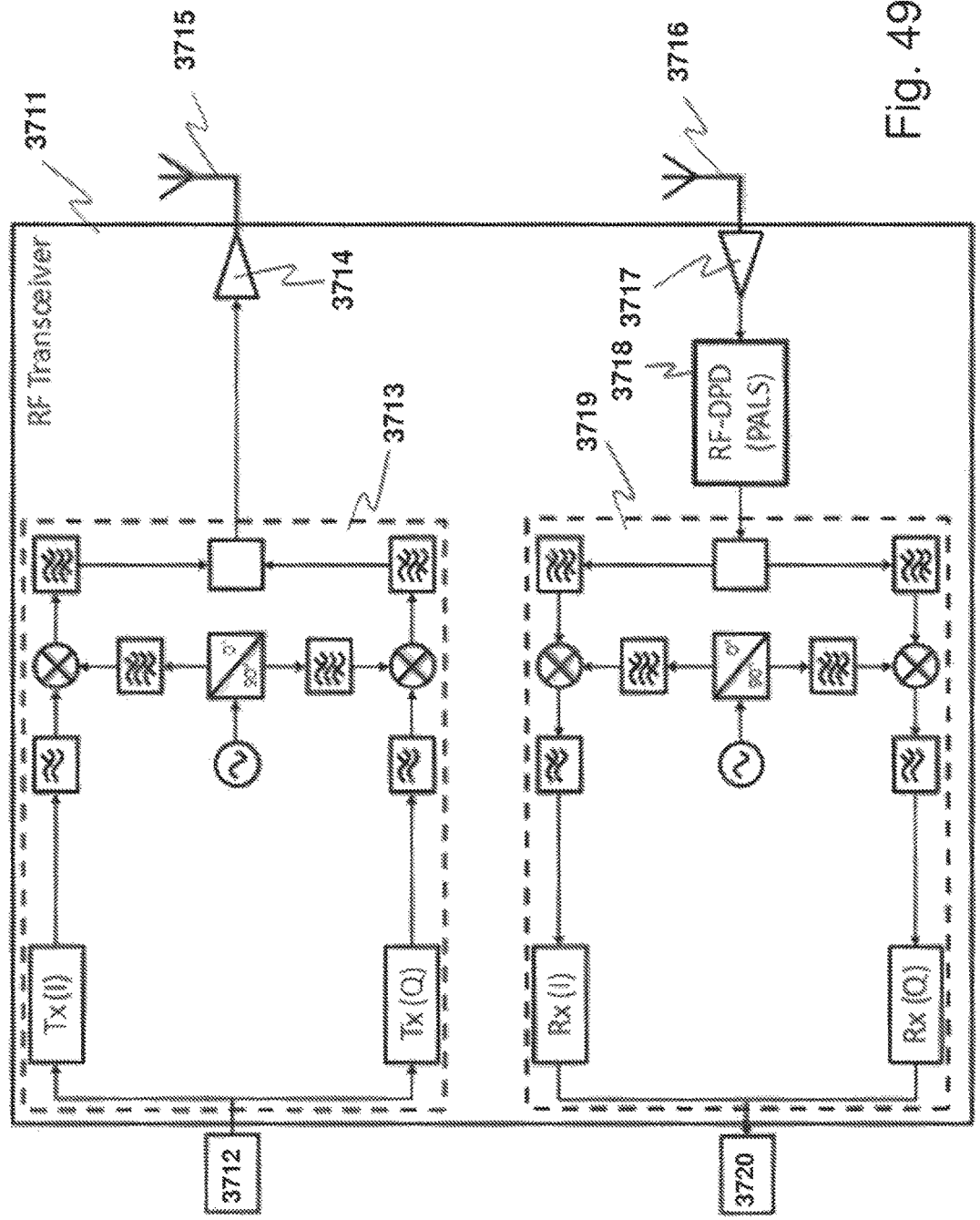
FIG. 49 illustrates a RF transceiver with an ISRFMS RF-DPD integrated into the RF receiver in accordance with one embodiment of the systems and methods described herein.

FIG. 49 illustrates a RF transceiver with an ISRFMSRF-DPD integrated into the RF receiver in accordance with one embodiment of the systems and methods described herein. In the example of FIG. 49, the RF transceiver 3711 includes a source of information to be transmitted 3712, a transmit block 3713 to encode and upconvert the information signal, and an RF power amplifier 3714, to up convert the amplified signal, and a transmit antenna 3715 to transmit the RF signal over the communication channel (e.g., the air). The receiver includes a receive antenna 3716 to receive over-the-air RF signals, a LNA 3717 to amplify the received signals, a RF digital postdistortion block 3718 to compensate for signal nonlinearity, and a receiver block 3719 to recover the message information, via a downconverter (analog or digital).

In most communication receivers, and the dominant nonlinear response is normally generated by the low-noise amplifier, which is why nonlinear compensation may be referred to as a postdistortion. However, the nonlinear compensation methodology can also compensate for other sources of nonlinearity in the RF chain, such as the RF splitter, mixers, ADC, or DAC. However, to maximize the effectiveness of the nonlinear compensation, the ADC and DAC should be operated with input signals at levels that the nonlinear effects from these components are negligible. This can be achieved through insertion of appropriate attenuators at the input ports of the ADC and DAC, as required. The digital RF postdistortion will offer most benefits when used with high amplitude, wideband, input signals, whose nonlinear sidebands can effectively reduce the sensitivity of the receiver.

Figure 50:
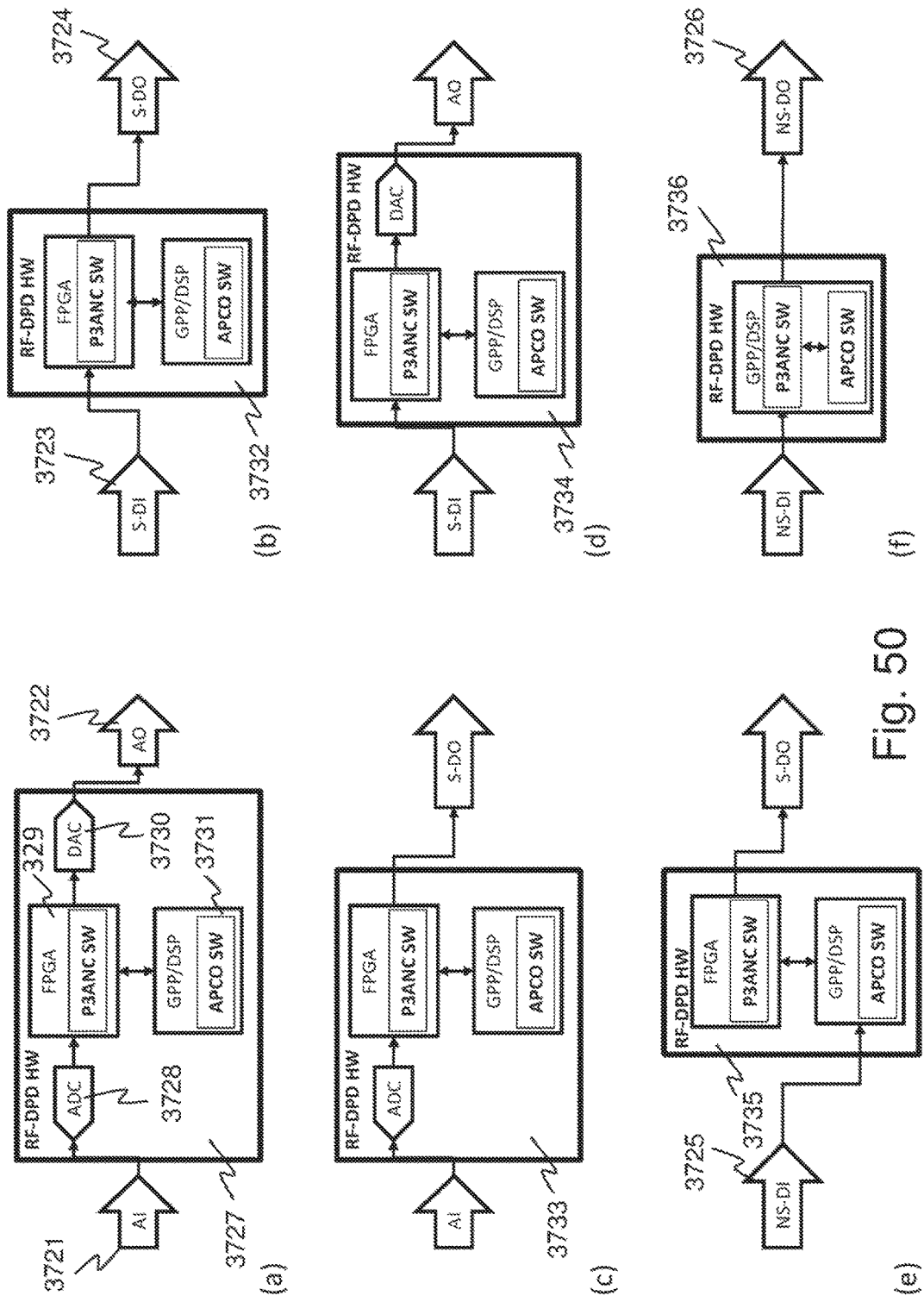
FIG. 50 illustrates an example of input/output versatility of the ISRFMS RF-DPD in various embodiments.

FIG. 50 illustrates the input/output interface versatility of the ISRFMSRF-DPD in various embodiments by showing example implementations of the RF-DPD paradigm with analog input signals 3721, analog output signals 3722, streaming digital input signals 3723, streaming digital output signals 3724, non-streaming digital input signals 3725, and non-streaming digital output signals 3726.

The analog input—analog output case 3727 shown in part (a) FIG. 50 is the most versatile, but not necessarily the most power efficient, as it involves digitizing the analog signal with an ADC 3728 then reconverting back to an analog signal with a DAC 3730. The FPGA 3729 inserted between the ADC and DAC performs real-time nonlinear compensation with the P3ANC implemented as FPGA firmware. A general purpose processor (GPP) or digital signal processor (DSP) may be included as part of the APCO subsystem (further described below with reference to FIG. 53), or, if adaptive capabilities are not required for the application, the GPP/DSP may be used as a simple control interface to allow the user to set the P3ANC coefficients.

In cases where FMS is to be applied and is largely built from analog components, then the analog input-analog output case, 3727, may be a desirable approach for integrating FMS with the radio. However, in radios where a DAC is used to generate the RF signal, the streaming-digital-input/streaming-digital-output implementation 3732 (part (b) of FIG. 50) may be more effective and efficient, as the number of conversions between analog and digital domains can be reduced or minimized. Here, the term "streaming" is used to denote a continuous data flow, typically implemented on real-time hardware, such as an FPGA.

Depending on the exact hardware configuration within the radio, two hybrid modes 3733, 3734 can be implemented, which use either an ADC or a DAC, respectively to convert from, or to an analog signal. An example of this is shown in part (c) and part (d) of FIG. 50.

Yet another example implementation case is for a non-streaming digital input with a streaming digital output 3735, which is shown in part (e) of FIG. 50. This case could arise, for example, when the digital RF waveform is defined within the ISRFMS itself. For example, the non-streaming digital input could include a script of signals, that are to be generated in the GPP/DSP/FPGA. Another example is a repeated signal, where the non-streaming input includes the sample of the waveform to be repeated, and the FPGA generates a streaming output by repeatedly sending this waveform sample.

A further example implementation case involves non-streaming digital input and output signals 3736, as shown in part (f) of FIG. 50. In this example, no real-time hardware (e.g. FPGA) is involved, and all ISRFMS algorithms are implemented on a non-real-time computing platform, such as a GPP or DSP. This is equivalent to offline processing of data, to be supplied to the radio for processing by separate hardware.

One challenge with implementing digital predistortion or postdistortion in real time on a full RF waveform is defining a nonlinear compensation algorithm that makes good use of the available hardware resources. Specifically, the maximum clock rate at which an arithmetical operation can be performed on a FPGA is typically in the 50-500 MHz range. The actual maximum will in general depend on numerous factors, including the FPGA hardware design, the resource usage on the FPGA, and the architecture of the algorithm. In general, the more complex and sophisticated the algorithm, the lower the maximum clock rate the FPGA will support. Pipelining of FPGA code can partially mitigate this issue. On the other hand, ADCs can digitize incoming analog RF signals at over 5 GHz. To operate on this large digitized signal bandwidth without loss of data, the FPGA code is preferably readily parallelizable, i.e. able to be implemented in multiple parallel instantiations.

Accordingly, various embodiments of the systems and methods disclosed herein use a polynomial in the input signal value and input signal derivative to model and compensate for the nonlinear response of an RF transmit or receive system. A polynomial can be advantageous in various embodiments as it can be adjusted in real-time or near-real time as conditions change. A polynomial model contains only adders and multipliers, making it suitable for pipelined implementation on a high-throughput FPGA. Because it depends only on the instantaneous value and derivative of the input signal, the input datastream can be deserialized in the FPGA and multiple instantiations of the polynomial can be implemented simultaneously—this enables extremely high data processing rates to allow direct processing of the full RF waveform.

Another benefit of a polynomial model is that it is highly versatile, and can be applied to RF nonlinearities of diverse physical origins, including, but not limited to, solid state and travelling-wave tube (TWT) amplifiers, ADCs, DACs, couplers, and any combination of these components in a system. A polynomial model can also provide a simple way to trade off model complexity for performance by adding or removing terms in a polynomial. Typically no more than six orders are needed in the polynomial, for reduction of most nonlinear spurious signals.

The signal derivative, (or in practice for discretely sampled data, the difference between successive signal values) is included in the polynomial in addition to the input signal value to provide control over the phase of the output signal. Recall that for conventional nonlinear modeling, the model coefficients may be complex or include separate coefficients for amplitude and phase of the input/output signals. This additional degree of freedom is provided in various embodiments of the nonlinear model by the signal derivative.

Figure 51:
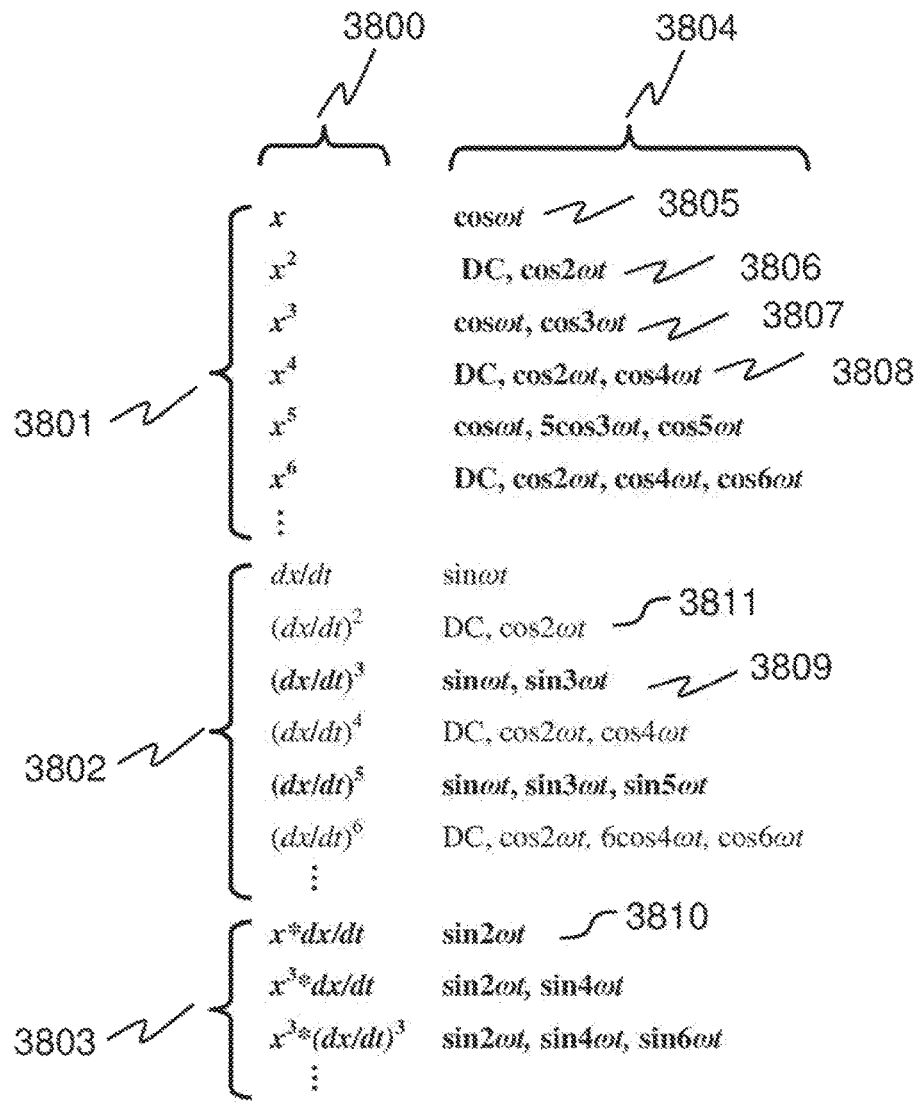
FIG. 51 illustrates examples of terms that may be included in the ISRFMS P3ANC polynomial as well as resultant harmonics from each term in the polynomial.

Still further embodiments may be configured to use a polynomial containing specific products of the input signal value, x, and the input signal derivative with respect to time, dx/dt, to compensate for RF nonlinearities as a pre-distortion or post-distortion. FIG. 51 illustrates examples of terms 3800 that may be included in the polynomial. Also shown in FIG. 51 are the resultant harmonics 3804 from each term in the polynomial. To illustrate the phase content of each term, consider an input function x=A cos ωt as an example to demonstrate the approach. Embodiments may be configured to apply this method to more general input functions by decomposing these input functions into their Fourier components. For the above input function, the linear term generates components proportional to cos ωt, 3805.

As a rule, the number of terms to be included in the polynomial should be the minimum needed to provide the necessary reduction of nonlinear signal content in the output signal, in order to obtain maximum benefit with the least amount of hardware resource usage, which in practice may result in reduction in size, weight, power consumption, and cost of the hardware on which the P3ANC is implemented.

The simplest choice of terms to include in the P3ANC polynomial are products of the input signal value. Pure products of the value alone 3801 generate only cosine harmonics, such as the $2^{nd}$ harmonic cosine generated by the $x^2$ term 3806. If significant phase delays exist in the nonlinear response (and for high-frequency signals, which likely to be the case in practice), then these cannot be compensated for by the products of the value alone 3801, and products of the input signal derivative (or difference between current and previous value, for a discretely sampled signal) 3802, must be included. For example, $x^3$ generates a $3^{rd}$ harmonic cosine term 3807, and $(dx/dt)^3$ generates a $3^{rd}$ harmonic sine term 3809, providing full phase control over the $3^{rd}$ harmonic.

However, using pure products of the value 3801, or derivative 3802, separately does not provide phase control of the even harmonics. For this purpose, mixed products of the value and derivative 3803 must be included. For example, $x^2$ generates a $2^{nd}$ harmonic cosine term 3806, and $x*(dx/dt)$ generates a $2^{nd}$ harmonic sine term 3810, providing full phase control over the $2^{nd}$ harmonic.

As these examples illustrate, some products generate redundant harmonic content (for example $x^2$ 3806 and $(dx/dt)^2$ 3811), and therefore one of these can be excluded from the polynomial. In general, a product without derivatives will be chosen over a product with derivatives, as the implementation of a product without derivatives in real-time software consumes fewer hardware resources (fewer operations and less memory usage). Also, lower order products should be chosen over higher order products for the same reason. Exceptions to these rules can arise when it is known that specific orders dominate the nonlinear response, in which case a higher order product may be chosen over a lower order product, or a product with derivatives may be chosen over a product without, in order to improve the effectiveness of the nonlinear compensation. For example, many nonlinear systems have a highly anti-symmetric response function (i.e. y(-x)=-y(x)), and therefore products of the input signal or derivative that are anti-symmetric under inversion (e.g., odd powers of the input signal value, such as $x^3$, $x^5$, . . . ) will dominate the nonlinear response. In such a case, an odd-power with higher order may be included in the polynomial in detriment of an even-power with lower order to maximize the effectiveness of the nonlinear compensation, as expressed in the reduction of nonlinear signals (harmonics and IMPs) in the output signal.

The products listed in FIG. 51 are examples, and those skilled in the art after reading this description will be able to devise higher order terms using the same methodology and criteria shown in FIG. 51. The products marked in bold are those (up to sixth order) that provide non-redundant control of the output signal amplitude and phase at each harmonic. Whether all of these are included in a practical implementation of the ISRFMS P3ANC, or a reduced subset is used, will depend on the available computational resources, and/or latency constraints of the application.

A suitable embodiment of the disclosed technology is operable with five nonlinear terms (although other quantities of terms can be used) in the polynomial (in addition to the zero order and first order terms), although other functional combinations will also be apparent to those skilled in the art. One example of a nonlinear polynomial, using only products of the input signal value 3801 up to order six, as modified by coefficients, $a_y$, is:

$$y = a_0 + a_1 x + a_2 x^2 + a_3 x^3 + a_4 x^4 + a_5 x^5 + a_6 x^6 \tag{5}$$

In measurements of nonlinear compensation of RF amplifiers, the inventors have discovered that polynomials such as Eq. (5) could reduce nonlinear spurious signals (harmonics and IMPs) in the output signal by 20-30 dB.

Another example embodiment is a form of Taylor Series with multiple terms using a novel combination of input signal values and differential terms in the nonlinear polynomial. A more particular example is shown in Eq. (6), which is formed using a combination of input signal value 3801 and derivative products 3802 as:

$$y = a_0 + a_1 x + a_2 x^2 + a_3 x^3 + a_4 x^4 + a_5 \left(\frac{dx}{dt}\right)^3 + a_6 \left(\frac{dx}{dt}\right)^5. \quad (6)$$

In measurements of nonlinear compensation of RF amplifiers, the inventors have discovered that polynomials such as Eq. (6) could reduce nonlinear spurious signals in the output of the amplifier by up to 70 dB.

Yet another example embodiment uses input signal values, differential terms, and mix terms combining input signal values and differential terms. A particular example of a nonlinear polynomial formed using input signal value products, 3801, derivative products, 3802, and mixed products, 3803, is:

$$y = a_0 + a_1 x + a_2 x^2 + a_3 x^3 + a_4 x^4 + a_5 \left(\frac{dx}{dt}\right)^3 + a_6 x \left(\frac{dx}{dt}\right). \quad (7)$$

In measurements of nonlinear compensation of RF amplifiers, the inventors have discovered that polynomials such as Eq. (6) could reduce nonlinear spurious signals in the output of the amplifier by up to 70 dB.

In all of these examples, the coefficients $a_0$ through $a_6$ are real fixed-point or floating point numbers. It is noted that the optimal choice of terms to include in the P3ANC will depend on the characteristics of the RF nonlinearity in the frequency band of interest for the application.

Where the polynomial in Eq. (5) serves as the input signal, the system has somewhat limited ability to address all components of the nonlinear distortion, because this solution assumes that everything is constant and in phase. Therefore, the differential terms can be included to allow compensation for out-of-phase components. Various embodiments can be configured for nonlinear compensation using Taylor series polynomials like the ones in the above equations. In some embodiments, a number of terms can be optimized. Therefore, embodiments can be configured to construct a table of information, remove redundant components of the polynomial to minimize computation time, and perform the computations. In one example, the removal of redundant components favors components that are not in the derivative terms.

Figure 52:
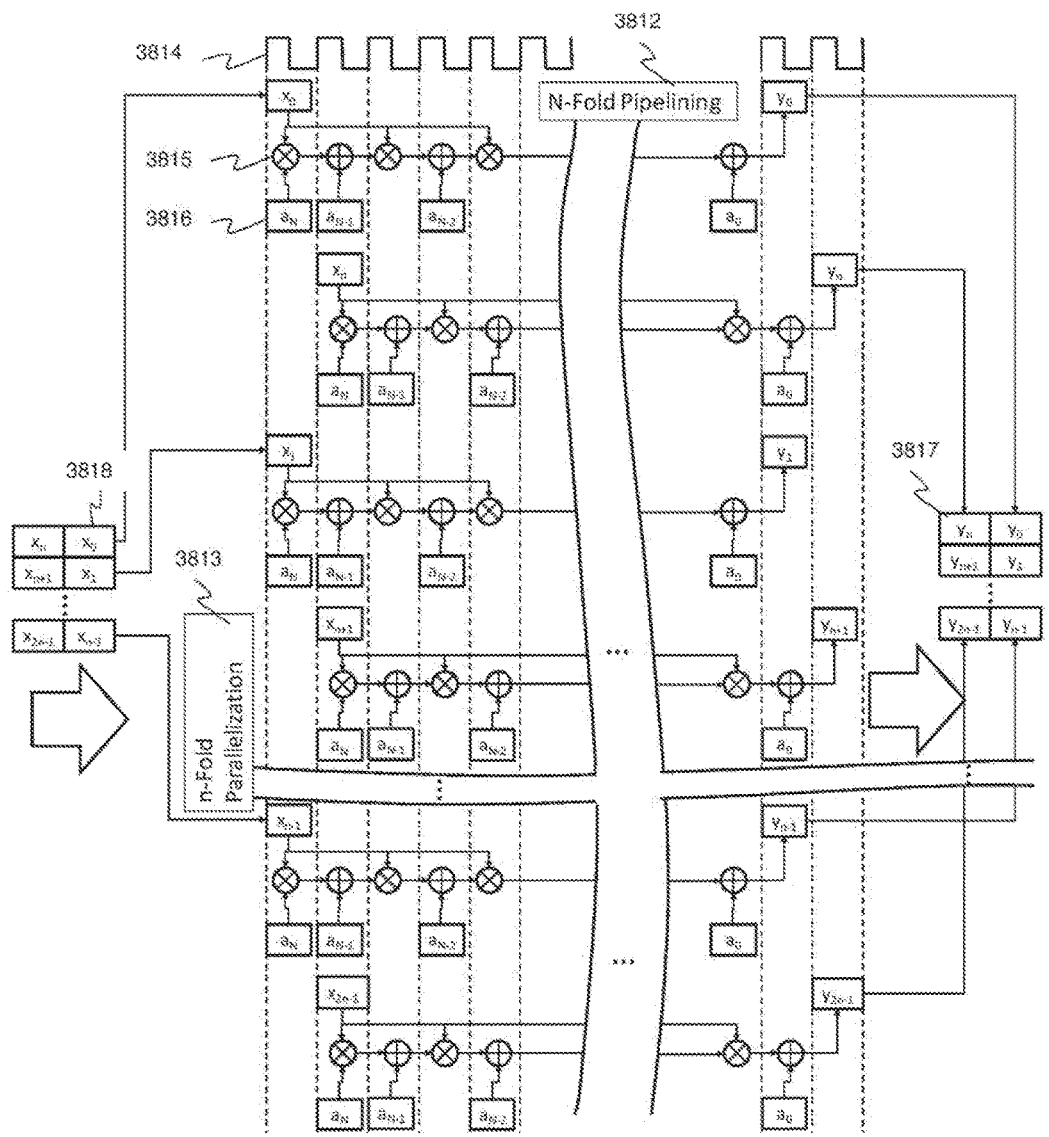
FIG. 52 illustrates an example algorithm for implementing the ISRFMS P3ANC polynomial nonlinear model on an FPGA in accordance with one embodiment of the systems and methods described herein.

An example algorithm for implementing the polynomial nonlinear model on an FPGA is shown in FIG. 52. In this example embodiment, n-Fold deserialized digital data (e.g. from an ADC) are processed with n instantiations in parallel 3813. For example, in one embodiment, data sampled at 5 GHz with 10-bit precision by the ADC is de-serialized by a factor of 16, and the polynomial operation is performed with 16 parallel instantiations 3813 on the FPGA, each processing data at an FPGA clock rate 3809 of 312.5 MHz.

The polynomial operation itself 3815, which in this example includes only addition and multiplication operations applied to the input signal value 3818, and the P3ANC coefficients 3816, are pipelined so that one operation (adder or multiplier) is performed in each clock cycle. The pipelining is performed N times 3812, where N is the number of P3ANC coefficients. For example, in one embodiment, the polynomial shown in Eq. 5 is pipelined six times. The latency (in FPGA clock cycles) is given approximately by twice the number of polynomial coefficients (one add and one multiply per coefficient). In one embodiment, where the FPGA clock rate is 312.5 MHz, and the number of polynomial coefficients is six, the latency is approximately 38 ns. The data is output 3817 (e.g. to a DAC) in the same deserialized format in which it entered. Because the data input rate is equal to the data output rate, the digital data flows continuously through the FPGA, without interruption, which is referred to at times herein as streaming digital data.

Various embodiments may be configured to automatically determine the optimal coefficients of the P3ANC polynomial nonlinear model for digitally predistorting the RF input signal to an amplifier, in order to reduce nonlinear components of the amplifier output signal specified by the user. The system may perform this automatic optimization of the nonlinear compensation at startup, providing a self-calibrating feature. It may also perform the automatic optimization process at periodic intervals while the amplifier is in operation, providing adaptability to changes in the amplifier nonlinear response over time. The system can include an analog hardware design as well as algorithms for calculating the optimal predistortion coefficients.

Figure 53:
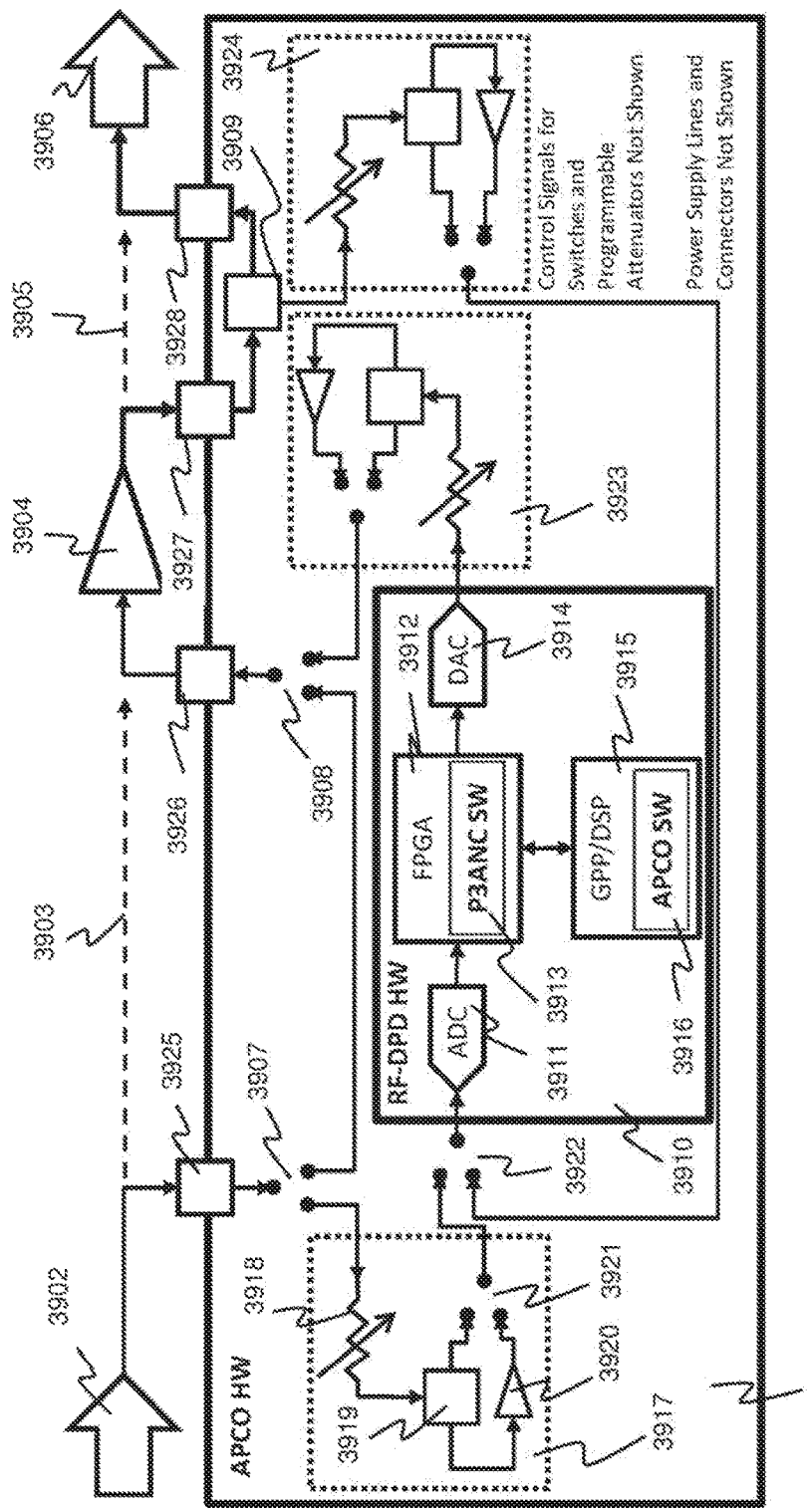
FIG. 53 is a diagram illustrating an example APCO system for adaptive and self-calibrating digital RF predistortion of a power amplifier in accordance with one embodiment of the systems and methods described herein.

FIG. 53 is a diagram illustrating an example APCO system for adaptive and self-calibrating digital RF predistortion of a power amplifier in accordance with one embodiment of the systems and methods described herein. The example shown is designed to connect to an amplifier's RF input and output ports without modification of the amplifier. Power and control signals are not shown in FIG. 53, but may be included in an implementation of the design as would be known to one of ordinary skill in the art after reading this description.

Without adaptive and self-calibrating nonlinear compensation, the amplifier 3904 would normally have an input signal 3902, for example from a signal generator entering the input port of the amplifier 3903, and the output signal 3906 exiting the output port of the amplifier 3905, to be connected to a transmit antenna. To apply the adaptive and self-calibrating nonlinear compensation to the amplifier, the input signal 3902 should be coupled to RF connector 3925, and an RF connection between connector 3926 and the input port of the amplifier 3904 should be provided. The output port of the amplifier 3904 is connected to connector 3927 and the linearized amplifier output signal exits from connector 3928.

With switches 3907 and 3908 both in the left position (relative to the signal flow direction), the input signal is supplied directly to the amplifier without passing through the RF-DPD subsystem. An RF tapper 3909 taps off a small portion of the RF output signal (e.g. 0.1% of the output power) and supplies the remainder of the output signal power to the output port 3928.

With switches 3907 and 3908 in the right position, and switch 3922 in the left position, the input signal 3902 is routed through the RF-DPD hardware (HW) subsystem, which in the implementation shown in FIG. 53, includes an ADC 3911 an FPGA 3912 containing P3ANC software (SW) 3913 a general-purpose processor (GPP) or digital signal processor (DSP) 3915 containing APCO software 3916 and a DAC 3914. In various embodiments, this process may occur continually without interruption in real time unless a calibration process is taking place.

A "unity-gain' subsystem 3917 including in this example programmable attenuator 3918, RF splitter 3919, low-noise amplifier 3920, and switch 3921 is used to adjust the input signal level at the input port of the RF-DPD subsystem 3910 to ensure the signal is digitized with maximum resolution without inducing a nonlinear response in the ADC. The maximum attenuation of the programmable attenuator 3918 may be equal and opposite to the amplification of the LNA 3920 so that a wide range of input signal levels can be accepted. For example, in one embodiment the attenuator range is 0-30 dB and the amplifier gain is 30 dB. With switch 3921 in the left position, the amplifier is bypassed and the signal is attenuated by 0-30 dB (equivalent to 0 to −30 gain) depending on how the attenuator is programmed by the GPP or DSP 3915. When switch 3921 is in the right position, the LNA 3920 is introduced into the RF chain and the total gain in this position ranges from 0 to 30 dB depending on the attenuator setting. Therefore, in this embodiment, the total gain of this "unity-gain" subsystem ranges from −30 dB to +30 dB. The reason this is referred to as a "unity-gain" subsystem is that an identical subsystem 3923 is located between the output of the RF-DPD subsytem 3910 and switch 3908. The gain of this second "unity-gain" subsystem 3923 is set by the GPP/DSP software 3915 to be equal and opposite to the gain of the first "unity-gain" subsystem thereby ensuring that the input signal entering connector 3925 has the same power level as the signal exiting connector 3926.

To perform an automatic calibration of the nonlinear response of the amplifier, switch 3922 is first set to the right position. Then the GPP or DSP 3915 defines a calibration test signal which is digitally generated in the FPGA 3912 and converted to an analog RF signal by the DAC 3914. This signal passes through the "unity-gain" subsystem 3923 through switch 3908 in the right position to the input port of the amplifier 3904. The output of the amplifier 3904 is sampled by the RF tapper 3909 and further attenuated or amplified by a third "unity-gain" subsystem 3924 to ensure that the signal level is optimal for the input of the ADC 3911.

The ADC 3911 digitizes the signal and the FPGA 3912 captures a snapshot of the amplifier output signal and sends it to the GPP or DSP 3915 for processing. The APCO algorithms 3916, (examples of which are described below with reference to FIG. 54), which may be implemented in software on the GPP/DSP 3915, generate a new predistorted calibration test signal. The output of the amplifier of this new predistorted test signal is then sampled and evaluated in comparison to the original signal. This process is repeated until the optimization algorithms converge on the optimal predistortion coefficients, at which point the calibration process ends. The GPP/DSP 3915 sends the optimal polynomial predistortion coefficients to the FPGA 3912 and switch 3922 is set back to the left position.

Figure 54:
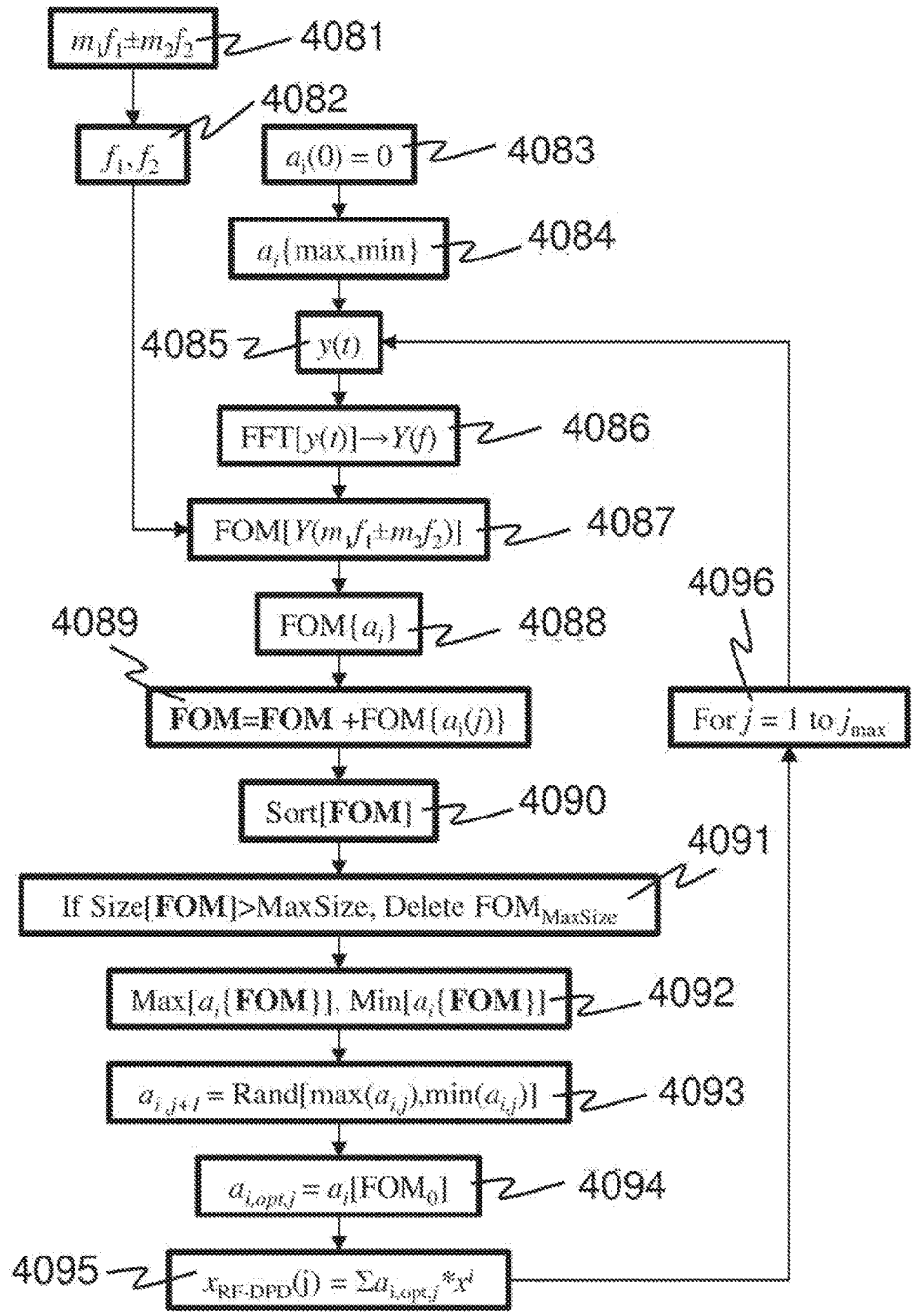
FIG. 54 is a diagram illustrating an APCO optimization algorithm for determining P3ANC nonlinear polynomial model coefficients in accordance with one embodiment of the systems and methods described herein.

FIG. 54 is a diagram illustrating an APCO optimization algorithm for determining nonlinear polynomial model coefficients in accordance with one embodiment of the systems and methods described herein. This example algorithm allows the user to target the optimization process toward reduction of specific nonlinear components (i.e. $m_1 f_1 \pm m_2 f_2$, where $f_1$ and $f_2$ are the frequencies of the input signals, and $m_1$ and $m_2$ are integers) or any nonlinear components within a specific frequency range 4081. In this example, we consider the input signal to have two dominant components at frequencies $f_1$ and $f_2$, although those skilled in the art will be able to apply this to any number of input signal frequencies, $\{f_1, f_2, \ldots f_k\}$, where k is greater or equal to one. Based on the known frequency or frequencies of the fundamental(s), the algorithm then determines the frequencies of all nonlinear signals to which the optimization should be applied 4082.

Next, all P3ANC coefficients are initialized to zero (with the exception of the linear term, which is set equal to unity) 4083. In addition, an initial range is assigned where each P3ANC coefficient is expected to fall 4084. Next a sample of the amplifier output signal (in response to a calibration signal), y(t), is acquired by the APCO hardware (HW) 4085, for example as described with reference to FIG. 53. A power spectrum 4086 is obtained by applying a Fast Fourier Transform (FFT) to the acquired data sample, y(t), to obtain the frequency domain representation, Y(f).

A figure of merit (FOM) is then constructed from the spectral power at all of the frequencies $(m_1 f_1 \pm m_2 f_2)$ associated with nonlinear signals to be reduced as part of the optimization process 4087. The FOM may be chosen such that a high value of the FOM corresponds to a high level of nonlinear signals. For example, in one implementation, the FOM could be the maximum value of the nonlinear signals. In another implementation, the FOM could be the mean value of all the nonlinear signals. This FOM is then associated with the P3ANC coefficients, $a_i$, for this trial, 4088. These bundled parameters are then added to an array 4089, and the array (FOM) is sorted according to the FOM 4090. These bundled parameters are then added to an array 4089, and the array (FOM) is sorted from lowest to highest FOM 4090. Any commercial-off-the-shelf numerical sorting algorithm can be used to perform the sort.

In order to converge on the optimal P3ANC coefficients in the least number of iterations, the array is cropped if it exceeds a predetermined size 4091. For example, in one implementation, the total number of iterations is set to 5000, and the maximum size of the array is set to 30. Those skilled in the art will be able to identify other values of the array size and total number of iterations that meet the needs of the application within the processing speed constraints of the hardware on which the algorithm is implemented. If the array size is less than or equal to this maximum array size (30 in the example above), then no elements are removed from the array. If the array size is greater than the maximum allowed, then one element of the array is removed. The element removed is the one with the lowest value for the FOM. In addition, if the array size is greater than the maximum allowed, the range assigned to each P3ANC coefficient is reset. The range is reset by identifying the maximum and minimum values of each coefficient within the array 4092 and using these values as the new range limits for each coefficient. The next set of P3ANC coefficients is selected randomly from within this new allowed range of values 4093.

The optimal P3ANC coefficients as of the jth iteration, $\alpha_{i,opt,j}$, which are associated with the element within the array with the highest FOM are then selected 4094 and applied to the RF-DPD 4095. An updated power spectrum and FOM is obtained and the entire process is repeated until the maximum number of iterations $j_{max}$ (5000 in the above example) is reached 4096.

In prior art systems, predistortion and postdistortion are applied in a system to compensate for the nonlinear response of components internal to the system, (e.g. the local power amplifier within a transmitter, or the local LNA within a receiver). One of the non-obvious aspects of ISRFMS is that, in addition to both those cases, it can also be applied as a postdistortion on a receiver to compensate for the nonlinear response of components external to the system (in the above example, a power amplifier on a remote transmitter).

This feature of ISRFMS may be referred to herein as Remote Transmitter Impairments Compensated Locally (RTICL).

Figure 55:
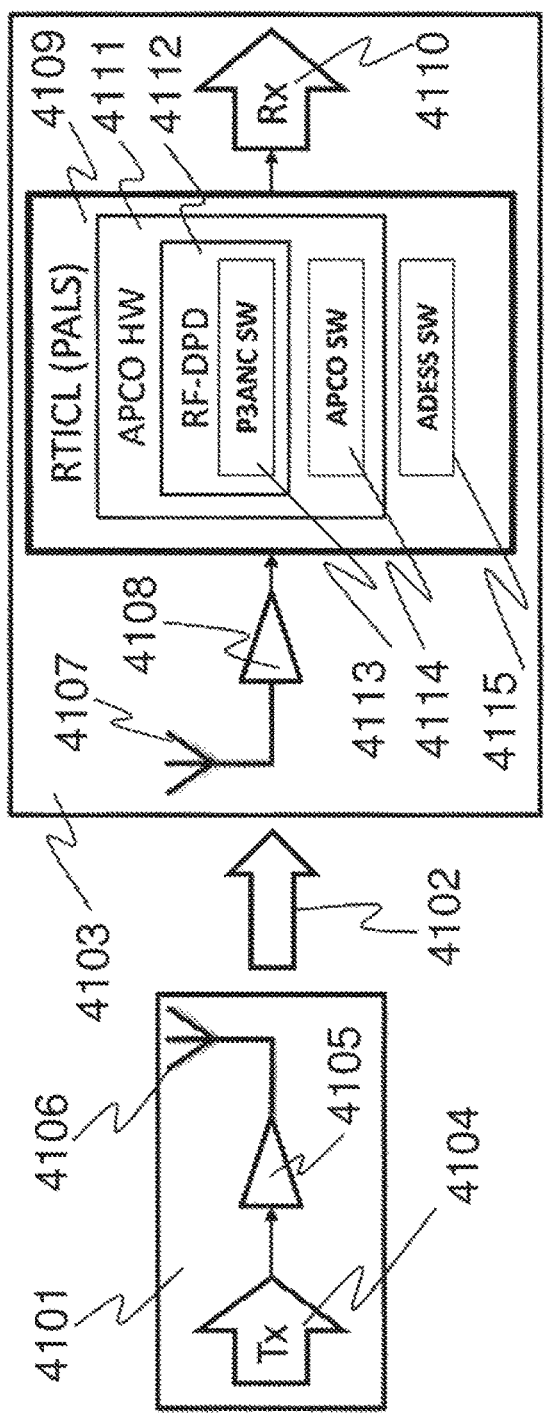
FIG. 55 illustrates an example of a wireless RF transmitter and receiver with the ISRFMS Remote Transmitter Impairments Compensated Locally (RTICL) on the receiver.

FIG. 55 illustrates an example of a wireless RF transmitter and receiver with the ISRFMS Remote Transmitter Impairments Compensated Locally (RTICL) on the receiver. Particularly, FIG. 55 shows an example of the RTICL concept applied to a remote transmitter 4101 and a local receiver 4103 with a FMS RTICL subsystem 4109. The remote transmitter 4101 generates an RF transmit signal 4104, then amplifies the signal with a power amplifier 4105 that has a nonlinear response and broadcasts the signal over the air with a transmit antenna 4106. A power amplifier is used as an example of a component that generates a strong nonlinear component when operated near its P1 dB, but as noted previously, embodiments can be applied to nonlinearities arising from any number of components in the RF chain.

The RF signal is transmitted over the air 4102 until it arrives at the ISRFMS-enabled RF receiver 4103. Here the signal is received by an antenna 4107, amplified by an LNA 4108, and processed by the FMS RTICL subsystem 4109 to reduce the nonlinearity in the received signal prior to signal recovery 4110. The RTICL subsystem is based on an implementation of the APCO hardware 4111 (described with reference to FIG. 53) with RF-DPD 4112 containing P3ANC software 4113 (described with reference to FIG. 54) operating as postdistortion in the receive mode. The addition of software for adaptive exfiltration of spectral signals (ADESS) 4115 enables the RTICL subsystem to identify the remote high-powered signals that should be the object of the nonlinear compensation.

Figure 56:
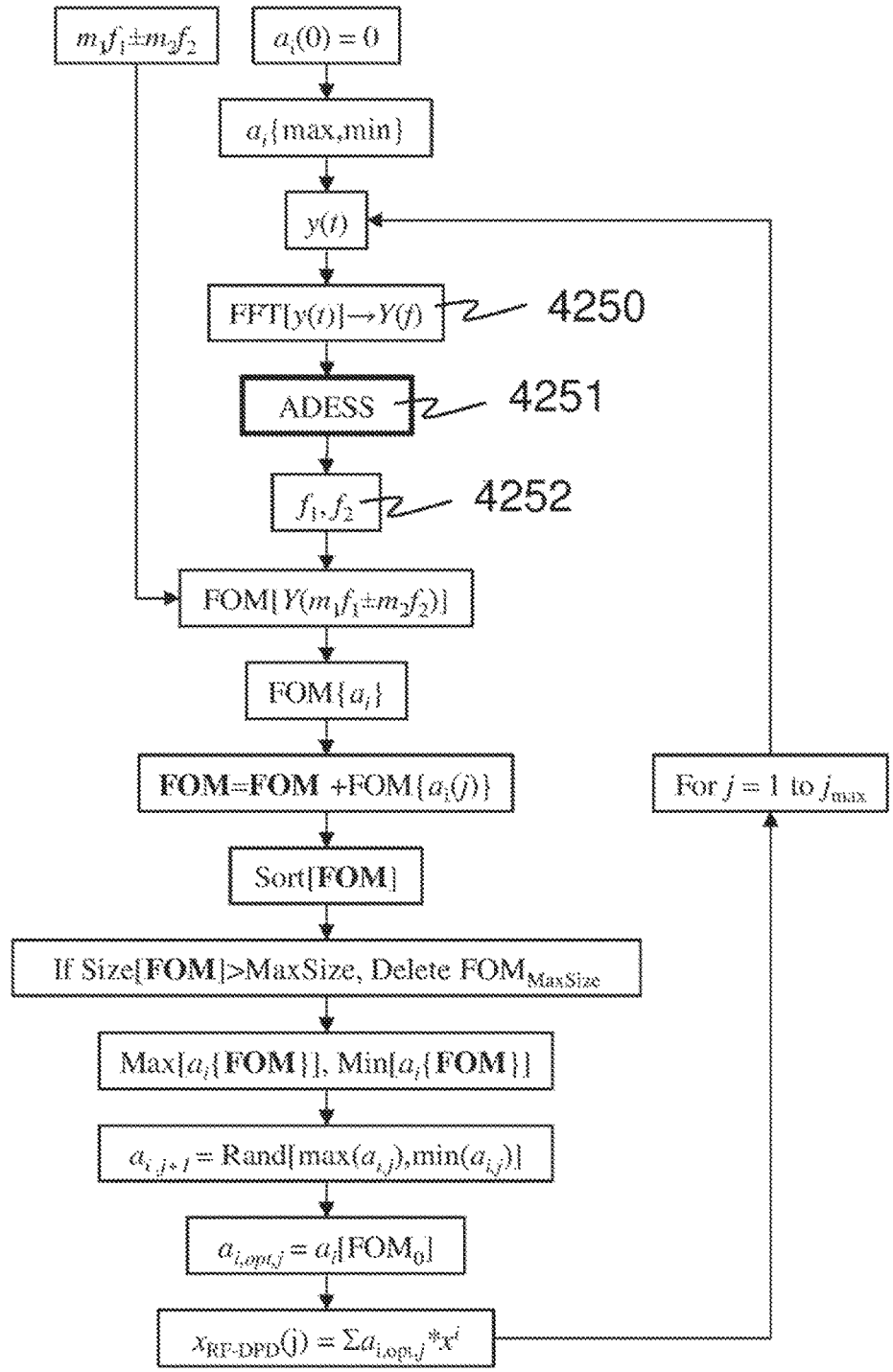
FIG. 56 illustrates an example RTICL algorithm based on APCO with the addition of ADESS spectral peak determination in accordance with one embodiment of the technology described herein.

FIG. 56 illustrates an example RTICL algorithm based on APCO with the addition of spectral peak determination in accordance with one embodiment of the technology described herein. This example shows the RTICL algorithm, which is based on the APCO algorithm (described with reference to FIG. 54), with an additional step 4250 where the ADESS algorithm 4251 (described below with reference to FIG. 57) is applied to the power spectrum measured by the receiver in order to identify frequencies of the highest power signals 4252, for which nonlinear signals are to be reduced. One way to detect radio frequency signals would be to apply a peak-fitting algorithm to all data above a specified threshold. However, radio frequency signals have very diverse spectral characteristics, and in many cases, a simple peak-fitting algorithm may not yield a useful representation of the actual signal characteristics. In addition, signals may have overlapping frequency ranges, and simple peak-fitting will not detect these overlapping signals. Accordingly, in some embodiments, the ADESS process can be applied to identify nonlinear signals of interest.

Figure 57:
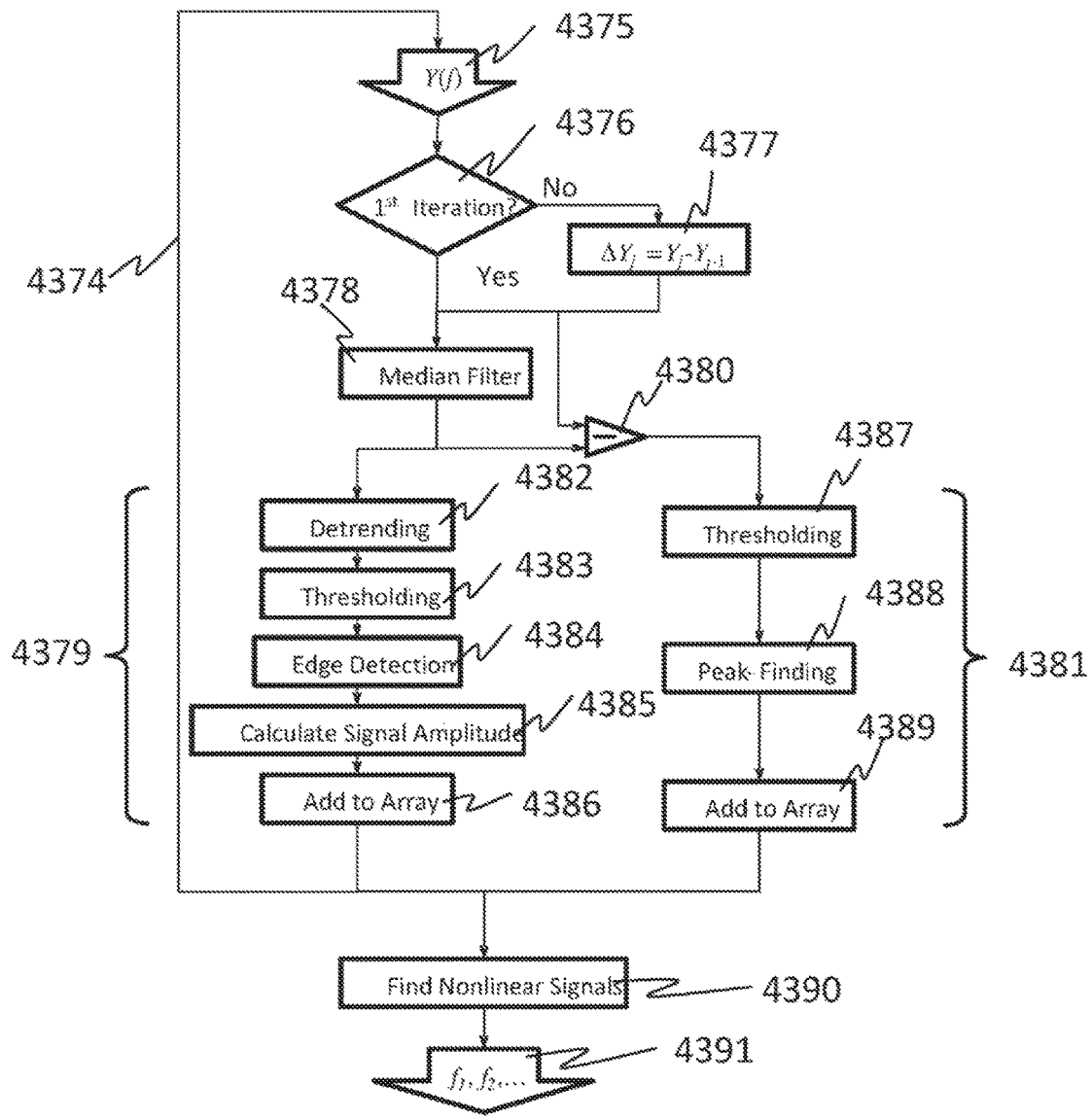
FIG. 57 illustrates an example ADESS algorithm for identification of the remote nonlinear signals of interest in accordance with one embodiment of the systems and methods described herein.
Figure 58:
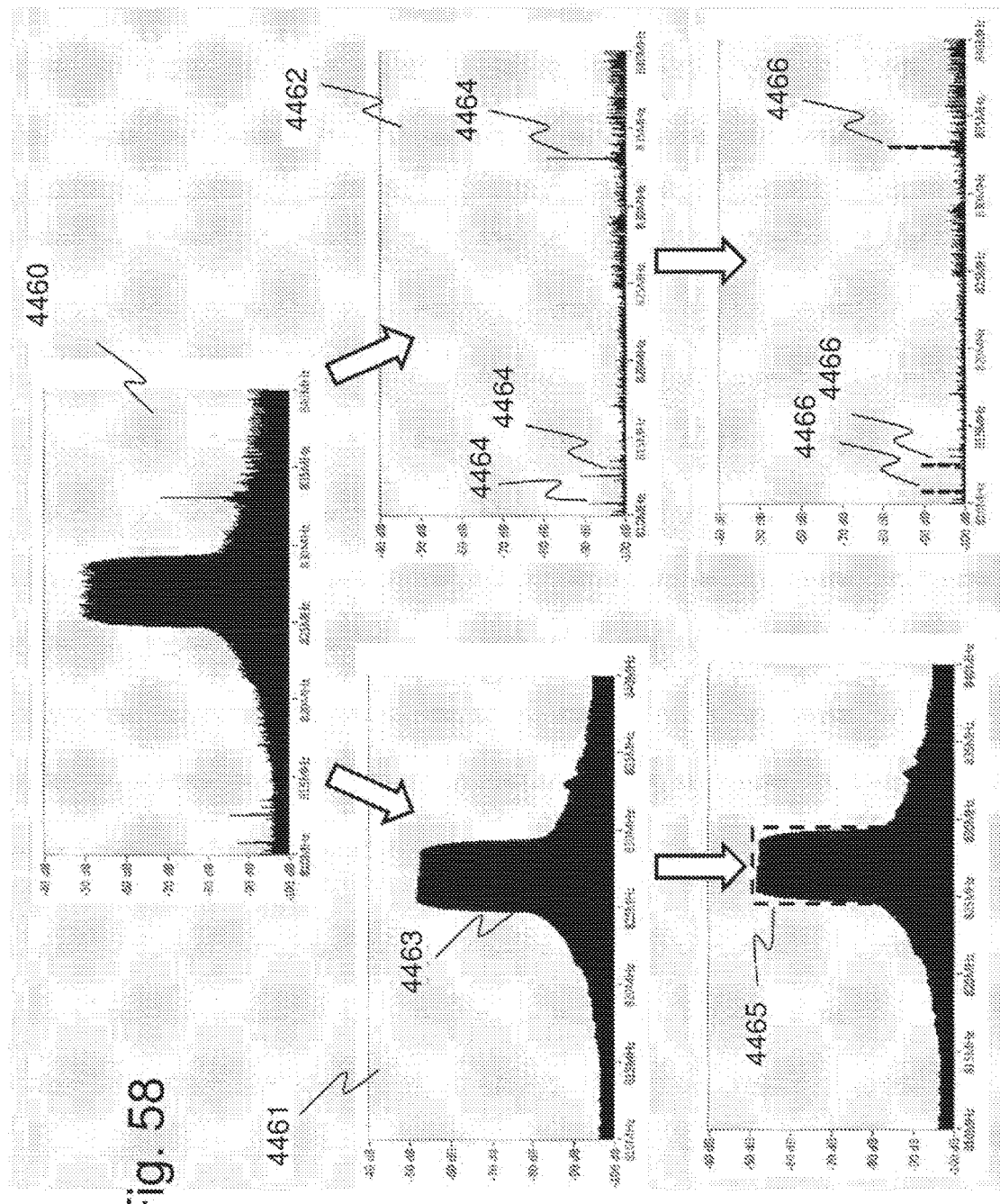
FIG. 58 is a diagram illustrating examples of wideband and narrowband signals.

One example of the ADESS algorithm for identification of the remote nonlinear signals of interest is shown in FIG. 57. FIG. 58 illustrates examples of the frequency spectra at various steps in the ADESS process. Generally speaking, the ADESS algorithm is a spectral detection process that determines radio frequency spectral data and extracts radio frequency signal parameters from the spectral data. The example process illustrated in FIG. 57 uses measured spectral data of two types: wideband spectral data and narrowband spectral data. Because radiofrequency signals can have diverse spectral characteristics, looking at both wideband and narrowband data can avoid issues that may otherwise arise by simply applying a peak-fitting algorithm in an attempt to determine actual signal characteristics. In addition, because signals may have overlapping frequency ranges, a simple peak-fitting algorithm would not detect these overlapping signals. Accordingly, as described below, this example algorithm separates the measured spectral data into wideband and narrowband components and applies distinct signal detection methods to each.

With particular reference now to FIGS. 57 and 58, the example algorithm performs multiple iterations 4374 of spectral data collection and exfiltration in order to build up a database of signals in the environment, out of which the center frequencies, bandwidths, and signal strengths of the remote nonlinear signals of interest are identified. Multiple iterations are performed in order to capture any short-duration signals in the environment that may otherwise be missed. The number of iterations can be determined by those skilled in the art based on the specific hardware performance parameters and requirements of the application. For example, if the nonlinear signals of interest are known to be continuous emitters, then one iteration may be sufficient to identify the frequencies of these signals. Where short duration signals of interest may be present, multiple iterations can be used to increase the likelihood of capturing those signals as well.

Once incoming spectral data, Y(f), 4460 is received by the ADESS algorithm 4375, a decision tree 4376 that evaluates the number of iterations performed within this instantiation of the ADESS algorithm. If this is the first iteration, the spectral data 4460 is sent to a median filter 4378. Median filter 4378 separates out wideband spectral content 4461 from the narrowband spectral content 4462 so that distinct signal detection mechanisms can be applied to each. In some embodiments, narrowband signals are defined as those whose bandwidth is comparable to the spectral resolution of the receiver (e.g., bandwidth less than 10 times the spectral resolution), and wideband signals as those whose bandwidth exceeds this. The exact frequency that separates narrowband from wideband can be controlled by a parameter of the median filter, and can be chosen to meet the requirements of the application by those skilled in the art.

One reason for separating the spectral data this way is because the spectral shape of narrowband and wideband signals is sufficiently different so that using separate thresholding and detection algorithms for narrowband and wideband signals may significantly improve the signal detection rate. Using the median filter allows these two detection algorithms to be implemented in parallel, which as a result allows detection of overlapping signals in the same portion of the frequency spectrum. Narrowband signals show up as narrow peaks 4464 that can be well approximated by a Lorentzian and can therefore be reliably detected 4466 using a peak detection process 4381. Wideband signals (e.g., 4463), on the other hand, show more structure, often with flat-top spectral signatures. In this case, conventional peak-detection algorithms, which typically assume a Gaussian or Lorentzian shape for the peak, are less reliable. Accordingly, in various embodiments, the ADESS algorithm incorporates an edge-detection, or triggers the algorithm, in which the bandwidth and center frequency of a wideband a signal 4465 are determined from the separation of neighboring rising and falling edges by edge-detection in a wideband signal process 4379. Particularly, the algorithm can be configured to detect the rising and falling edges of each wideband signal, and determine the center frequency from the mean value of the frequency at the rising and falling edges. The signal amplitude can be determined from the mean value of the spectral power between the rising edge and the falling edge of the signal.

The wideband signal process 4379 begins by detrending 4382 the spectral data to eliminate frequency variations in the noise floor. Next, an adaptive thresholding algorithm is applied 4383 that performs a statistical analysis of the detrended spectral data to establish the level of the noise floor. The threshold is then based on a combination of these statistical parameters. For example, in one implementation, the threshold could be set to be three standard deviations above the mean. This implementation could be suitable for environments with low signal content, where the statistical mean of the entire spectral dataset corresponds closely to the mean value of the noise floor of the dataset. In another implementation, the threshold could be determined by performing a peak-finding analysis on a histogram of spectral values in the dataset. If more than one peak is found, the peak with the lowest mean value is identified as the mean value of the noise, and the threshold is set to three peak-widths above this mean value. This implementation may be effective in environments where there is a high density of signals, and the statistical mean of the entire dataset does not correspond closely to the mean value of the noise floor of the dataset.

The threshold determined from the thresholding algorithm is used as an input parameter of the edge detection algorithm 4384. The edge detection algorithm identifies wideband signals by consecutive rising and falling edges. Next the amplitude of each signal is determined by amplitude determination algorithm 4385, which computes the average value of the spectral signal between the rising and falling edge of the signal.

The detected signal information (center frequency bandwidth and amplitude) is tagged with any other identifiers (e.g., timestamp, location, direction of arrival) and added to a running array of all detected signal content at 4386.

The narrowband signal content is obtained by subtracting 4380 the wideband output of the median filter from the input to the median filter 4378. The narrowband signal processing 4381 includes the same adaptive thresholding algorithm 4387 followed by a peak-finding algorithm 4388 that fits a Lorentzian, Gaussian, or similar curve to the spectral data in order to identify, frequency, bandwidth and amplitude of the spectral signal content. The narrowband signal content is also tagged with any other identifiers and added to the running array of detected signal content 4389, and the signal detection is repeated with another spectral data sample 4374.

Once the final iteration is reached, the list of signals in the array is searched to find nonlinear signals of interest 4390. One approach to finding nonlinear signals is to sort the array according to amplitude, and to identify the highest amplitude signals as those most likely to generate nonlinear spurious signals. Another more reliable approach to finding nonlinear signals is to first identify the highest amplitude signals, as above, then search for signals at harmonics and/or IMPs of these signal frequencies. The output of the ADESS algorithm is a set of fundamental frequencies ($f_1, f_2, \ldots$) 4391 for which nonlinear spurious signals can be reduced.

Spectral detection using the ADESS algorithm can be used to detect nonlinearities not only from within the communication system, but from external interference sources as well. Examining the spectrum to identify spurious signals can allow nonlinearities from remote sources to be detected and addressed. In some embodiments, for example, the system can be configured to look for the highest power signal, and then to identify harmonics of the highest power signal. Those harmonics are generally unwanted interference signals that can be addressed by compensation. This process can continue for lower power signals and their harmonics to identify other interfering signals. Signals that are detected at frequencies outside of the frequency band in which the system is operating (which band or band width can be adjusted to compensate for Doppler and other effects) can be identified as interfering signals.

The ADESS algorithm can be used to compress spectral data with diverse spectral characteristics, as shown in Table 5. The ADESS algorithm contains many internal control parameters that may need to be adjusted for optimal performance of the algorithm in a specific environment.

TABLE 5

ZOOLOGY OF SPECTRAL DATA

| Signal Type | Signature | Hardware Remedy | Software Remedy |
|---|---|---|---|
| Narrowband Signals | High spectral (frequency) resolution | High memory capacity of processor | Long sampling time |
| Wideband Signals | Large bandwidth | High sampling rate of digitizer | High-throughput data processing |
| Low Amplitude Signals | Low noise floor | High dynamic range and bit resolution of digitizer | Ensemble averaging |
| Pulsed Signals | Short duration, low duty cycle | Real-time "streaming" digitizer and processing | Time-selective ensemble averaging |
| Frequency Agile Signals | Fast frequency changes | Wideband streaming digitizer and processing | Change detection |

Embodiments can further include an optimization process for Compressed Diversified Spectral Data (CDSD). An example of such a process is set forth in Table 6.

TABLE 6

OPTIMIZATION PROCESS

1. Develop software code with tunable control variables.
2. Develop a benchmark test case with which to evaluate and optimize the software code.
3. Develop a figure of merit (FoM) or state variable to quantitatively evaluate the performance of the ADESS algorithms.
4. Apply the ADESS algorithms to the benchmark test case and evaluate the FoM.
5. Automate the evaluation process to obtain the FoM as a function of control variables.
6. Develop an optimization method to obtain the optimal control variables as a function of spectral signal content characteristics.
7. Conduct an analysis of measured data to determine realistic control variable ranges for characteristic signals.
8. Develop a model to select control variables that optimally match the characteristics of the signal environment.
9. Evaluate the performance of the ADESS algorithms with measured data in diverse signal environments.
10. Refine the control variable-selection model based on ADESS performance results.
11. Automate the control variable selection process as a function of real-time changes in the signal environment.

Various embodiments may also be implemented to use binary-sensor theory and Bayesian inference in the CDSD optimization process With the advent of wideband wireless communications hardware (e.g. smartphones, software-defined radios) the frequency spectrum is in greater demand than ever. Traditional wireless communications systems access allocated frequency bands in a static manner, with no adaptability to the environment. However, many studies have shown that large portions of the spectrum are underutilized. See, for example, Matthews, J.; Bukshpun, L.; Pradhan, R. D., "*High-Fidelity Adaptive Compression for Cognitive Spectral Monitoring*," Military Communications Conference, MILCOM 2013-2013 IEEE, vol., no., pp. 1183, 1186, 18-20 Nov. 2013

Next generation wireless communications networks, based on the cognitive radio paradigm, will need to dynamically access and manage spectrum usage to take advantage of these temporary gaps in spectrum occupancy. Key to achieving this goal is dynamic spectrum access (DSA), a process whereby RF users dynamically select available frequencies for transmission/reception from an allocated pool or as secondary users on a not-to-interfere basis.

Two fundamental challenges for any software-defined radio (SDR) system are computational efficient processing of wideband signals and mitigation of nonlinear artifacts from the analog RF front end.

Figure 59:
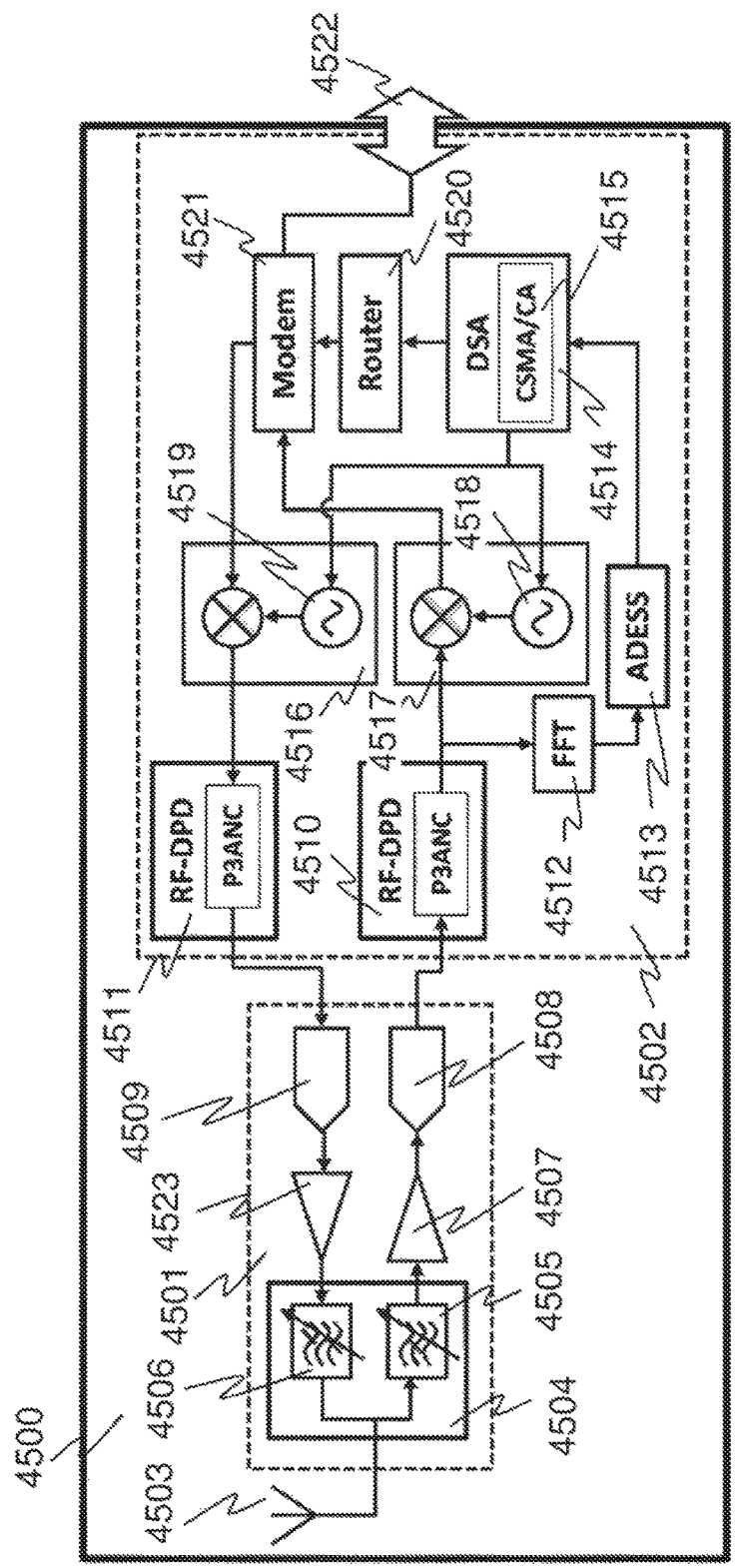
FIG. 59 is an example system architecture of a wideband adaptive intelligent software-defined radio (WAISDR) in accordance with one embodiment of the systems and methods described herein.

Various embodiments of the disclosed technology relate to a system architecture for a Wideband Adaptive Intelligent SDR (WAISDR), an example of which is shown in FIG. 59. In this example, WAISDR 4500 integrates the ISRFMS methodology and component algorithms to address the challenges identified in the preceding paragraph.

The WAISDR 4500 includes an analog RF front end 4501 and a digital backend 4502. A wideband (e.g. 10-2000 MHz) RF antenna 4503 is used for both transmitting and receiving signals. A wideband duplexer 4504 prevents transmitted signals from being coupled directly back into the receiver. The duplexer incorporates two agile filters 4505, 4506 that can change their center frequency, and/or bandwidth, on the fly, as commanded by the WAISDR digital backend 4502. In one implementation, the filter on the transmit side 4506 is a bandpass filter, and the filter on the receive side 4505 is a bandstop filter with the start and stop frequencies of the transmit side passband and the receive side passband set to be equal. The remaining components of the WAISDR analog RF front end are a wideband (e.g. 10-2000 MHz) LNA 4507, a wideband (e.g. 10-2000 MHz) PA 4523, a high sampling rate (e.g. 5 GS/s) ADC 4508, and a high sampling (e.g. 5 GS/s) DAC 4509.

The WAISDR digital backend 4502 in this example includes digital signal processing algorithms implemented in real-time (e.g., FPGA ASIC) and/or non-real-time (e.g., GPP DSP) hardware components. Specifically, the ISRFMS RF-DPD with P3ANC is implemented as a post-distortion 4510 on the streaming digital signal from the ADC 4508 and as a predistortion 4511 on the streaming digital signal supplied to the DAC 4509.

A useful feature for a radio to adapt to the RF environment is the ability to monitor the RF spectrum accurately, in order to allow a DSA system to dynamically assign carrier frequencies for the WAISDR-transmitted radio signals. Spurious signals generated by the LNA or other analog RF components in the receiver can provide false indication to the radio DSA subsystem that channels are occupied, when in fact they are not. By compensating for the nonlinear response of the radio receiver, FMS reduces or minimizes such spurious signals, and enables a more effective DSA operation for the radio.

To monitor the spectrum, WAISDR applies an FFT 4512 to the digitized linearized RF receive signal, and generates a power spectrum over the full band, which is processed by the ADESS algorithms 4513 (described with reference to FIG. 56) in order to identify the signal content within the operating frequency band (e.g. 10-2000 MHz). This environmental signal data is then processed by the DSA subsystem 4514, which includes carrier sense multiple access with collision avoidance (CSMA/CA) algorithms 4515. The DSA subsystem 4514 performs frequency assignment for the radio transmit and receive channels based on the detected signals in the environment and a spectrum usage policy database. These frequency assignments are used to set the digital carrier frequency generators 4518, 4519 within the digital downconverter 4517 and the digital upconverter 4516, respectively, so as to convert signals between RF and baseband. The baseband signals are processed by a modem 4521 that performs physical layer functions such as modulation/demodulation encryption/decryption encoding/decoding spreading/de-spreading; and a router 4520 that performs networking functions and sent to the radio interface 4522, which may include audio, video, or data interfaces accessible by the user.

As noted above, the technology disclosed herein is suited for application with communication systems, including communications transmitters and receivers. To provide some context, it is useful to describe an example piece of equipment with which the disclosed technology can be implemented. One such example is that of a piece of equipment that incorporates both wired and wireless communication interfaces such as that shown in FIG. 60. After reading this description, one of ordinary skill in the art will appreciate that the technology disclosed herein can be used with any of a number of different devices or equipment having wireless communication capabilities.

Figure 60:
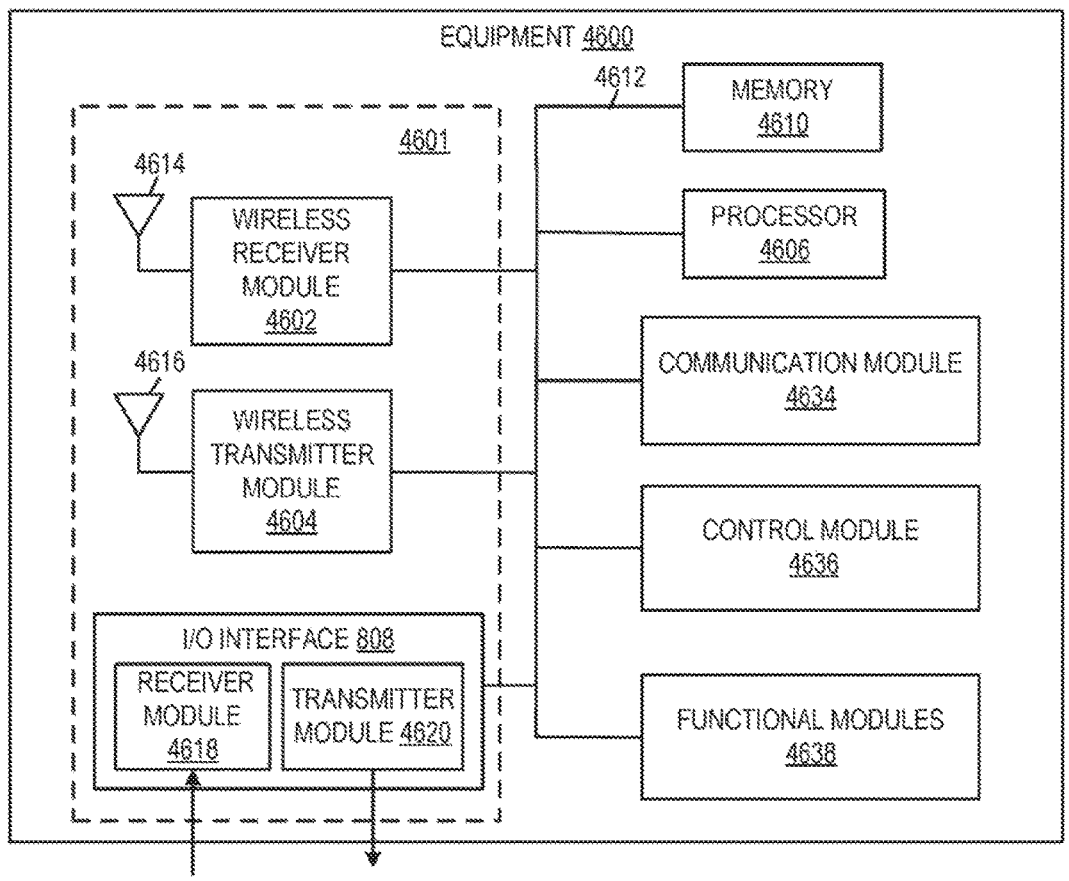
FIG. 60 is a block diagram illustrating one example of equipment with which embodiments of the technology disclosed herein can be implemented.

With reference now to FIG. 60, in this example application, the example equipment 4600 includes a communication module 4601, a processor 4606 (which can include multiple processors or processing units), and memory 4610 (which can include memory units or modules of different types). These components are communicatively coupled via a bus 4612 over which these modules may exchange and share information and other data. Communication module 4601 includes wireless receiver module 4602, a wireless transmitter module 4604, and an I/O interface module 4608.

An antenna 4616 is coupled to wireless transmitter module 804 and is used by equipment 4600 to transmit radio signals wirelessly to wireless equipment with which it is connected. These outbound RF signals can include information of almost any sort that is sent by equipment 4600 to other entities. For example, in the case of a multifunction peripheral (MFP), this can include files representing scanned images or documents, log information, housekeeping information, or other information sent by the MFP relating to its operation. As another example, in the case of a camera, this outbound information can include image files and related data (including metadata) sent by the camera to a computer, printer, or other device.

Antenna 4614 is included and coupled to wireless receiver module 4602 to allow equipment 4600 to receive signals from various wireless terminals within its reception range. Received signals can include information from other equipment used for operation of equipment 4600. Continuing with the above two examples, in the case of an MFP, inbound information received by wireless receiver module 802 can include, for example, files to be printed or faxed by the MFP. In the case of a camera, information received could be firmware updates, control information, or other information used by the camera.

Although two antennas are illustrated in this example, one of ordinary skill in the art will understand that various antenna and antenna configurations can be provided as can different quantities of antennas. For example, transmit and receive functions can be accommodated using a common antenna or antenna structure, or separate antennas or antenna structures can be provided for transmit and receive functions as illustrated. In addition, antenna arrays or other groups of multiple antennas or antenna elements, including combinations of passive and active elements, can be used for the transmit and receive functions. The wireless communications implemented using communication module 801 can be implemented according to a number of different wireless protocols, including standardized protocols. Examples of such standardized protocols include Bluetooth®, HiperLan, and various IEEE 802.11 communications standards, although other communication interfaces (whether or not standardized) can be implemented.

An I/O interface module 4608 is provided in the illustrated example, and can be configured to couple equipment 4600 to other network nodes. These can include nodes or equipment. In this example architecture, the I/O interface module 4608 includes a receiver module 4618 and a transmitter module 4620. Communications via the I/O interface module can be wired or wireless communications, and the transmitter and receiver contained therein can include line drivers and receivers, radios, antennas or other items, as may be appropriate for the given communication interfaces. Transmitter module 4620 may be configured to transmit signals that can include voice, data and other communications. These may be sent in a standard network protocol if desired. Receiver module 4618 is configured to receive signals from other equipment. These signals can include voice, data and other communications from the other equipment, and can also be received in a standard network protocol if desired. In terms of the above examples of an MFP or digital camera, I/O interface 4608 can provide a hardwired complementary interface to the wireless interface described above. This may be, for example, an Ethernet interface, a USB interface, a FireWire interface, or other hardwired interface.

Memory 4610, can be made up of one or more modules of one or more different types of memory, and in the illustrated example is configured to store data and other information 824 as well as operational instructions that may be used by the processor to operate equipment 4600. The processor 4606, which can be implemented as one or more cores, CPUs, DSPs, or other processor units, for example, is configured to execute instructions or routines and to use the data and information in memory 4610 in conjunction with the instructions to control the operation of the equipment 4600. For example, image-processing routines, such as compression routines, can be stored in memory 4610 and used by processor 4606 to compress image files from raw files into JPEG files.

Other modules can also be provided with the equipment 4600 depending on the equipment's intended function or purpose. A complete list of various additional components and modules would be too lengthy to include, however a few examples are illustrative. For example, a separate communication module 4634 can also be provided for the equipment to manage and control communications received from other entities, and to direct received communications as appropriate. Communication module 4634 can be configured to manage communication of various information sent to and received from other entities. Communication module 4634 can be configured to manage both wired and wireless communications.

A separate control module 4636 can be included to control the operation of equipment 4600. For example, control module 4636 can be configured to implement the features and functionality of equipment 4600. Functional modules 4638 can also be included to provide equipment functionality. For example, in the case of an MFP, various modules (which may include various forms of hardware and software) can be provided to perform printing, scanning, faxing, and copying operations of the device. In the case of a digital camera, functional modules 4638 can include modules such as, for example, optical systems, image capture modules, image processing modules, and so on. In the case of a remote sensor, functional modules can include modules used to perform the sensing and related operations. Again, as these examples illustrate, one of ordinary skill in the art will appreciate how other modules and components can be included with equipment 800 depending on the purpose or objectives of the equipment.

Having thus described an example application, it will become apparent to one of ordinary skill in the art how the invention can be implemented in different and alternative environments and applications.

Figure 61:
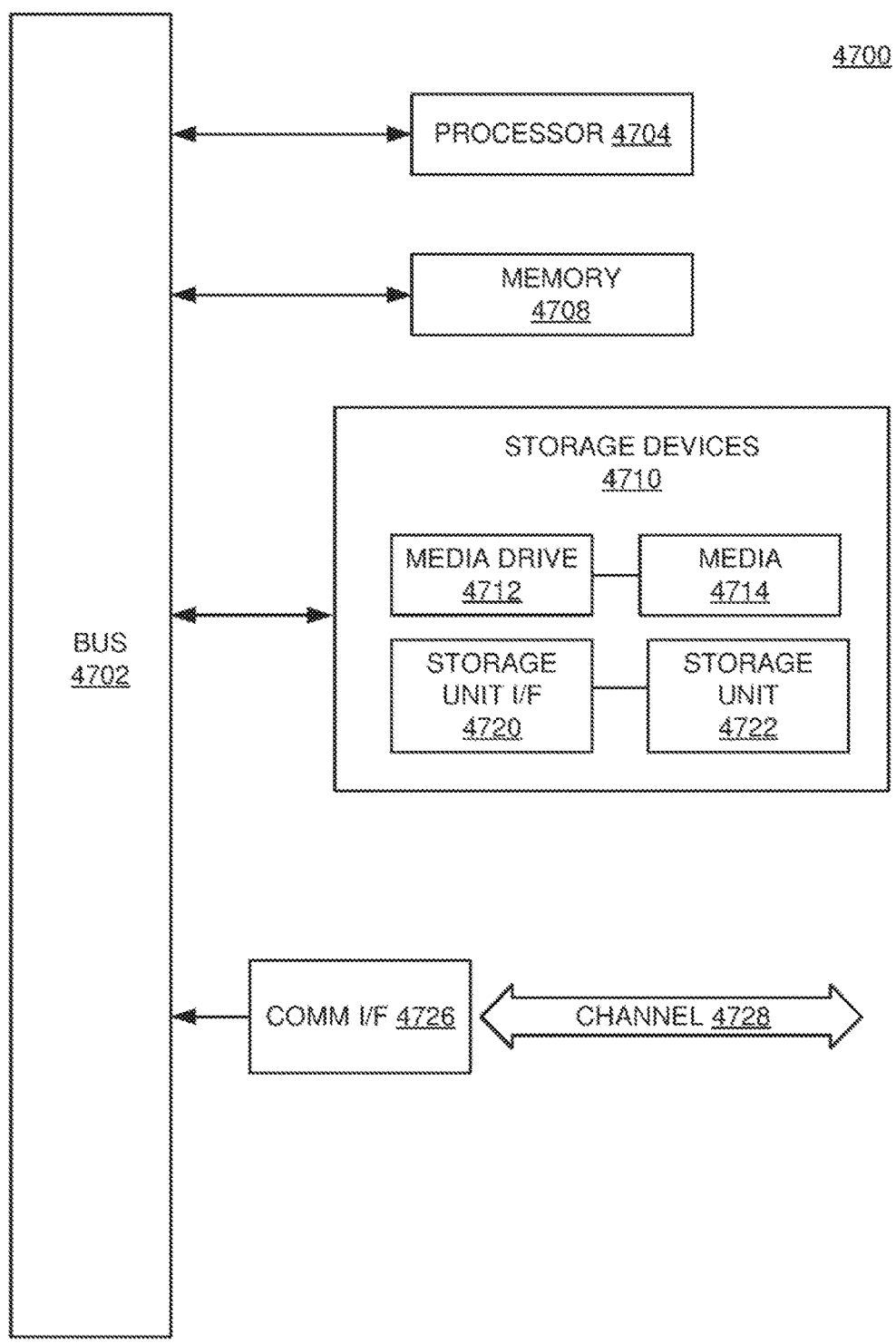
FIG. 61 illustrates an example computing module that may be used in implementing various features of embodiments of the disclosed technology.

As used herein, the term module might describe a given unit of functionality that can be performed in accordance with one or more embodiments of the technology disclosed herein. As used herein, a module might be implemented utilizing any form of hardware, software, or a combination thereof. For example, one or more processors, controllers, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the technology are implemented in whole or in part using software, in one embodiment, these software elements can be implemented to operate with a computing or processing module capable of carrying out the functionality described with respect thereto. One such example computing module is shown in FIG. 61. Various embodiments are described in terms of this example-computing module 4700. After reading this description, it will become apparent to a person skilled in the relevant art how to implement the technology using other computing modules or architectures.

Referring now to FIG. 61, computing module 4700 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 4700 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 4700 might include, for example, one or more processors, controllers, control modules, or other processing devices, such as a processor 4704. Processor 4704 might be implemented using a general-purpose or special-purpose processing engine such as, for example, a microprocessor, controller, or other control logic. In the illustrated example, processor 4704 is connected to a bus 4702, although any communication medium can be used to facilitate interaction with other components of computing module 4700 or to communicate externally.

Computing module 4700 might also include one or more memory modules, simply referred to herein as main memory 4708. For example, preferably random access memory (RAM) or other dynamic memory, might be used for storing information and instructions to be executed by processor 4704. Main memory 4708 might also be used for storing temporary variables or other intermediate information during execution of instructions to be executed by processor 4704. Computing module 4700 might likewise include a read only memory ("ROM") or other static storage device coupled to bus 4702 for storing static information and instructions for processor 4704.

The computing module 4700 might also include one or more various forms of information storage mechanism 4710, which might include, for example, a media drive 4712 and a storage unit interface 4720. The media drive 4712 might include a drive or other mechanism to support fixed or removable storage media 4714. For example, a hard disk drive, a floppy disk drive, a magnetic tape drive, an optical disk drive, a CD or DVD drive (R or RW), or other removable or fixed media drive might be provided. Accordingly, storage media 4714 might include, for example, a hard disk, a floppy disk, magnetic tape, cartridge, optical disk, a CD or DVD, or other fixed or removable medium that is read by, written to or accessed by media drive 4712. As these examples illustrate, the storage media 4714 can include a computer usable storage medium having stored therein computer software or data.

In alternative embodiments, information storage mechanism 4710 might include other similar instrumentalities for allowing computer programs or other instructions or data to be loaded into computing module 4700. Such instrumentalities might include, for example, a fixed or removable storage unit 4722 and an interface 4720. Examples of such storage units 4722 and interfaces 4720 can include a program cartridge and cartridge interface, a removable memory (for example, a flash memory or other removable memory module) and memory slot, a PCMCIA slot and card, and other fixed or removable storage units 4722 and interfaces 4720 that allow software and data to be transferred from the storage unit 4722 to computing module 4700.

Computing module 4700 might also include a communications interface 4724. Communications interface 4724 might be used to allow software and data to be transferred between computing module 4700 and external devices. Examples of communications interface 4724 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 4724 might typically be carried on signals, which can be electronic, electromagnetic (which includes optical) or other signals capable of being exchanged by a given communications interface 4724. These signals might be provided to communications interface 4724 via a channel 4728. This channel 4728 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 4708, storage unit 4720, media 4714, and channel 4728. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 4700 to perform features or functions of the disclosed technology as discussed herein.

Figure 62:
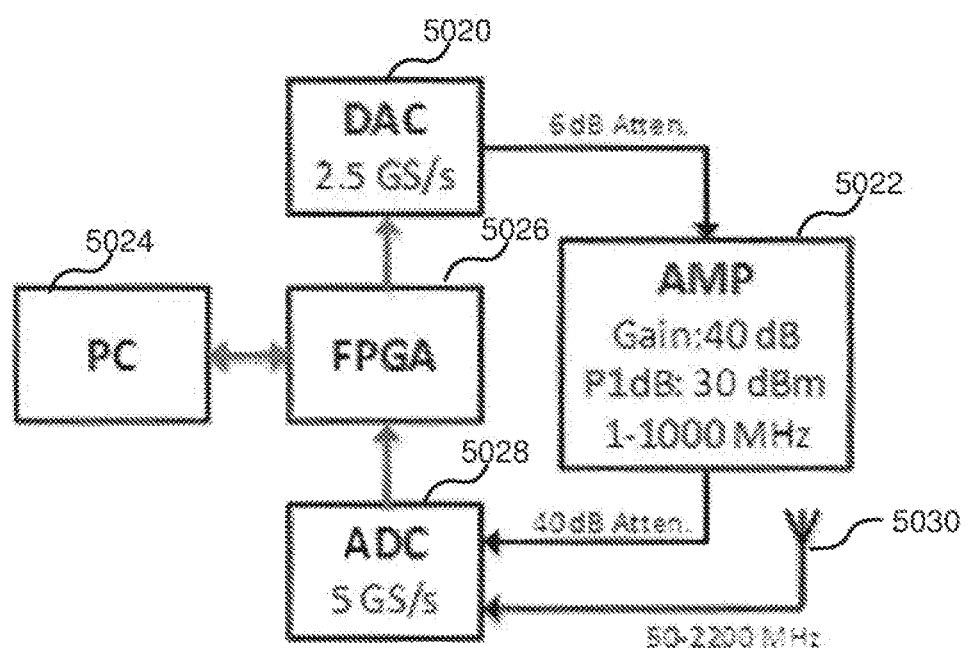
FIG. 62 shows a test set up configured to evaluate the capabilities of digital RF predistortion with wideband complex signal sets.

A test set up was configured to evaluate the capabilities of digital RF predistortion with wideband complex signal sets. This test is set up to include a wideband RF transmitter and receiver, signal processing hardware, and a wideband RF amplifier. The main components of the setup, and their interaction, are shown in FIG. 62. This setup includes an FPGA 5026 to implement the ISRFMS. For the test, RF test signals were generated in software on a standard personal computer (PC) 5024. These test signals were output continuously from a digital-to-analog-converter (DAC) 5020, and supplied to the input port of an RF amplifier (AMP) 5022. The output of the amplifier 5022 was then digitized by an analog-to-digital converter (ADC) 5028 and processed by software on the PC 5024. A FPGA provides the digital interface for the ADC and DAC to the PC, and also implements the nonlinear compensation algorithm. For the measurements described below, a broadband antenna 5030 was coupled into the ADC analog RF input port in order to provide access to ambient RF signals. RF attenuators were placed between the DAC and the amplifier, and the amplifier and the ADC, in order to ensure that the full dynamic range of the ADC and DAC was used, but neither was operated close to their saturation point, so as not to introduce nonlinearities from the mixed signal components into the measurement.

Commercially available, high-speed DAC and ADC modules were used in the test set up to provide wide bandwidth transmit and receive capabilities. The DAC 1020 in one embodiment has a 14-bit resolution and a 5.6 GSPS sampling rate. For the measurements, it was operated at 2.4576 GSPS; with a Nyquist bandwidth of 1.2288 GHz. Software-generated test signals supplied to the ADC were 16384 samples long, which at the operated sampling rate corresponded to 6.7 µs duration, which in turn is equivalent to 150 kHz frequency resolution. The ADC in one embodiment has a 10-bit vertical resolution and a 5 GSPS sampling rate, which corresponds to a Nyquist bandwidth of 2.5 GHz. Up to 524,288 samples were collected by the ADC at each iteration, which at 5 GSPS corresponded to 105 µs, which in turn is equivalent to a frequency resolution below 10 kHz.

The amplifier in one embodiment is a you 1 W amplifier (Gain=40 dB, P1 dB=30 dBm, IP3=40 dBm, Bandwidth=1-1000 MHz, Power Consumption=4.3 W) in the test setup. The input to the amplifier was attenuated by 6 dB, while the output of the amplifier was attenuated by 40 dB.

The nonlinear compensation could be implemented in a variety of ways including: as a software predistortion of the test signal supplied by the PC to the DAC; as a firmware "postdistortion" on the FPGA with data collected from the ADC; as a software postdistortion on the PC.

While the first implementation (software predistortion) was the primary objective of the investigation, the latter (software postdistortion) was used to determine the parameter values for the nonlinear compensation, since this could be conducted most effectively in software-only loops. The second implementation listed (FPGA postdistortion) was used to validate the feasibility of implementing the nonlinear compensation in FPGA firmware at these data rates. The testbed used a polynomial function for the nonlinear compensation, with up to five free parameters. By monitoring the output of the amplifier, the nonlinear compensation parameter values that minimize spurious signals within a predefined frequency range were determined.

Figure 63:
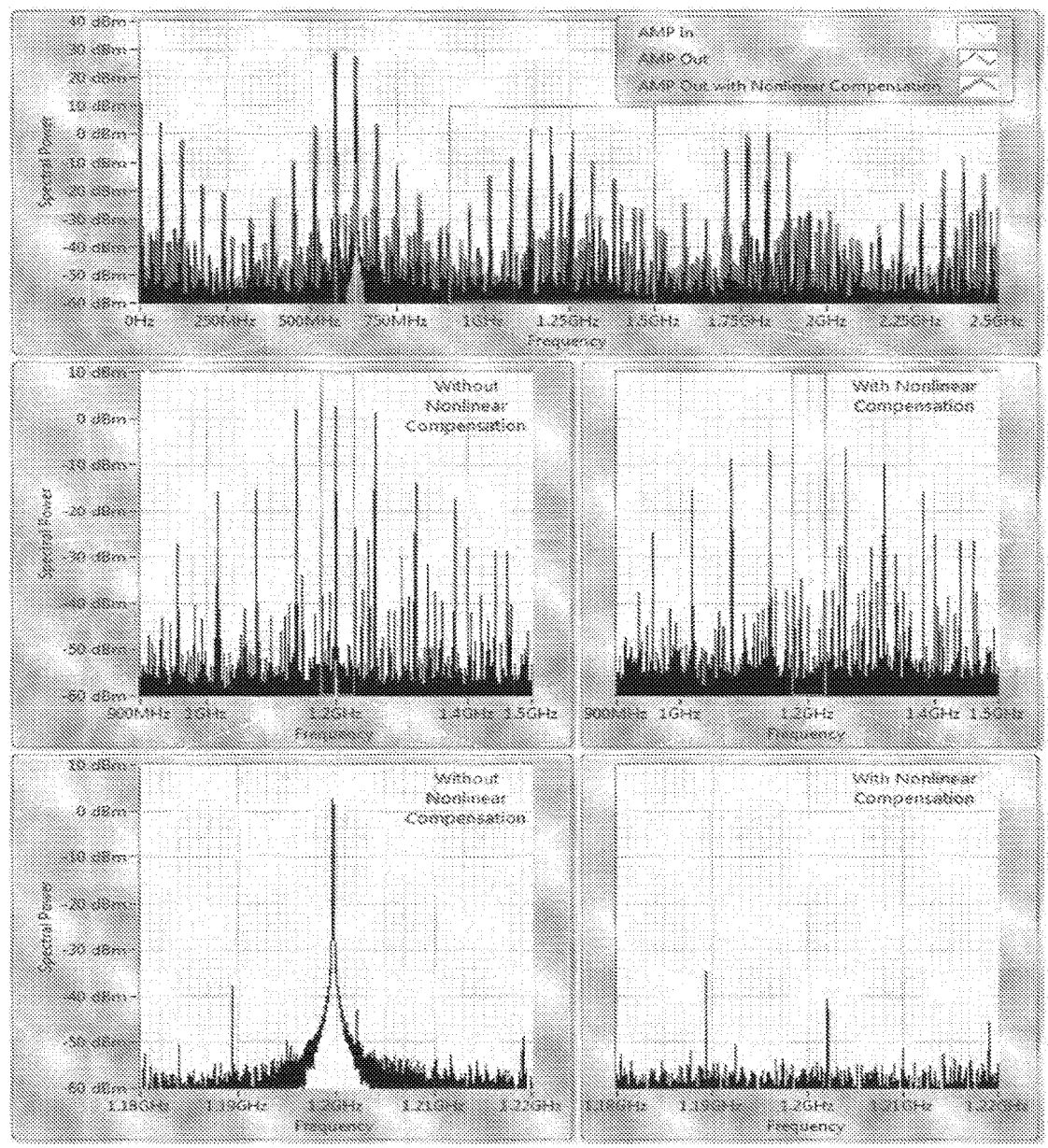
FIG. 63 shows an example of a measurement with a two-tone signal (569.55 MHz and 630.15 MHz).

FIG. 63 shows an example of a measurement with a two-tone signal (569.55 MHz and 630.15 MHz). The amplitude of the input tones were set to be close to the P1 dB of the amplifier, about 30 dBm, which resulted in numerous harmonics and IMP detectable above the noise floor within the frequency range of the receiver (0-2.5 GHz). In this case, the nonlinear compensation function was targeted to reduce one of the largest spurs; the f1+f2 spur at about 1.2 GHz. The topmost plot shows the original spectrum (narrow black lines) and the spectrum with the nonlinear compensation applied (thick grey lines). Shown below this are zoomed in plots of the reduced spur. Note that the spur is reduced below the noise floor, which corresponds to a reduction of more than 60 dB.

Figure 64:
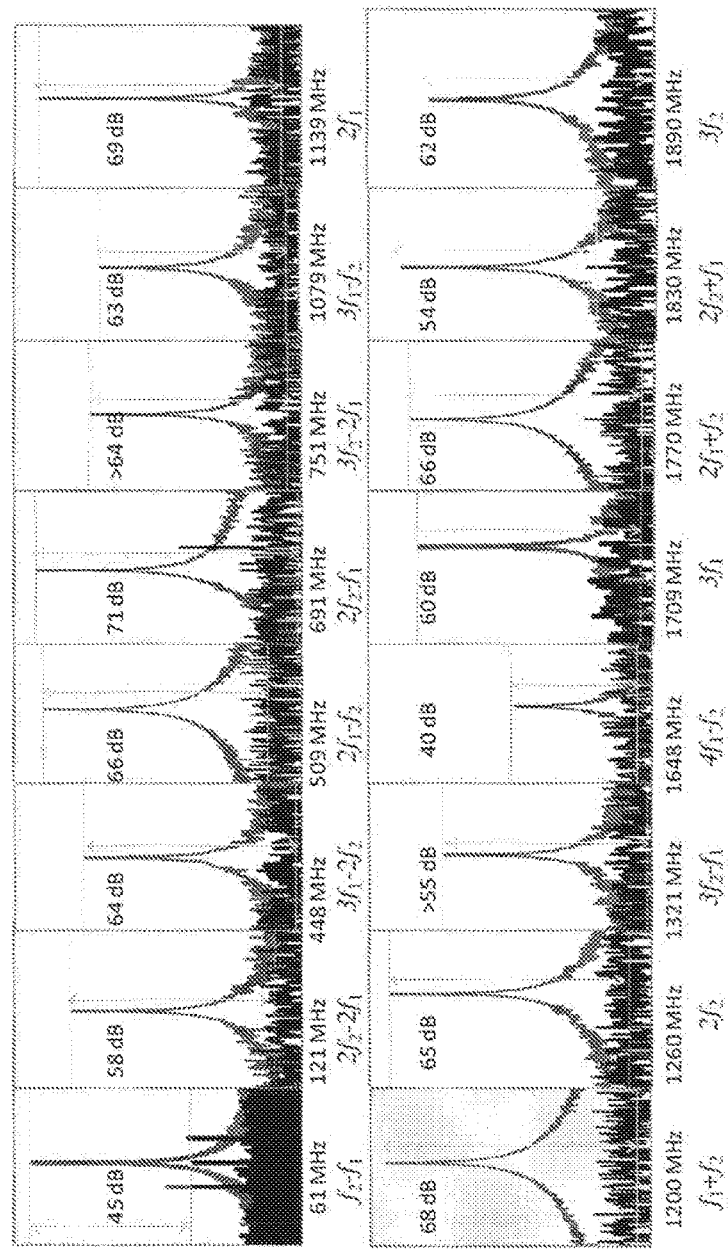
FIG. 64 shows measured results of the reduction of individual spurs between 50 MHz and 2 GHz using nonlinear compensation functions targeted for each spur in turn.

Similar reductions were performed for all spurs individually, which in some cases resulted in as much as 70 dB reduction. FIG. 64 shows measured results of the reduction of individual spurs between 50 MHz and 2 GHz using nonlinear compensation functions targeted for each spur in turn. All spurs were reduced below the noise floor, except the lowest frequency spur (f2−f1), which was reduced by 45 dB. The measured dB reduction of each spur is shown as well as the center frequency and the relation to the two fundamental tones. The original signal is shown in black, the compensated signal in grey.

Since the digital RF predistortion operates on the signal entering the amplifier, it directly compensates for the nonlinear distortion of the amplifier. This implies that the performance should be signal agnostic, provided the signal content lies within the operating bandwidth. To verify this, we used the two-tone signal described above to generate a nonlinear compensation function optimized for reduction of in-band IMP. This nonlinear compensation was then applied as a PC-based predistortion, to two wideband waveforms (300 MHz bandwidth) centered on 600 MHz. The results for a periodic random noise (PRN) waveform and a carrier-suppressed, amplitude-modulated, double-sideband (AM-DSB) waveform are shown in FIG. 64.

Figure 65:
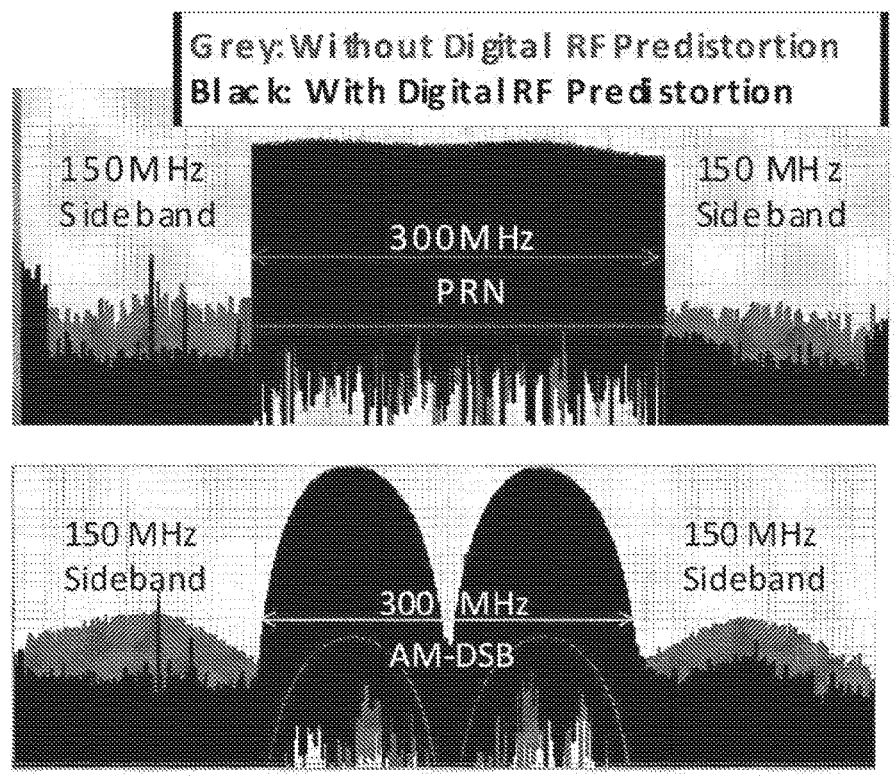
FIG. 65 shows improvement in nonlinear sidebands of a 300 MHz bandwidth periodic random noise (PRN) signal (top) and amplitude modulated, double sideband (AM-DSB), carrier-suppressed signal (top), implemented via PC-based predistortion using the same nonlinear compensation function.

FIG. 65 shows improvement in nonlinear sidebands of a 300 MHz bandwidth periodic random noise (PRN) signal (top) and amplitude modulated, double sideband (AM-DSB), carrier suppressed signal (top), implemented via PC-based predistortion using the same nonlinear compensation function. Note that, despite the completely different characteristics and spectral content of the signals in FIG. 21, the nonlinear compensation has comparable effectiveness, i.e., it does not need to know the details of the signal content to successfully mitigate the nonlinear components of the signal.

As seen in FIG. 65, there are low power narrowband signals in the 50-300 MHz band, which become visible after the nonlinear compensation has been applied; whereas without it they previously were largely buried under the nonlinear sideband. This has significant potential benefits for mitigation of cosite interference. To further illustrate this, a 2:1 RF coupler was used to couple ambient RF signals from an antenna with the software-generated test signals from the test setup.

This setup was then used to emulate a jamming scenario. In the scenario, enemy forces, for example, attempt to remotely activate an explosive device using a cellular phone. Friendly forces then turn on a jammer to jam the cellular phone bands (e.g. 450-750 MHz) and prevent the explosive device from being activated. Unfortunately, the jammer (which uses a wideband high-power amplifier at full capacity) generates nonlinear sidebands which interfere with co-located friendly communications (for example in the SATCOM band 240-400 MHz). To mitigate this cosite interference problem, the jammer turns on nonlinear compensation which reduces the sidebands and allows friendly communications to continue.

FIG. 66 illustrates the mitigation of cosite interference between a measured signal (wideband AM-DSB) emulating a jammer, and measured ambient signals representing friendly and non-friendly communications signals. The top spectral plot (which ranges from about 200 MHz to 900 MHz shows measured ambient signals. In the center figure a large AM-DSB signal has been turned on and coupled into the receiver along with the ambient signals. In the lower figure, digital RF predistortion has been applied to the AM-DSB signal, which reduces the nonlinear sidebands. The original AM-DSB signal is shown in grey for reference.

Measurements of the ambient RF spectrum (shown at top) reveal a high density of signals in the cellular bands between about 450 MHz and 750 MHz. These will represent the enemy signals to be jammed in our test scenario. There are also some narrowband signals visible at lower frequency—these will represent the friendly communications signals. To emulate the jamming signal, we used the 300 MHz-wide AM-DSB signal described previously. It effectively dominates the cellular signals, effectively jamming the receiver in this band. The nonlinear sidebands also hide the signals representing friendly communications, until, as shown in the lower segment of FIG. 66, the nonlinear compensation is turned on and the sidebands are reduced, allowing the receiver to pick up friendly communications signals with the jammer still operating effectively in the cellular phone band.

These tests help to demonstrate the benefits of digital RF predistortion for compensating for nonlinear effects of the amplifier in an RF transmission system, including versatility of integration with high power transmitters, signal agnosticism, and capability for handling complex wideband signal sets. Also presented are measurements with a 2.5 GHz bandwidth test setup (including both transmit and receive components) that showed up to 70 dB reduction in individual nonlinear spurious signals. The signal agnostic feature of the approach was demonstrated by applying the digital RF predistortion to 300 MHz-wide AM and PRN signals using a common nonlinear compensation function. Finally, the benefits for cosite interference mitigation were demonstrated by emulating a jamming scenario with our testbed and showing how unintentional jamming of friendly signals can be prevented using this digital RF predistortion approach.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An integrative software radio, comprising:
   a first radio device comprising a first transmitter, a first receiver and a first processor, wherein the first transmitter is configured to generate a first waveform;
   a second radio device comprising a second transmitter, a second receiver and a second processor wherein the second transmitter is configured to generate a second waveform, wherein at least one of the first and second waveforms comprises a wavefront; and
   a mission module device comprising a third transmitter, a third receiver and a third processor configured to control the transmit operations of the first and second radio to alter the waveform of at least the first and second radio devices to minimize radio interference during simultaneous transmission by the first and second radio devices;
   wherein altering the waveform comprises characterizing a non-linear response of at least one of the transmitter and receiver of the first and second radio devices in predicting frequency and power levels of distortion products based on these nonlinear responses.

2. The integrative software radio of claim 1, further comprising:
   a first superconnector comprising:
      a first connector portion disposed on and physically attached to the mission module device and comprising one or more first electrical connections;
      a second connector portion disposed on and physically attached to the first radio device, the first super connector and comprising one or more second electrical connections complementary to the one or more first electrical connections and configured to align with the one or more first electrical connections;
      wherein when the first connector portion is mated with the second connector portion the first superconnector detachably physically couples the mission module device to the first radio device and the one or more first electrical connections contact with and electrically couple to their corresponding ones of the one or more second electrical connections thereby such that the first super connector electrically couples the mission module device to the first radio device;
   a second superconnector comprising:
      a third connector portion disposed on and physically attached to the mission module device and comprising one or more third electrical connections;
      a fourth connector portion disposed on and physically attached to the first radio device, the third super connector and comprising one or more fourth electrical connections complementary to the one or more third electrical connections and configured to align with the one or more third electrical connections;
      wherein when the third connector portion is mated with the fourth connector portion the second superconnector detachably physically couples the mission module device to the second radio device and the one or more third electrical connections contact with and electrically couple to their corresponding ones of the one or more fourth electrical connections thereby such that the second superconnector electrically couples the mission module device to the first radio device.

3. The integrative software radio of claim 1, wherein altering the waveform of at least one of the first and second radio devices comprises altering the wavefront of at least one of the first and second radio devices.

4. The integrative software radio of claim 3, wherein altering the waveform of at least one of the first and second radio devices to reduce or minimize radio interference during simultaneous transmission comprises applying pre-distortion to the waveform generated by one of the first and second radio devices to at least partially compensate for distortion to that way form caused by the waveform generated by the other of the first and second radio devices.

5. The integrative software radio of claim 3, wherein altering the waveform of at least one of the first and second radio devices to reduce or minimize radio interference during simultaneous transmission comprises determining a range of operating frequency bands for each of the first and second radio devices and allocating transmit frequencies to reduce or resolve interference between the first and second radio devices.

6. The integrative software radio of claim 3, wherein altering the waveform of at least one of the first and second radio devices to reduce or minimize radio interference during simultaneous transmission comprises applying a pre-distortion-based adaptive linearization to a transmit signal of at least one of the first and second transmitters.

7. The integrative software radio of claim 6, wherein applying the predistortion-based adaptive linearization comprises:
    transmitting a two-tone test signal to a power amplifier to generate a non-linear power amplifier output signal;
    applying a Fourier transform to the power amplifier output signal to determine frequency components of the power amplifier output signal and their respective power levels;
    identifying intermodulation products based on the determined frequency components; and
    pre-distorting a transmit signal for post-distorting a received signal to at least partially account for the identified intermodulation products.

8. The integrative software radio of claim 3, wherein altering the waveform of at least one of the first and second radio devices to reduce or minimize radio interference during simultaneous transmission comprises determining catastrophes that contribute to nonlinearities in at least one of the first and second radio devices and reducing the nonlinearities based on the determined catastrophes.

9. The integrative software radio of claim 8, wherein the catastrophes comprise a cusp catastrophe.

10. The integrative software radio of claim 9, wherein cusp catastrophes are located at a distance $$(\Delta f)\sqrt{3}/2$$

from a resonance frequency, wherein $\Delta f$ is a filter linewidth.

11. The integrative software radio of claim 1, wherein the distortion products comprise at least one of harmonics and intermodulation products.

12. The integrative software radio of claim 1, further comprising an agile RF filter configured to attenuate potentially interfering signals from one of the first and second radio devices.

13. The integrative software radio of claim 1, wherein the waveform comprises a wavefront, communication instruction set, and controlling the transmit operations of the first and second radio devices comprises altering the wavefront of at least one of the first and second radio devices to reduce or minimize radio interference during simultaneous transmission by the first and second radio devices.

14. The integrative software radio of claim 1, further comprising an interface in the mission module, wherein the interface is configured to use a DMTD protocol.

15. The integrative software radio of claim 1, wherein the mission module device further comprises a programmable connector-based power management device having a first output communicatively coupled to the first radio device and a second output communicatively coupled to the second radio device.

16. The integrative software radio of claim 1, further comprising:
    a power storage device;
    an electrical connector coupled between the power storage device and the first and second radio devices;
    a power management device coupled to the power storage device and to the electrical connector, the power management device comprising
        a processor having a plurality of inputs and outputs;
        a charge controller having a first electrical interface coupled to the power storage device, a second electrical interface coupled to the processor, and a third electrical interface coupled to the first and second radio devices via the electrical connector;
        wherein the charge controller is configured to charge the power storage device via the first interface and provide electrical power to the first and second radio devices via the electrical connector.

17. The integrative software radio of claim 16, further comprising a buck/boost regulator having an input configured to receive electrical power from an auxiliary power supply and an output coupled to the charge controller.

18. The integrative software radio of claim 16, wherein the charge controller is further configured to monitor data from the power storage device to determine a state of charge of the power storage device.

19. The integrative software radio of claim 16, wherein the processor is configured to receive an electronic serial number from at least one of the first and second radio devices and to determine an identity of the device from which an electronic serial number is received before power is applied to that device.

20. The integrative software radio of claim 1, wherein the mission module is configured to:
    query interfaces of the integrative software radio to detect radio devices;
    determine a radio type of detected radio devices;
    configure the integrative software radio for operation based on the determined type of detected radio devices;
    received commands for operation of the integrative software radio; and
    control detected radio devices in response to received commands.

21. The integrative software radio of claim 20, wherein the mission module is further configured to activate one of the interfaces, perform command and control functions, or enter a smart power mode.

22. The integrative software radio of claim 21, wherein the smart power mode comprises an operational state in which the integrative software radio maintains communication with external systems, parses incoming commands, reports status, handles interruptions, or performs other management functions.

23. The integrative software radio of claim 20, wherein the mission module is further configured to enter a communication mode based on a determined type of detected device.

24. The integrative software radio of claim 1, wherein the mission module is configured to perform a self-test operation, the self-test operation comprising:
  polling a status of one of a plurality of output ports to determine whether a device is connected to the port;
  if a storage device is identified on the output port, reading contents of the identified storage device and comparing the read contents against a list of predetermined devices to determine whether the detected device is recognized;
  assigning voltage and current settings for that device.

25. The integrative software radio of claim 24, further comprising identifying a port as unsafe if a valid connection is not detected on that port during the polling operation.

* * * * *